US010877195B2

(12) United States Patent
Mori et al.

(10) Patent No.: US 10,877,195 B2
(45) Date of Patent: Dec. 29, 2020

(54) COMPOSITION, FILM, LAMINATE, INFRARED TRANSMITTING FILTER, SOLID IMAGE PICKUP ELEMENT, AND INFRARED SENSOR

(71) Applicant: FUJIFILM Corporation, Tokyo (JP)

(72) Inventors: Masahiro Mori, Haibara-gun (JP); Shuichiro Osada, Haibara-gun (JP)

(73) Assignee: FUJIFILM Corporation, Tokyo (JP)

(*) Notice: Subject to any disclaimer, the term of this patent is extended or adjusted under 35 U.S.C. 154(b) by 168 days.

(21) Appl. No.: 16/202,988

(22) Filed: Nov. 28, 2018

(65) Prior Publication Data
US 2019/0094431 A1 Mar. 28, 2019

Related U.S. Application Data

(63) Continuation of application No. PCT/JP2017/021772, filed on Jun. 13, 2017.

(30) Foreign Application Priority Data

Jul. 21, 2016 (JP) .................. 2016-142946

(51) Int. Cl.
*G02B 5/22* (2006.01)
*C09B 23/04* (2006.01)
(Continued)

(52) U.S. Cl.
CPC ............... *G02B 5/223* (2013.01); *B32B 7/02* (2013.01); *C09B 23/0066* (2013.01);
(Continued)

(58) Field of Classification Search
CPC ........ G03F 7/0007; G03F 7/031; G03F 7/027; G03F 7/033; G03F 7/0045; G03F 7/0042;
(Continued)

(56) References Cited

U.S. PATENT DOCUMENTS 10,578,966 B2 * 3/2020 Takishita ............... G02B 5/201
2009/0081469 A1 3/2009 Oka et al.
(Continued)

FOREIGN PATENT DOCUMENTS

JP 2008-540692 A 11/2008
JP 2013-77009 A 4/2013
(Continued)

OTHER PUBLICATIONS

Japanese Office Action for corresponding Japanese Application No. 2018-528448, dated Nov. 19, 2019, with English translation.
(Continued)

*Primary Examiner* — David P Porta
*Assistant Examiner* — Fani Boosalis
(74) *Attorney, Agent, or Firm* — Birch, Stewart, Kolasch & Birch, LLP

(57) ABSTRACT

A composition includes: a coloring material that allows transmission of infrared light and shields visible light; an infrared absorber; and a resin, in which the infrared absorber includes a compound having an absorption maximum in a wavelength range of longer than 900 nm and 1000 nm or shorter, and a ratio A/B of a minimum value A of an absorbance of the composition in a wavelength range of 400 to 950 nm to a maximum value B of an absorbance of the composition in a wavelength range of 1100 to 1300 nm is 4.5 or higher.

22 Claims, 1 Drawing Sheet

(51) Int. Cl.

| | | |
|---|---|---|
| *G03F 7/027* | (2006.01) | |
| *G03F 7/105* | (2006.01) | |
| *G02B 5/20* | (2006.01) | |
| *H01L 27/146* | (2006.01) | |
| *C09B 23/01* | (2006.01) | |
| *C09B 67/22* | (2006.01) | |
| *B32B 7/02* | (2019.01) | |
| *C09B 57/00* | (2006.01) | |
| *G02B 5/23* | (2006.01) | |
| *G03F 7/00* | (2006.01) | |
| *H01L 31/0216* | (2014.01) | |

(52) U.S. Cl.
CPC .............. *C09B 23/04* (2013.01); *C09B 57/00* (2013.01); *C09B 67/0033* (2013.01); *G02B 5/201* (2013.01); *G02B 5/208* (2013.01); *G02B 5/22* (2013.01); *G02B 5/23* (2013.01); *G03F 7/0007* (2013.01); *G03F 7/027* (2013.01); *G03F 7/105* (2013.01); *H01L 27/14621* (2013.01); *H01L 27/14623* (2013.01); *H01L 31/02164* (2013.01)

(58) Field of Classification Search
CPC ......... G03F 7/032; G03F 7/105; G02B 5/201; G02B 5/208; G02B 5/22; H01L 27/14621; H01L 27/14625; H01L 27/14623; H01L 31/02164; H04N 5/33; C09B 57/00; C09B 67/0033; C09B 23/04; C09B 23/0066

See application file for complete search history.

(56) References Cited

U.S. PATENT DOCUMENTS

| | | | |
|---|---|---|---|
| 2014/0120473 A1 | 5/2014 | Aoyagi | |
| 2015/0260885 A1 | 9/2015 | Takishita et al. | |
| 2017/0010528 A1 | 1/2017 | Takishita et al. | |
| 2017/0038507 A1* | 2/2017 | Norizuki | C07D 487/04 |
| 2017/0137444 A1 | 5/2017 | Sasaki et al. | |
| 2017/0174869 A1 | 6/2017 | Arayama et al. | |
| 2018/0039171 A1 | 2/2018 | Oota et al. | |

FOREIGN PATENT DOCUMENTS

| | | |
|---|---|---|
| JP | 2014-95007 A | 5/2014 |
| JP | 2014-130338 A | 7/2014 |
| JP | 2016-162946 A | 9/2016 |
| WO | WO 2015/166779 A1 | 11/2015 |
| WO | WO 2015/166873 A1 | 11/2015 |
| WO | WO 2016/031810 A1 | 3/2016 |
| WO | WO 2016/035695 A1 | 3/2016 |
| WO | WO 2016/178346 A1 | 11/2016 |

OTHER PUBLICATIONS

International Preliminary Report on Patentability and Written Opinion of the International Searching Authority (forms PCT/IB/373, PCT/ISA/237 and PCT/IB/326), dated Jan. 31, 2019, for corresponding International Application No. PCT/JP2017/021772, with a Written Opinion translation.

International Search Report (form PCT/ISA/210), dated Sep. 12, 2017, for corresponding International Application No. PCT/JP2017/021772, with an English translation.

Korean Office Action for corresponding Korean Application No. 10-2018-7036166, dated Dec. 24, 2019, with English translation.

Chinese Office Action and Search Report for corresponding Chinese Application No. 201780036582.0, dated Jul. 1, 2020, with an English translation.

Taiwanese Office Action and Search Report for corresponding Taiwanese Application No. 106120814, dated Jul. 28, 2020, with an English translation.

Taiwanese Office Action for corresponding Taiwanese Application No. 106120814, dated Sep. 28, 2020, with English translation.

\* cited by examiner

COMPOSITION, FILM, LAMINATE, INFRARED TRANSMITTING FILTER, SOLID IMAGE PICKUP ELEMENT, AND INFRARED SENSOR

CROSS-REFERENCE TO RELATED APPLICATIONS

This application is a Continuation of PCT International Application No. PCT/JP2017/21772, filed on Jun. 13, 2017, which claims priority under 35 U.S.C. § 119(a) to Japanese Patent Application No. 2016-142946, filed on Jul. 21, 2016. Each of the above application(s) is hereby expressly incorporated by reference, in its entirety, into the present application.

BACKGROUND OF THE INVENTION

1. Field of the Invention

The present invention relates to a composition that is suitable for forming an infrared transmitting filter or the like, and a film formed of the composition. In addition, the present invention relates to a laminate that is suitable for an infrared transmitting filter or the like. In addition, the present invention relates to an infrared transmitting filter, a solid image pickup element, and an infrared sensor.

2. Description of the Related Art

A solid image pickup element is used as an optical sensor in various applications. For example, infrared light is less likely to be scattered than visible light due to its longer wavelength and can be used in, for example, distance measurement or three-dimensional measurement. In addition, infrared light is invisible to humans or animals. Therefore, even in a case where an object is irradiated with infrared light using an infrared light source at night, the object cannot recognize the infrared light. Thus, infrared light can be used for imaging a nocturnal wild animal or imaging an object without provoking the object for security reasons. This way, an optical sensor (infrared sensor) that detects infrared light can be used in various applications, and the development of a film that can be used in an infrared sensor is desired.

JP2014-130338A describes a composition in which, in a case where a film having a thickness of 1 m is formed using the composition, a maximum value of a light transmittance of the film in a thickness direction in a wavelength range of 400 to 750 nm is 20% or lower, and a minimum value of a light transmittance of the film in the thickness direction in a wavelength range of 900 to 1300 nm is 90% or higher.

JP2013-077009A describes a radiation-sensitive coloring composition for a color filter including (A) a pigment, (B) a photopolymerization initiator, and (C) a polymerizable compound, in which in a case where a radiation-sensitive coloring composition layer having a spectral transmittance of 30% at a wavelength of 600 nm is formed, the radiation-sensitive coloring composition layer satisfies the following conditions (1) to (5):

(1) a spectral transmittance at a wavelength of 400 nm is 20% or lower;
(2) a spectral transmittance at a wavelength of 550 nm is 10% or lower;
(3) a spectral transmittance at a wavelength of 700 nm is 70% or higher;
(4) a wavelength at which a spectral transmittance is 50% is in a range of 650 nm to 680 nm; and
(5) the radiation-sensitive coloring composition layer has a thickness in a range of 0.55 µm to 1.8 µm.

WO2015/166779A describes a coloring composition including colorants and a resin, in which a ratio A/B of a minimum value A of an absorbance in a wavelength range of 400 to 830 nm to a maximum value B of an absorbance in a wavelength range of 1000 to 1300 nm is 4.5 or higher, and the colorants include one or more first colorants having an absorption maximum in a wavelength range of 800 to 900 nm and two or more second colorants having an absorption maximum in a wavelength range of 400 to 700 nm.

On the other hand, WO2015/166873A describes a near infrared absorbing filter that includes a near infrared absorbing material having an absorption maximum in a wavelength range of 900 nm to 1000 nm. As the near infrared absorbing material, a specific quinoxaline type pyrrolopyrrole compound is described.

SUMMARY OF THE INVENTION

According to an investigation by the present inventors, it was found that infrared light having a wavelength of longer than 1000 nm has little noise and, by using this infrared light, higher accuracy sensing can be performed. However, it was found that, in a case where films which have been known until now such as the films described in JP2014-130338A, JP2013-077009A, and WO2015/166779A are applied to an optical sensor or the like in which infrared light having a wavelength of longer than 1000 nm is used as a light source, there is room for improvement of reduction of noise derived from visible light.

On the other hand, WO2015/166873A describes a near infrared absorbing filter that includes a near infrared absorbing material having an absorption maximum in a wavelength range of 900 nm to 1000 nm. However, this near infrared absorbing filter has high transmittance in a visible range. For example, paragraph "0065" of WO2015/166873A describes that a transmittance of the near infrared absorbing filter in the entire wavelength range of 400 to 700 nm is preferably 85% or higher. WO2015/166873A does not describe a film capable of selectively allowing transmission of infrared light having a wavelength of longer than 1000 nm in a state where noise generated from visible light is small.

Accordingly, an object of the present invention is to provide a composition with which a film capable of allowing transmission of infrared light in a state where noise generated from visible light is small can be formed. In addition, another object of the present invention is to provide a film, a laminate, an infrared transmitting filter, a solid image pickup element, and an infrared sensor.

As a result of detailed investigation, the present inventors found that the object can be achieved using a composition described below, thereby completing the present invention. That is, the present invention is as follows.

<1> A composition comprising:
a coloring material that allows transmission of infrared light and shields visible light;
an infrared absorber; and
a resin,
in which the infrared absorber includes a compound having an absorption maximum in a wavelength range of longer than 900 nm and 1000 nm or shorter, and
a ratio A/B of a minimum value A of an absorbance of the composition in a wavelength range of 400 to 950 nm to a maximum value B of an absorbance of the composition in a wavelength range of 1100 to 1300 nm is 4.5 or higher.

<2> The composition according to <1>, in which in the compound having an absorption maximum in a wavelength range of longer than 900 nm and 1000 nm or shorter, a ratio absorbance $A_{max}$/absorbance $A_{1020}$ of an absorbance $A_{max}$ at the absorption maximum to an absorbance $A_{1020}$ at a wavelength of 1020 nm is 4.5 or higher.

<3> The composition according to <1> or <2>, in which the compound having an absorption maximum in a wavelength range of longer than 900 nm and 1000 nm or shorter is at least one compound selected from the group consisting of a pyrrolopyrrole compound, a cyanine compound, a squarylium compound, a phthalocyanine compound, and a naphthalocyanine compound.

<4> The composition according to any one of <1> to <3>, in which the compound having an absorption maximum in a wavelength range of longer than 900 nm and 1000 nm or shorter is a compound represented by the following Formula (1), (1)

in Formula (1), $X^1$ and $X^2$ each independently represent a hydrogen atom or a substituent, $A^1$ and $A^2$ each independently represent a substituent, $R^1$ to $R^{10}$ each independently represent a hydrogen atom or a substituent, and at least one of $R^1, \ldots,$ or $R^8$ represents a substituent.

<5> The composition according to any one of <1> to <4>, in which the infrared absorber further includes a compound having an absorption maximum in a wavelength range of longer than 700 nm and 900 nm or shorter.

<6> The composition according to any one of <1> to <5>, in which the coloring material that allows transmission of infrared light and shields visible light has an absorption maximum in a wavelength range of 400 to 700 nm.

<7> The composition according to any one of <1> to <6>, in which the coloring material that allows transmission of infrared light and shields visible light includes two or more chromatic colorants, and a combination of the two or more chromatic colorants forms black.

<8> The composition according to any one of <1> to <7>, further comprising:

a polymerizable compound; and a photopolymerization initiator.

<9> A film which is formed using the composition according to any one of <1> to <8>.

<10> The film according to <9>, in which a maximum value of a light transmittance of the film in a thickness direction in a wavelength range of 400 to 950 nm is 20% or lower, and a minimum value of a light transmittance of the film in the thickness direction in a wavelength range of 1100 to 1300 nm is 70% or higher.

<11> A laminate comprising:

a layer including a coloring material that allows transmission of infrared light and shields visible light; and a layer including a compound having an absorption maximum in a wavelength range of longer than 900 nm and 1000 nm or shorter, in which a ratio A/B of a minimum value A of an absorbance of the laminate in a wavelength range of 400 to 950 nm to a maximum value B of an absorbance of the laminate in a wavelength range of 1100 to 1300 nm is 4.5 or higher.

<12> The laminate according to <11>, in which a maximum value of a light transmittance of the laminate in a thickness direction in a wavelength range of 400 to 950 nm is 20% or lower, and a minimum value of a light transmittance of the laminate in the thickness direction in a wavelength range of 1100 to 1300 nm is 70% or higher.

<13> The laminate according to <11> or <12>, in which the layer including the coloring material that allows transmission of infrared light and shields visible light includes two or more chromatic colorants, and a combination of the two or more chromatic colorants forms black.

<14> An infrared transmitting filter comprising:

the film according to <9> or <10> or the laminate according to any one of <11> to <13>.

<15> A solid image pickup element comprising:

the film according to <9> or <10> or the laminate according to any one of <11> to <13>.

<16> An infrared sensor comprising:

the film according to <9> or <10> or the laminate according to any one of <11> to <13>.

According to the present invention, a composition can be provided with which a film capable of allowing transmission of infrared light in a state where noise generated from visible light is small can be formed. In addition, a film, a laminate, a solid image pickup element, and an infrared sensor can be provided.

DESCRIPTION OF THE PREFERRED EMBODIMENTS

Figure 1:
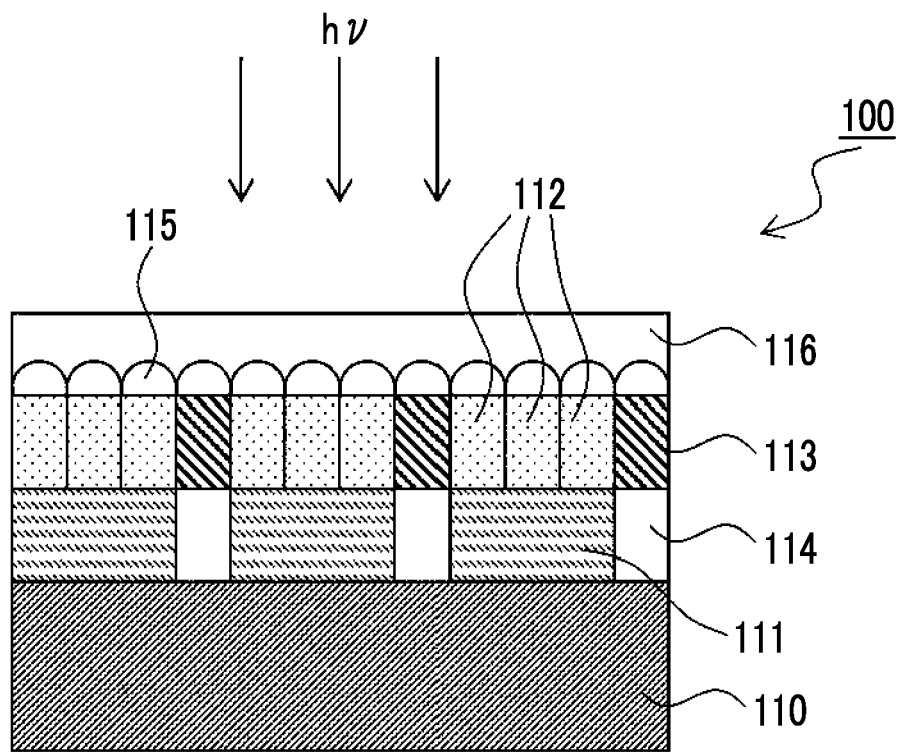
FIG. 1 is a schematic cross-sectional view showing a configuration of an embodiment of an infrared sensor according to the present invention.

In this specification, a total solid content denotes the total mass of components of a composition excluding a solvent.

In this specification, unless specified as a substituted group or as an unsubstituted group, a group (atomic group) denotes not only a group having no substituent but also a group having a substituent. For example, "alkyl group" denotes not only an alkyl group having no substituent (unsubstituted alkyl group) but also an alkyl group having a substituent (substituted alkyl group).

In this specification, unless specified otherwise, "exposure" denotes not only exposure using light but also drawing using a corpuscular beam such as an electron beam or an ion beam. Examples of the light used for exposure include an actinic ray or radiation, for example, a bright light spectrum of a mercury lamp, a far ultraviolet ray represented by excimer laser, an extreme ultraviolet ray (EUV ray), an X-ray, or an electron beam.

In this specification, "(meth)acrylate" denotes either or both of acrylate or methacrylate, "(meth)acryl" denotes either or both of acryl and methacryl, and "(meth)acryloyl" denotes either or both of acryloyl and methacryloyl.

In this specification, in a chemical formula, Me represents a methyl group, Et represents an ethyl group, Pr represents a propyl group, Bu represents a butyl group, and Ph represents a phenyl group.

In this specification, the term "step" denotes not only an individual step but also a step which is not clearly distinguishable from another step as long as an effect expected from the step can be achieved.

In this specification, a weight-average molecular weight and a number-average molecular weight are defined as values in terms of polystyrene obtained by gel permeation chromatography (GPC).

In this specification, an weight-average molecular weight (Mw) and a number-average molecular weight (Mn) can be obtained by using HLC-8220 (manufactured by Tosoh Corporation), using TSKgel Super AWM-H (manufactured by Tosoh Corporation; 6.0 mm ID (inner diameter)×15.0 cm) as a column, and using a 10 mmol/L lithium bromide N-methylpyrrolidinone (NMP) solution as an eluent.

A pigment described in this specification denotes an insoluble colorant compound which is not likely to dissolve in a solvent. Typically, a pigment denotes a colorant compound which is present in a state of being dispersed as particles in a composition. As the solvent described herein, for example, an arbitrary solvent can be used, and examples thereof are described in "Solvent" described below. In this specification, it is preferable that the pigment has a solubility of 0.1 g/100 g Solvent or lower at 25° C., for example, both in propylene glycol monomethyl ether acetate and in water.

In this specification, numerical ranges represented by "to" include numerical values before and after "to" as lower limit values and upper limit values.

<Composition>

A composition according to an embodiment of the present invention includes: a coloring material that allows transmission of infrared light and shields visible light; an infrared absorber; and a resin, in which the infrared absorber includes a compound having an absorption maximum in a wavelength range of longer than 900 nm and 1000 nm or shorter, and a ratio A/B of a minimum value A of an absorbance of the composition in a wavelength range of 400 to 950 nm to a maximum value B of an absorbance of the composition in a wavelength range of 1100 to 1300 nm is 4.5 or higher.

With the composition according to the embodiment of the present invention, it is possible to suitably form a film having spectral characteristics in which a maximum value of a light transmittance of the film in a thickness direction in a wavelength range of 400 to 950 nm is 20% or lower, and a minimum value of a light transmittance of the film in the thickness direction in a wavelength range of 1100 to 1300 nm is 70% or higher.

The absorbance conditions may be satisfied using any means. For example, as described below in detail, the composition includes: a coloring material that allows transmission of infrared light and shields visible light; and a compound having an absorption maximum in a wavelength range of longer than 900 nm and 1000 nm or shorter, in which the contents and kinds of the components are adjusted. As a result, the absorbance conditions can be suitably satisfied. It is more preferable that the composition includes a compound having an absorption maximum in a wavelength range of longer than 700 nm and 900 nm or shorter.

Regarding the spectral characteristics of the composition according to the embodiment of the present invention, the value of A/B is preferably 10 or higher, more preferably 20 or higher, and still more preferably 30 or higher. The upper limit is, for example, 90 or lower.

An absorbance $A\lambda$ at a wavelength $\lambda$ is defined by the following Expression (1).

$$A\lambda = -\log(T\lambda) \quad (1)$$

$A\lambda$ represents the absorbance at the wavelength $\lambda$, and $T\lambda$ represents a transmittance at the wavelength $\lambda$.

A value of the absorbance may be a value measured in the form of a solution or a value of a film which is formed using the composition. In a case where the absorbance is measured in the form of the film, it is preferable that the absorbance is measured using a film that is formed by applying the composition to a glass substrate using a method such as spin coating such that the thickness of the dried film is a predetermined value, and drying the applied composition using a hot plate at 100° C. for 120 seconds. The thickness of the film can be obtained by measuring the thickness of the substrate including the film using a stylus surface profilometer (DEKTAK 150, manufactured by ULVAC Inc.).

The absorbance can be measured using a well-known spectrophotometer of the related art. Measurement conditions of the absorbance are not particularly limited. It is preferable that the maximum value B of the absorbance in a wavelength range of 1100 to 1300 nm is measured under conditions which are adjusted such that the minimum value A of the absorbance in a wavelength range of 400 to 950 nm is 0.1 to 3.0. By measuring the absorbance under the above-described conditions, a measurement error can be further reduced. A method of adjusting the minimum value A of the absorbance in a wavelength range of 400 to 950 nm to be 0.1 to 3.0 is not particularly limited. For example, in a case where the absorbance is measured in the form of the composition, for example, a method of adjusting the optical path length of a sample cell can be used. In addition, in a case where the absorbance is measured in the form of the film, for example, a method of adjusting the thickness of the film can be used.

A method of measuring the spectral characteristics and the thickness of the film formed using the composition according to the embodiment of the present invention is as follows.

The composition is applied to a glass substrate using a method such as spin coating such that the thickness of the dried film is a predetermined value, and then is dried using a hot plate at 100° C. for 120 seconds. The thickness of the dried film is obtained by measuring the thickness of the dried substrate including the film using a stylus surface profilometer (DEKTAK 150, manufactured by ULVAC Inc.). The transmittance of the dried substrate including the film is measured in a wavelength range of 300 to 1300 nm using an ultraviolet-visible-near infrared spectrophotometer (U-4100, manufactured by Hitachi High-Technologies Corporation).

The composition according to the embodiment of the present invention will also be referred to as "infrared light transmitting composition" because it allows transmission of infrared light (preferably infrared light having a wavelength of longer than 1100 nm and more preferably infrared light having a wavelength of 1000 to 1300 nm).

Hereinafter, each of components which can form the composition according to the embodiment of the present invention will be described.

<<Coloring Material that Allows Transmission of Infrared Light and Shields Visible Light>>

The composition according to the embodiment of the present invention includes the coloring material that allows transmission of infrared light and shields visible light (hereinafter, also referred to as "coloring material that shields visible light").

It is preferable that the coloring material that shields visible light is a coloring material that absorbs light in a wavelength range of violet to red. It is preferable that the coloring material that shields visible light is a coloring material that shields light in a wavelength range of 450 to 650 nm (preferably in a wavelength range of 400 to 700 nm). It is preferable that the coloring material that shields visible light has an absorption maximum in a wavelength range of 400 to 700 nm. It is preferable that the coloring material that shields visible light is a coloring material that allows transmission of light having a wavelength of 800 nm or longer (more preferably light having a wavelength range of 1000 to 1300 nm and still more preferably light having a wavelength range of 1100 to 1300 nm).

It is preferable that the coloring material that shields visible light satisfies at least one of the following requirement (1) or (2).

(1) The coloring material that shields visible light includes two or more chromatic colorants, and a combination of the two or more chromatic colorants forms black.

(2) The coloring material that shields visible light includes an organic black colorant In the aspect (2), it is preferable that the coloring material that shields visible light further includes a chromatic colorant.

In this specification, "chromatic colorant" denotes a colorant other than a white colorant and a black colorant. It is preferable that the chromatic colorant is a colorant having an absorption maximum in a wavelength range of 400 to 700 nm. "Having an absorption maximum in a wavelength range of 400 to 700 nm" denotes having a maximum absorbance in a wavelength range of 400 to 700 nm in an absorption spectrum. For example, in an absorption spectrum in a wavelength range of 350 to 1300 nm, it is preferable that the chromatic colorant has a maximum absorbance in a wavelength range of 400 to 700 nm.

In this specification, black that is formed by a combination of two or more chromatic colorants absorbs visible light, and at least a part of infrared light refers to color of light whose transmission is allowed.

In this specification, the organic black colorant as the coloring material that shields visible light denotes a material that absorbs visible light and allows at least a part of infrared light. Accordingly, in this specification, the organic black colorant as the coloring material that shields visible light does not denote a black colorant that absorbs both visible light and infrared light, for example, carbon black or titanium black. It is preferable that the organic black colorant is a colorant having an absorption maximum in a wavelength range of 400 to 700 nm.

It is preferable that the coloring material that shields visible light is a material in which a ratio A/B of a minimum value A of an absorbance in a wavelength range of 450 to 650 nm to a maximum value B of an absorbance in a wavelength range of 900 to 1300 nm is 4.5 or higher.

The above-described spectral characteristics may be satisfied using one material alone or using a combination of a plurality of materials. For example, in the aspect (1), it is preferable that the spectral characteristics are satisfied using a combination of a plurality of chromatic colorants. In addition, in the aspect (2), the spectral characteristics may be satisfied using an organic black colorant. In addition, the spectral characteristics may be satisfied using a combination of an organic black colorant and a chromatic colorant.

(Chromatic Colorant)

It is preferable that the chromatic colorants are selected from the group consisting of a red colorant, a green colorant, a blue colorant, a yellow colorant, a violet colorant, and an orange colorant.

As the chromatic colorant, a pigment or a dye may be used. It is preferable that the chromatic colorant is a pigment.

It is preferable that an average particle size (r) of the pigment satisfies preferably 20 nm≤r≤300 nm, more preferably 25 nm≤r≤250 nm, and still more preferably 30 nm≤r≤200 nm. "Average particle size" described herein denotes the average particle size of secondary particles which are aggregates of primary particles of the pigment.

In addition, regarding a particle size distribution of the secondary particles of the pigment (hereinafter, simply referred to as "particle size distribution") which can be used, secondary particles having a particle size of (average particle size±100) nm account are preferably 70 mass % or higher and more preferably 80 mass % or higher in the pigment. The particle size distribution of the secondary particles can be measured using a scattering intensity distribution.

The pigment having an average particle size and a particle size distribution in the above-described ranges can be prepared by mixing and dispersing a pigment mixed solution while pulverizing the pigment mixed solution using a pulverizer such as a beads mill or a roll mill, the pigment mixed solution being obtained by mixing a commercially available pigment and another pigment (having an average particle size of secondary particles of more than 300 nm), which is optionally used, with a resin and an organic solvent. The pigment obtained as described above is typically in the form of a pigment dispersion.

The pigment is preferably an organic pigment, and examples thereof are as follows. However, the present invention is not limited to the examples.

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of which are yellow pigments);

C.I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C.I. Pigment Green 7, 10, 36, 37, 58, and 59 (all of which are green pigments);

C.I. Pigment Violet 1, 19, 23, 27, 32, 37, and 42 (all of which are violet pigments); and C.I. Pigment Blue 1, 2, 15, 15:1, 15:2, 15:3, 15:4, 15:6, 16, 22, 60, 64, 66, 79, and 80 (all of which are blue pigments).

Among these organic pigments, one kind may be used alone, or two or more kinds may be used in combination.

As the dye, well-known dyes can be used without any particular limitation. In terms of a chemical structure, a dye such as a pyrazole azo dye, an anilino azo dye, a triarylmethane dye, an anthraquinone dye, an anthrapyridone dye, a benzylidene dye, an oxonol dye, a pyrazolotriazole azo dye, a pyridone azo dye, a cyanine dye, a phenothiazine dye, a pyrrolopyrazole azomethine dye, a xanthene dye, a phthalocyanine dye, a benzopyran dye, an indigo dye, or a pyrromethene dye can be used. In addition, a polymer of the above-described dyes may be used. In addition, dyes described in JP2015-028144A and JP2015-034966A can also be used.

In a case where a combination of two or more chromatic colorants forms black, examples of the combination of chromatic colorants are as follows.

(1) An aspect in which the coloring material that shields visible light includes a yellow colorant, a blue colorant, a violet colorant, and a red colorant (2) An aspect in which the coloring material that shields visible light includes a yellow colorant, a blue colorant, and a red colorant (3) An aspect in which the coloring material that shields visible light includes a yellow colorant, a violet colorant, and a red colorant (4) An aspect in which the coloring material that shields visible light includes a yellow colorant and a violet colorant (5) An aspect in which the coloring material that shields visible light includes a green colorant, a blue colorant, a violet colorant, and a red colorant (6) An aspect in which the coloring material that shields visible light includes a violet colorant and an orange colorant (7) An aspect in which the coloring material that shields visible light includes a green colorant, a violet colorant, and a red colorant (8) An aspect in which the coloring material that shields visible light includes a green colorant and a red colorant Specific examples of the aspect (1) include C.I. Pigment Yellow 139 or 185 as a yellow pigment, C.I. Pigment Blue 15:6 as a blue pigment, C.I. Pigment Violet 23 as a violet pigment, and C.I. Pigment Red 254 or 224 as a red pigment.

Specific examples of the aspect (2) include C.I. Pigment Yellow 139 or 185 as a yellow pigment, C.I. Pigment Blue 15:6 as a blue pigment, and C.I. Pigment Red 254 or 224 as a red pigment.

Specific examples of the aspect (3) include C.I. Pigment Yellow 139 or 185 as a yellow pigment, C.I. Pigment Violet 23 as a violet pigment, and C.I. Pigment Red 254 or 224 as a red pigment.

Specific examples of the aspect (4) include C.I. Pigment Yellow 139 or 185 as a yellow pigment, and C.I. Pigment Violet 23 as a violet pigment.

Specific examples of the aspect (5) include C.I. Pigment Green 7 or 36 as a green pigment, C.I. Pigment Blue 15:6 as a blue pigment, C.I. Pigment Violet 23 as a violet pigment, and C.I. Pigment Red 254 or 224 as a red pigment.

Specific examples of the aspect (6) include C.I. Pigment Violet 23 as a violet pigment, and C.I. Pigment Orange 71 as an orange pigment.

Specific examples of the aspect (7) include C.I. Pigment Green 7 or 36 as a green pigment, C.I. Pigment Violet 23 as a violet pigment, and C.I. Pigment Red 254 or 224 as a red pigment.

Specific examples of the aspect (8) include C.I. Pigment Green 7 or 36 as a green pigment, and C.I. Pigment Red 254 or 224 as a red pigment.

For example, ratios (mass ratios) between the respective colorants are as follows.

TABLE 1

| No. | Yellow Colorant | Green Colorant | Blue Colorant | Violet Colorant | Red Colorant | Orange Colorant |
|---|---|---|---|---|---|---|
| 1 | 0.1 to 0.4 |  | 0.1 to 0.6 | 0.01 to 0.3 | 0.1 to 0.6 |  |
| 2 | 0.1 to 0.4 |  | 0.1 to 0.6 |  | 0.2 to 0.7 |  |
| 3 | 0.1 to 0.6 |  |  | 0.1 to 0.6 | 0.1 to 0.6 |  |
| 4 | 0.2 to 0.8 |  |  | 0.2 to 0.8 |  |  |
| 5 |  | 0.1 to 0.4 | 0.1 to 0.4 | 0.1 to 0.4 | 0.1 to 0.4 |  |
| 6 |  |  |  | 0.2 to 0.6 |  | 0.4 to 0.8 |
| 7 |  | 0.1 to 0.5 |  | 0.2 to 0.7 | 0.1 to 0.4 |  |
| 8 |  | 0.5 to 0.8 |  |  | 0.2 to 0.5 |  |

(Organic Black Colorant)

Examples of the organic black colorant include a bisbenzofuranone compound, an azomethine compound, a perylene compound, and an azo compound. Among these, a bisbenzofuranone compound or a perylene compound is preferable.

Examples of the bisbenzofuranone compound include compounds described in JP2010-534726A, JP2012-515233A, and JP2012-515234A. For example, "Irgaphor Black" (manufactured by BASF SE) is available.

Examples of the perylene compound include C.I. Pigment Black 31 and 32.

Examples of the azomethine compound include compounds described in JP1989-170601A (JP-H1-170601A) and JP1990-034664A (JP-H2-034664A). For example, "CHROMOFINE BLACK A1103" (manufactured by Dainichiseika Color & Chemicals Mfg. Co., Ltd.) is available.

The azo compound is not particularly limited, and for example, a compound represented by the following Formula (A-1) can be suitably used.

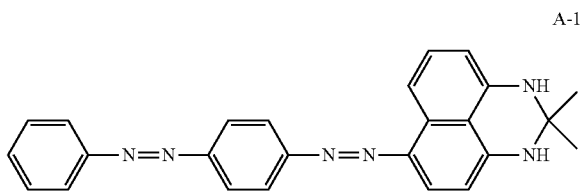 [SMILES: CC1(C)Nc2cccc3c(N=Nc4ccc(N=Nc5ccccc5)cc4)ccc(c23)N1]

A-1

It is preferable that the bisbenzofuranone compound is one of the following compounds represented by the following formulae or a mixture thereof.

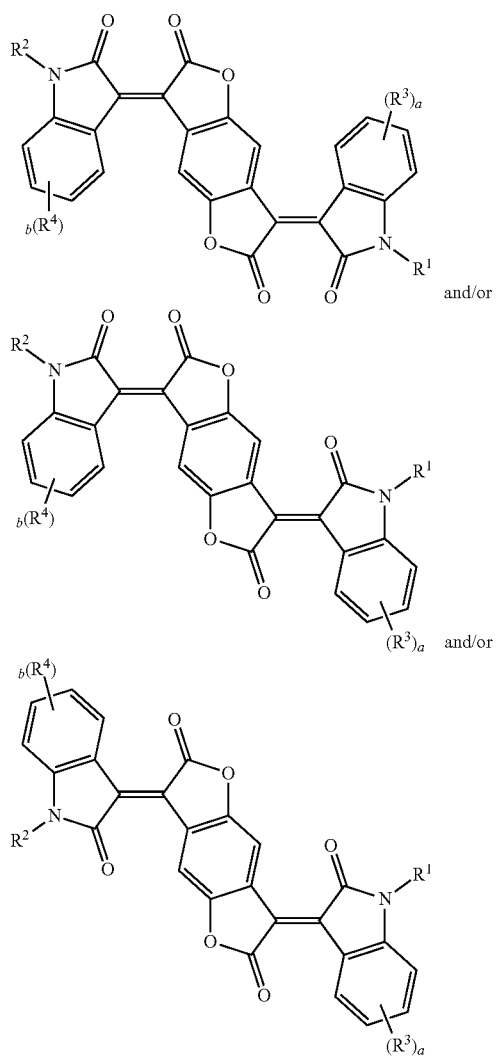

and/or and/or

In the formulae, $R^1$ and $R^2$ each independently represent a hydrogen atom or a substituent, $R^3$ and $R^4$ each independently represent a substituent, and a and b each independently represent an integer of 0 to 4. In a case where a represents 2 or more, a plurality of $R^{3'}$s may be the same as or different from each other or may be bonded to each other to form a ring. In a case where b represents 2 or more, a plurality of $R^{4'}$s may be the same as or different from each other or may be bonded to each other to form a ring.

Examples of the substituent represented by $R^1$ to $R^4$ include a halogen atom, a cyano group, a nitro group, an alkyl group, an alkenyl group, an alkynyl group, an aralkyl group, an aryl group, a heteroaryl group, $-OR^{301}$, $-COR^{302}$, $-COOR^{303}$, $-OCOR^{304}$, $-NR^{305}R^{306}$, $-NHCOR^{307}$, $-CONR^{308}R^{309}$, $-NHCONR^{310}R^{311}$, $-NHCOOR^{312}$, $-SR^{313}$, $\leq SO_2R^{314}$, $\leq SO_2OR^{315}$, $-NHSO_2R^{316}$, and $-SO_2NR^{317}R^{318}$, in which $R^{301}$ to $R^{318}$ each independently represent a hydrogen atom, an alkyl group, an alkenyl group, an alkynyl group, an aryl group, or a heteroaryl group.

The details of the bisbenzofuranone compound can be found in paragraphs "0014" to "0037" of JP2010-534726A, the content of which is incorporated herein by reference.

In a case where the organic black colorant is used as the coloring material that shields visible light, it is preferable that the organic black colorant is used in combination of a chromatic colorant. By using the organic black colorant in combination of a chromatic colorant, excellent spectral characteristics are likely to be obtained. Examples of the chromatic colorant which can be used in combination with the organic black colorant include a red colorant, a blue colorant, and a violet colorant. Among these, a red colorant or a blue colorant is preferable. Among these colorants, one kind may be used alone, or two or more kinds may be used in combination.

In addition, regarding a mixing ratio between the organic black colorant and the chromatic colorant, the amount of the chromatic colorant is preferably 10 to 200 parts by mass and more preferably 15 to 150 parts by mass with respect to 100 parts by mass of the organic black colorant.

In the coloring material that shields visible light, it is preferable that a combination of two or more chromatic colorants and oxotitanyl phthalocyanine forms black. Oxotitanyl phthalocyanine is a compound having an absorption maximum at a wavelength of about 830 nm and functions as one infrared absorber. However, oxotitanyl phthalocyanine also has an absorption maximum at a wavelength of about 650 nm. That is, oxotitanyl phthalocyanine also has an absorption in a part of a visible range. Therefore, a combination of oxotitanyl phthalocyanine and chromatic colorants can also form black. Examples of the chromatic colorants which can be used in combination with oxotitanyl phthalocyanine include a red colorant, a yellow colorant, and a violet colorant. Preferable examples of the combination include the following (1) and (2).

(1) an aspect in which a combination of oxotitanyl phthalocyanine, a red colorant, and a yellow colorant forms black (oxotitanyl phthalocyanine:red colorant:yellow colorant (mass ratio) is preferably 20 to 70:20 to 50:5 to 30 and more preferably 30 to 60:25 to 45:10 to 20)

(2) an aspect in which a combination of oxotitanyl phthalocyanine, a red colorant, and a violet colorant forms black (oxotitanyl phthalocyanine:red colorant:violet colorant (mass ratio) is preferably 10 to 50:20 to 50:20 to 50 and more preferably 15 to 45:25 to 45:30 to 45)

The content of the pigment in the coloring material that shields visible light is preferably 95 mass % or higher, more preferably 97 mass % or higher, and still more preferably 99 mass % or higher with respect to the total mass of the coloring material that shields visible light.

The content of the coloring material that shields visible light in the composition according to the embodiment of the present invention is preferably 10 to 60 mass % with respect to the total solid content of the composition. The upper limit is more preferably 50 mass % or lower, and still more preferably 45 mass % or lower. The lower limit is preferably 20 mass % or higher and more preferably 25 mass % or higher.

<<Infrared Absorber>>

The composition according to the embodiment of the present invention includes an infrared absorber. As the infrared absorber, a compound having an absorption maximum in an infrared range (preferably a wavelength range of longer than 700 nm and 1300 nm or shorter) can be preferably used.

As the infrared absorber, a pigment or a dye may be used, and a pigment is preferable because the composition, with which a film having excellent heat resistance can be formed, is likely to be obtained.

Examples of the infrared absorber include a pyrrolopyrrole compound, a copper compound, a cyanine compound, a phthalocyanine compound, an iminium compound, a thiol complex, a transition metal oxide, a squarylium compound, a naphthalocyanine compound, a quaterrylene compound, a dithiol metal complex, and a croconium compound.

(Compound Having Absorption Maximum in Wavelength Range of Longer than 900 Nm and 1000 nm or Shorter)

The infrared absorber according to the embodiment of the present invention includes at least a compound having an absorption maximum in a wavelength range of longer than 900 nm and 1000 nm or shorter. The absorption maximum of the compound is present preferably in a wavelength range of 900 to 990 nm, more preferably in a wavelength range of 900 to 980 nm, and still more preferably in a wavelength range of 900 to 960 nm. In addition, in the compound, a ratio absorbance $A_{max}$/absorbance $A_{1020}$ of an absorbance $A_{max}$ at the absorption maximum to an absorbance $A_{1020}$ at a wavelength of 1020 nm is preferably 4.5 or higher, more preferably 10 or higher, and still more preferably 30 or higher. For example, the upper limit is preferably 90 or lower. According to this aspect, a transparency of infrared light having a wavelength of longer than 1000 nm can be improved. In addition, "having an absorption maximum in a wavelength range of longer than 900 nm and 1000 nm or shorter" denotes having a maximum absorbance in a wavelength range of longer than 900 nm and 1000 nm or shorter in an absorption spectrum.

As the compound having an absorption maximum in a wavelength range of longer than 900 nm and 1000 nm or shorter, at least one compound selected from the group consisting of a pyrrolopyrrole compound, a cyanine compound, a squarylium compound, a phthalocyanine compound, and a naphthalocyanine compound is preferable, and a pyrrolopyrrole compound is more preferable. Examples of the pyrrolopyrrole compound include a compound described in paragraphs "0010" to "0033" of WO2015/166873A. Examples of the cyanine compound include a compound represented by the following formula and a compound described in JP2014-095007A. Examples of the phthalocyanine compound include a compound described in JP2014-021421A. Examples of the squarylium compound include a compound described in JP2014-077066A and a compound described in JP2013-147595A. The contents of the above-described citations are incorporated herein by reference. In addition, as a commercially available product, FDN-005, FDN-006, or FDN-007 (phthalocyanine compound, all of which are manufactured by Yamada Chemical Co., Ltd.) can also be used.

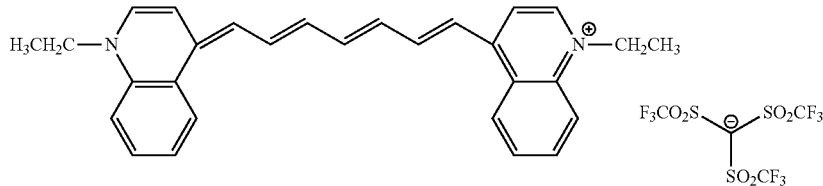

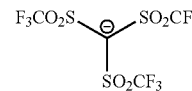

As the pyrrolopyrrole compound which is used as the compound having an absorption maximum in a wavelength range of longer than 900 nm and 1000 nm or shorter, a compound represented by the following Formula (1) is preferable. By using this compound, an effect of improving the heat resistance or light fastness of the obtained film can be expected.

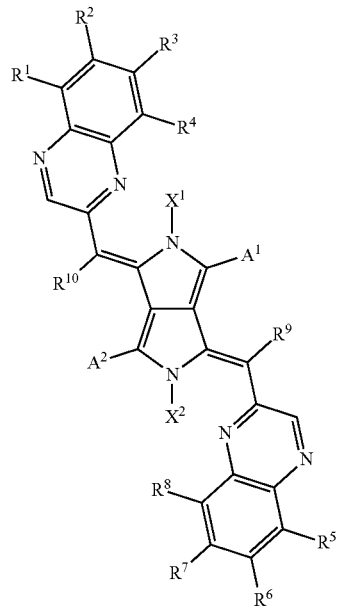

(1)

In Formula (1), $X^1$ and $X^2$ each independently represent a hydrogen atom or a substituent, $A^1$ and $A^2$ each independently represent a substituent, $R^1$ to $R^{10}$ each independently represent a hydrogen atom or a substituent, and at least one of $R^1, \ldots,$ or $R^8$ represents a substituent.

Examples of the substituents each independently represented by $A^1$ and $A^2$ include an aryl group and a heteroaryl group. Among these, an aryl group is preferable.

As the aryl group, an aryl group having 6 to 20 carbon atoms is preferable, an aryl group having 6 to 12 carbon atoms is more preferable, and a phenyl group or a naphthyl group is still more preferable.

The heteroaryl group may be a monocycle or a polycycle. The number of heteroatoms constituting the heteroaryl group is preferably 1 to 3. It is preferable that the heteroatoms constituting the heteroaryl group are a nitrogen atom, an oxygen atom, or a sulfur atom. The number of carbon atoms in the heteroaryl group is preferably 3 to 30, more preferably 3 to 18, and still more preferably 3 to 12. Specific examples of the heteroaryl group include an imidazolyl group, a pyridyl group, a quinolyl group, a furyl group, a thienyl group, a benzoxazolyl group, a benzimidazolyl group, a benzothiazolyl group, a naphthothiazolyl group, a m-carbazolyl group, and an azepinyl group.

The aryl group and the heteroaryl group may have a substituent or may be unsubstituted. From the viewpoint of improving solubility in a solvent, it is preferable that the aryl group and the heteroaryl group have a substituent. Examples of the substituent include an alkyl group, an alkenyl group, an alkoxy group, a group represented by -L-$R^{x1}$ described below, and a group represented by -$L^{100}$-$X^{100}$ described below. In addition, the hydroxy group may have a substituent.

The number of carbon atoms in the alkyl group is preferably 1 to 40, more preferably 1 to 30, and still more preferably 1 to 25. The alkyl group may be linear, branched, or cyclic and is preferably linear or branched and more preferably branched.

The number of carbon atoms in the alkenyl group is preferably 2 to 40. For example, the lower limit is more preferably 3 or more, still more preferably 5 or more, even still more preferably 8 or more, and even yet still more preferably 10 or more. The upper limit is more preferably 35 or less and still more preferably 30 or less. The alkenyl group may be linear, branched, or cyclic and is preferably linear or branched and more preferably branched.

The number of carbon atoms in the alkoxy group is preferably 1 to 40, more preferably 1 to 30, and still more preferably 1 to 25. The alkoxy group may be linear, branched, or cyclic and is preferably linear or branched and more preferably branched.

In the group represented by -L-$R^{x1}$, L represents —CO—, —COO—, —OCO—, —($OR^{x2}$)$_m$—, —($R^{x2}$O)$_m$—, and a group of a combination thereof, $R^{x1}$ represents an alkyl group, an alkenyl group, or an aryl group, $R^{x2}$ represents an alkylene group or an arylene group, m represents an integer of 2 or more, and a m number of $R^{x2'}$ s may be the same as or different from each other.

It is preferable that L represents —($OR^{x2}$)$_m$— or —($R^{x2}$O)$_m$—.

The alkyl group, the alkenyl group, and the aryl group represented by $R^{x1}$ have the same definitions and the same preferable ranges as the alkyl group, the alkenyl group, and the aryl group described above. $R^{x1}$ represents preferably an alkyl group or an alkenyl group and more preferably an alkyl group. The alkyl group, the alkenyl group, and the aryl group represented by $R^{x1}$ may be unsubstituted or may have a substituent. Examples of the substituent include a substituent T described below and a group represented by -$L^{100}$-$X^{100}$ described below.

The number of carbon atoms in the alkylene group represented by $R^{x2}$ is preferably 1 to 20, more preferably 1 to 10, and still more preferably 1 to 5. The alkylene group may be linear, branched, or cyclic and is preferably linear or branched.

The number of carbon atoms in the arylene group represented by $R^{x2}$ is preferably 6 to 20 and more preferably 6 to 12.

m represents an integer of 2 or more, preferably 2 to 20, and more preferably 2 to 10.

In the group represented by -$L^{100}$-$X^{100}$, $L^{100}$ represents a single bond or a divalent linking group, and $X^{100}$ represents a reactive group. As the reactive group, one or more selected from the group consisting of a vinyl group, a (meth)allyl group, a (meth)acryloyl group, an epoxy group, an oxetanyl group, an isocyanate group, a hydroxy group, an amino group, a carboxy group, a thiol group, an alkoxysilyl group, a methylol group, a sulfo group, a styryl group, and a maleimide group are more preferable, and a vinyl group, a (meth)allyl group, a (meth)acryloyl group, a hydroxy group, or a carboxy group is more preferable. In addition, as the reactive group, a group represented by the following Formula (A-1), a group represented by the following Formula (A-2), or a group represented by the following Formula (A-3) is also preferable.

(A-1)

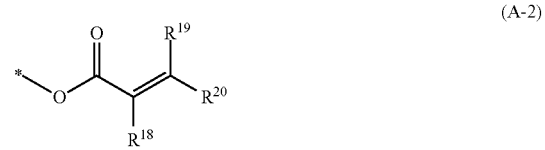

(A-2)

(A-3)

In Formula (A-1), $R^{15}$, $R^{16}$, and $R^{17}$ each independently represent a hydrogen atom, an alkyl group, an alkenyl group, an alkynyl group, or an aryl group.

The number of carbon atoms in the alkyl group is preferably 1 to 18, more preferably 1 to 10, still more preferably 1 to 6, even still more preferably 1 to 3, and even yet still more preferably 1. The alkyl group may be linear, branched, or cyclic.

The number of carbon atoms in the alkenyl group is preferably 2 to 18, more preferably 2 to 10, still more preferably 2 to 6, and even still more preferably 2 or 3. The alkenyl group may be linear, branched, or cyclic.

The number of carbon atoms in the alkynyl group is preferably 2 to 18, more preferably 2 to 10, still more preferably 2 to 6, and even still more preferably 2 or 3. The alkynyl group may be linear, branched, or cyclic.

The number of carbon atoms in the aryl group is preferably 6 to 12, more preferably 6 to 8, and still more preferably 6.

In Formula (A-1), $R^{15}$ represents preferably a hydrogen atom or an alkyl group having 1 to 18 carbon atoms and more preferably a hydrogen atom. In Formula (A-1), $R^{16}$ and $R^{17}$ each independently represent preferably a hydrogen atom or an alkyl group having 1 to 18 carbon atoms and more preferably a hydrogen atom.

In Formula (A-2), $R^{18}$, $R^{19}$, and $R^{20}$ each independently represent a hydrogen atom, a methyl group, a fluorine atom, or —$CF_3$. In Formula (A-2), it is preferable that $R^{18}$ represents a methyl group. In Formula (A-2), it is preferable that $R^{19}$ and $R^{20}$ represent a hydrogen atom.

In Formula (A-3), $R^{21}$ and $R^{22}$ each independently represent a hydrogen atom, a methyl group, a fluorine atom, or —$CF_3$ and preferably a hydrogen atom. In Formula (A-3), Q represents 1 or 2.

In a case where $L^{100}$ represents a divalent linking group, it is preferable that $L^{100}$ represents an alkylene group having 1 to 20 carbon atoms, an arylene group having 6 to 18 carbon atoms, a heteroarylene group having 3 to 18 carbon atoms, —O—, —S—, —CO—, —COO—, —OCO—, or a group of a combination thereof.

In Formula (1), $R^1$ to $R^{10}$ each independently represent a hydrogen atom or a substituent, and at least one of $R^1$, ..., or $R^8$ represents a substituent. It is preferable that two to eight of $R^1$ to $R^8$ represent a substituent, it is more preferable that two to six of $R^1$ to $R^8$ represent a substituent, and it is still more preferable that two to four of $R^1$ to $R^8$ represent a substituent.

Examples of the substituent represented by $R^1$ to $R^8$ include a halogen atom, an alkyl group, an alkoxy group, an aryl group, a cyano group, and a group represented by -$L^{100}$-$X^{100}$.

As the halogen atom, a fluorine atom, a chlorine atom, a bromine atom, or an iodine atom is preferable, and a chlorine atom is more preferable.

The number of carbon atoms in the alkyl group is preferably 1 to 40, more preferably 1 to 30, and still more preferably 1 to 25. The alkyl group may be linear, branched, or cyclic and is preferably linear or branched and more preferably linear.

The number of carbon atoms in the alkoxy group is preferably 1 to 40, more preferably 1 to 30, and still more preferably 1 to 25. The alkoxy group may be linear, branched, or cyclic and is preferably linear or branched and more preferably linear.

The number of carbon atoms in the aryl group is preferably 6 to 20 and more preferably 6 to 12.

As the substituent represented by $R^1$ to $R^8$, a halogen atom or a group represented by -$L^{100}$-$X^{100}$ is preferable, a halogen atom is more preferable, and a chlorine atom is still more preferable.

In addition, at least one of $R^1$, ..., or $R^4$ represents a halogen atom or the group represented by -$L^{100}$-$X^{100}$, and it is preferable that at least one of $R^5$, ..., or $R^8$ represents a halogen atom or the group represented by -$L^{100}$-$X^{100}$.

Examples of the substituent represented by $R^9$ and $R^{10}$ include the following substituent T.

(Substituent T)

Examples of the substituent T include an alkyl group (having preferably 1 to 30 carbon atoms, more preferably 1 to 20 carbon atoms, and still more preferably 1 to 10 carbon atoms), an alkenyl group (having preferably 2 to 30 carbon atoms, more preferably 2 to 20 carbon atoms, and still more preferably 2 to 10 carbon atoms), an alkynyl group (having preferably 2 to 30 carbon atoms, more preferably 2 to 20 carbon atoms, and still more preferably 2 to 10 carbon atoms), an aryl group (having preferably 6 to 30 carbon atoms, more preferably 6 to 20 carbon atoms, and still more preferably 6 to 12 carbon atoms), an amino group (for example, an alkylamino group, an arylamino group, or a heterocyclic amino group), an alkoxy group (having preferably 1 to 30 carbon atoms, more preferably 1 to 20 carbon atoms, and still more preferably 1 to 10 carbon atoms), an aryloxy group (having preferably 6 to 30 carbon atoms, more preferably 6 to 20 carbon atoms, and still more preferably 6 to 12 carbon atoms), an aromatic heterocyclic oxy group (having preferably 1 to 30 carbon atoms, more preferably 1 to 20 carbon atoms, and still more preferably 1 to 12 carbon atoms), an acyl group (having preferably 1 to 30 carbon atoms, more preferably 1 to 20 carbon atoms, and still more preferably 1 to 12 carbon atoms), an alkoxycarbonyl group (having preferably 2 to 30 carbon atoms, more preferably 2 to 20 carbon atoms, and still more preferably 2 to 12 carbon atoms), an aryloxycarbonyl group (having preferably 7 to 30 carbon atoms, more preferably 7 to 20 carbon atoms, and still more preferably 7 to 12 carbon atoms), an acyloxy group (having preferably 2 to 30 carbon atoms, more preferably 2 to 20 carbon atoms, and still more preferably 2 to 10 carbon atoms), an acylamino group (having preferably 2 to 30 carbon atoms, more preferably 2 to 20 carbon atoms, and still more preferably 2 to 10 carbon atoms), an alkoxycarbonylamino group (having preferably 2 to 30 carbon atoms, more preferably 2 to 20 carbon atoms, and still more preferably 2 to 12 carbon atoms), an aryloxycarbonylamino group (having preferably 7 to 30 carbon atoms, more preferably 7 to 20 carbon atoms, and still more preferably 7 to 12 carbon atoms), a sulfonylamino group (having preferably 1 to 30 carbon atoms, more preferably 1 to 20 carbon atoms, and still more preferably 1 to 12 carbon atoms), a sulfamoyl group (having preferably 0 to 30 carbon atoms, more preferably 0 to 20 carbon atoms, and still more preferably 0 to 12 carbon atoms), a carbamoyl group (having preferably 1 to 30 carbon atoms, more preferably 1 to 20 carbon atoms, and still more preferably 1 to 12 carbon atoms), an alkylthio group (having preferably 1 to 30 carbon atoms, more preferably 1 to 20 carbon atoms, and still more preferably 1 to 12 carbon atoms), an arylthio group (having preferably 6 to 30 carbon atoms, more preferably 6 to 20 carbon atoms, and still more preferably 6 to 12 carbon atoms), an aromatic heterocyclic thio group (having preferably 1 to 30 carbon atoms, more preferably 1 to 20 carbon atoms, and still more preferably 1 to 12 carbon atoms), an alkylsulfonyl group (having preferably 1 to 30 carbon atoms, more preferably 1 to 20 carbon atoms, and still more preferably 1 to 12 carbon atoms), an arylsulfonyl group (having preferably 6 to 30 carbon atoms, more preferably 6 to 20 carbon atoms, and still more preferably 6 to 12 carbon atoms), an alkylsulfinyl group (having preferably 1 to 30 carbon atoms, more preferably 1 to 20 carbon atoms, and still more preferably 1 to 12 carbon atoms), an arylsulfinyl group (having preferably 6 to 30 carbon atoms, more preferably 6 to 20 carbon atoms, and still more preferably 6 to 12 carbon atoms), a ureido group (having preferably 1 to 30 carbon atoms, more preferably 1 to 20 carbon atoms, and still more preferably 1 to 12 carbon atoms), a phosphoric amide group (having preferably 1 to 30 carbon atoms, more preferably 1 to 20 carbon atoms, and still more preferably 1 to 12 carbon atoms), a hydroxy group, a mercapto group, a halogen atom (for example, a fluorine atom, a chlorine atom, a bromine atom, or an iodine atom), a cyano group, a sulfo group, a carboxy group, a nitro group, a hydroxamic acid group, a sulfino group, a hydrazino group, an imino group, a heterocyclic group, and a silyl group.

It is preferable that the substituent represented by $R^9$ and $R^{10}$ is an electron-withdrawing group. As the electron-withdrawing group, for example, a substituent having a positive Hammett substituent constant sigma para value ($\sigma p$ value) is preferable. The $\sigma p$ value is preferably 0.20 or higher, more preferably 0.25 or higher, still more preferably 0.3 or higher, and even still more preferably 0.35 or higher. The upper limit is not particularly limited and is preferably 0.80 or lower. Specific examples of the substituent having a Hammett $\sigma p$ value of 0.2 or higher include a cyano group ($\sigma p$ value=0.66), a carboxy group (for example, —COOH; $\sigma p$ value=0.45), an alkoxycarbonyl group (—COOMe: $\sigma p$ value=0.45), an aryloxycarbonyl group (for example, —COOPh; $\sigma p$ value=0.44), a carbamoyl group (for example, —CONH$_2$; $\sigma p$ value=0.36), an alkylcarbonyl group (for example, —COMe; $\sigma p$ value=0.50), an arylcarbonyl group (for example, —COPh; σp value=0.43), an alkylsulfonyl group (for example, —SO₂Me; σp value=0.72), and an arylsulfonyl group (for example, —SO₂Ph; σp value=0.68). Here, Me represents a methyl group, and Ph represents a phenyl group. The details of the Hammett substituent constant σp value can be found in paragraphs "0017" and "0018" of JP2011-068731A, the content of which is incorporated herein by reference.

As the substituents each independently represented by $R^9$ and $R^{10}$, a cyano group, a carboxy group, an acyl group, an alkoxycarbonyl group, an aryloxycarbonyl group, a carbamoyl group, an alkylcarbonyl group, an arylcarbonyl group, an alkylsulfonyl group, an arylsulfonyl group, is preferable, and a cyano group is more preferable.

In Formula (1), $X^1$ and $X^2$ each independently represent a hydrogen atom or a substituent.

Examples of the substituents each independently represented by $X^1$ and $X^2$ include an alkyl group, an aryl group, a heteroaryl group, a metal atom, and a group represented by —$BR^{21}R^{22}$.

The number of carbon atoms in the alkyl group is preferably 1 to 40, more preferably 1 to 30, and still more preferably 1 to 25. The alkyl group may be linear, branched, or cyclic and is preferably linear or branched and more preferably linear.

The number of carbon atoms in the aryl group is preferably 6 to 20 and more preferably 6 to 12.

The heteroaryl group may be monocyclic or polycyclic and is preferably monocyclic. The number of heteroatoms constituting the heteroaryl group is preferably 1 to 3. It is preferable that the heteroatoms constituting the heteroaryl group are a nitrogen atom, an oxygen atom, or a sulfur atom. The number of carbon atoms in the heteroaryl group is preferably 3 to 30, more preferably 3 to 18, still more preferably 3 to 12 and even still more preferably 3 to 5.

As the metal atom, magnesium, aluminum, calcium, barium, zinc, tin, vanadium, iron, cobalt, nickel, copper, palladium, iridium, or platinum is preferable, and aluminum, zinc, vanadium, iron, copper, palladium, iridium, or platinum is more preferable.

In the group represented by —$BR^{21}R^{22}$, $R^{21}$ and $R^{22}$ each independently represent a substituent and may be bonded to each other to form a ring. Examples of the substituent represented by $R^{21}$ and $R^{22}$ include the above-described substituent T and a group represented by -$L^{100}$-$X^{100}$. Among these, a halogen atom, an alkyl group, an aryl group, a heteroaryl group, or a group represented by -$L^{100}$-$X^{100}$ is preferable.

As the halogen atom, a fluorine atom, a chlorine atom, a bromine atom, or an iodine atom is preferable, and a fluorine atom is more preferable.

The alkyl group, the aryl group, and the heteroaryl group have the same definitions and the same preferable ranges as the alkyl group, the aryl group, and the heteroaryl group described above regarding $X^1$ and $X^2$.

$R^{21}$ and $R^{22}$ may be bonded to each other to form a ring. Examples of a ring which is formed by $R^{21}$ and $R^{22}$ being bonded to each other include the following structure.

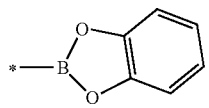

In Formula (1), $X^1$ and $X^2$ each independently represent preferably a hydrogen atom or a group represented by —$BR^{21}R^{22}$ and more preferably a group represented by —$BR^{21}R^{22}$.

It is preferable that the compound represented by Formula (1) is a compound represented by the following Formula (3).

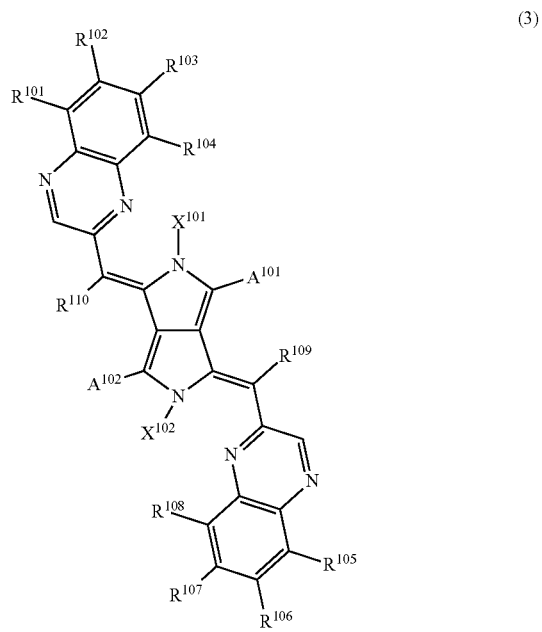

(3)

In Formula (3), $X^{101}$ and $X^{102}$ each independently represent a hydrogen atom, a group represented by the following Formula (4), or a group represented by the following Formula (5). $R^{101}$ to $R^{108}$ each independently represent a hydrogen atom, a halogen atom, an alkyl group having 1 to 40 carbon atoms, an alkoxy group having 1 to 40 carbon atoms, an aryl group having 6 to 20 carbon atoms, a cyano group, or a group represented by -$L^{100}$-$X^{100}$, and at least one of $R^{101}$, ..., or $R^{108}$ represents a halogen atom, an alkyl group having 1 to 40 carbon atoms, an alkoxy group having 1 to 40 carbon atoms, an aryl group having 6 to 20 carbon atoms, a cyano group, or a group represented by -$L^{100}$-$X^{100}$. $R^{109}$ and $R^{110}$ represent a cyano group, and $A^{101}$ and $A^{102}$ each independently represent an aryl group having 6 to 20 carbon atoms or a heteroaryl group having 3 to 18 carbon atoms.

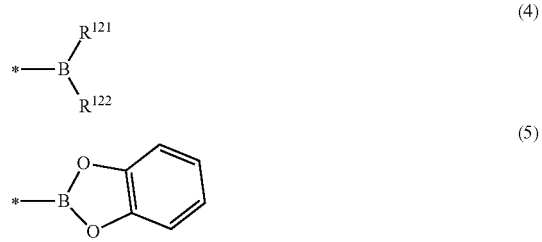

(4)

(5)

In Formula (4), $R^{121}$ and $R^{122}$ each independently represent a halogen atom, an alkyl group having 1 to 10 carbon atoms, an aryl group having 6 to 20 carbon atoms, a 5-membered or 6-membered heterocycle, or a group represented by -$L^{100}$-$X^{100}$, and * represents a direct bond.

In Formula (3), $X^{101}$ and $X^{102}$ each independently represent a hydrogen atom, a group represented by Formula (4), or a group represented by Formula (5). It is preferable that a halogen atom represented by $R^{121}$ and $R^{122}$ in Formula (4) is a fluorine atom. The number of carbon atoms in the alkyl group represented by $R^{121}$ and $R^{122}$ in Formula (4) is 1 to 10 and preferably 1 to 8. The number of carbon atoms in the aryl group represented by $R^{121}$ and $R^{122}$ in Formula (4) is 6 to 20 and preferably 6 to 12. A heteroatom constituting the 5-membered or 6-membered heterocycle represented by $R^{121}$ and $R^{122}$ in Formula (4) is preferably a nitrogen atom, an oxygen atom, or a sulfur atom. The number of heteroatoms is preferably 1 to 3.

In Formula (3), $R^{101}$ to $R^{108}$ each independently represent a hydrogen atom, a halogen atom, an alkyl group having 1 to 40 carbon atoms, an alkoxy group having 1 to 40 carbon atoms, an aryl group having 6 to 20 carbon atoms, a cyano group, or a group represented by -$L^{100}$-$X^{100}$, and at least one of $R^{101}$, ..., or $R^{108}$ represents a halogen atom, an alkyl group having 1 to 40 carbon atoms, an alkoxy group having 1 to 40 carbon atoms, an aryl group having 6 to 20 carbon atoms, a cyano group, or a group represented by -$L^{100}$-$X^{100}$. As the halogen atom, a fluorine atom, a chlorine atom, a bromine atom, or an iodine atom is preferable, and a chlorine atom is more preferable.

The number of carbon atoms in the alkyl group is preferably 1 to 40, more preferably 1 to 30, and still more preferably 1 to 25. The alkyl group may be linear, branched, or cyclic and is preferably linear or branched and more preferably linear.

The number of carbon atoms in the alkoxy group is preferably 1 to 40, more preferably 1 to 30, and still more preferably 1 to 25. The alkoxy group may be linear, branched, or cyclic and is preferably linear or branched and more preferably linear.

The number of carbon atoms in the aryl group is preferably 6 to 20 and more preferably 6 to 12.

In a case where $R^{101}$ to $R^{108}$ represent a substituent other than a hydrogen atom, as the substituent other than a hydrogen atom, a halogen atom or a group represented by -$L^{100}$-$X^{100}$ is preferable, a halogen atom is more preferable, and a chlorine atom is still more preferable.

In addition, at least one of $R^{101}$, ..., or $R^{104}$ represents a halogen atom or the group represented by -$L^{100}$-$X^{100}$, and it is preferable that at least one of $R^{105}$, ..., or $R^{108}$ represent a halogen atom or the group represented by -$L^{100}$-$X^{100}$.

In Formula (3), $A^{101}$ and $A^{102}$ each independently represent an aryl group having 6 to 20 carbon atoms or a heteroaryl group having 3 to 18 carbon atoms. The aryl group and the heteroaryl group represented by A101 and A102 have the same preferable ranges as $A^{101}$ and $A^{102}$ represented by Formula (1). The aryl group and the heteroaryl group represented by $A^{101}$ and $A^{102}$ may have a substituent or may be unsubstituted. From the viewpoint of improving solubility in a solvent, it is preferable that the aryl group and the heteroaryl group have a substituent. Examples of the substituent include an alkyl group, an alkoxy group, a group represented by -L-$R^{x1}$, and a group represented by -$L^{100}$-$X^{100}$. The substituent has the same preferable range as that described above $A^{101}$ and $A^{102}$ in Formula (1).

As the compound represented by Formula (1), for example, the following compound can be used. In the following formulae, "—$C_{19}H_{39}$" and "—$OC_8H_{17}$" are branched, respectively. "—$OC_4H_9$", "—$C_{18}H_{37}$", and "—$OC_{18}H_{37}$" represent a linear alkyl or a linear alkoxy. In compounds 36 to 38, one of $R^1$ and $R^2$ represents a hydrogen atom and the other one of $R^1$ and $R^2$ represents a substituent R, and one of $R^3$ and $R^4$ represents a hydrogen atom and the other one of $R^3$ and $R^4$ represents a substituent R. Specific examples of the compound represented by Formula (1) include compounds described in paragraphs "0026" to "0033" of WO2015/166873A, the content of which is incorporated herein by reference.

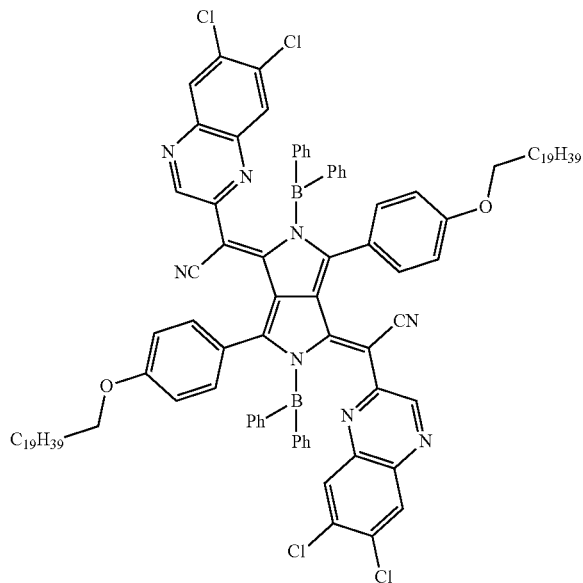

1

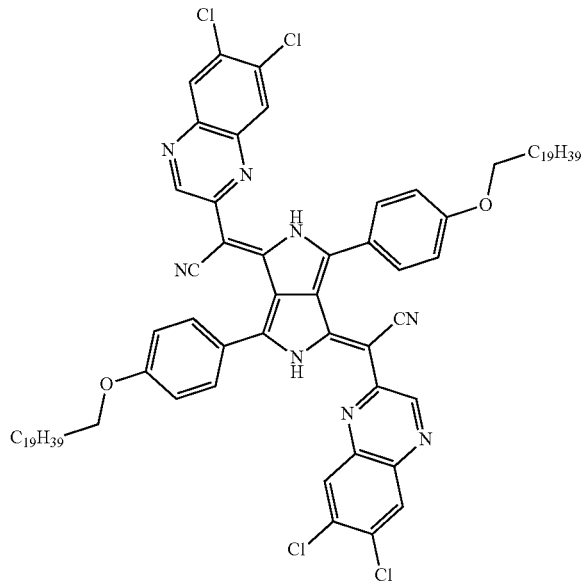

2

3
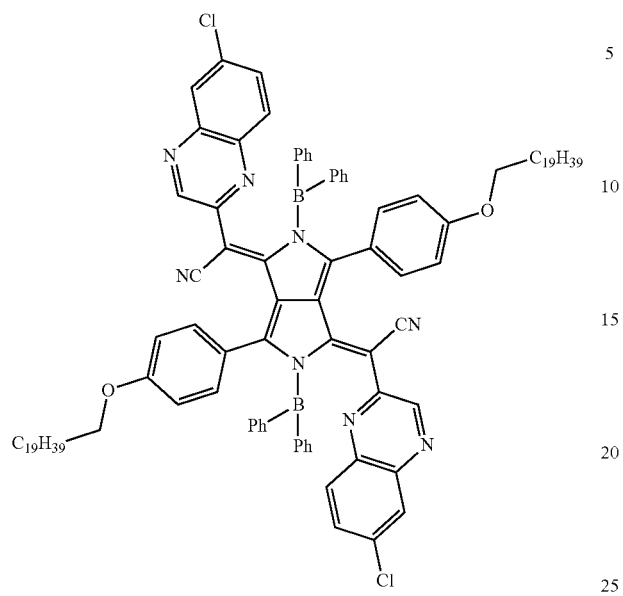
6
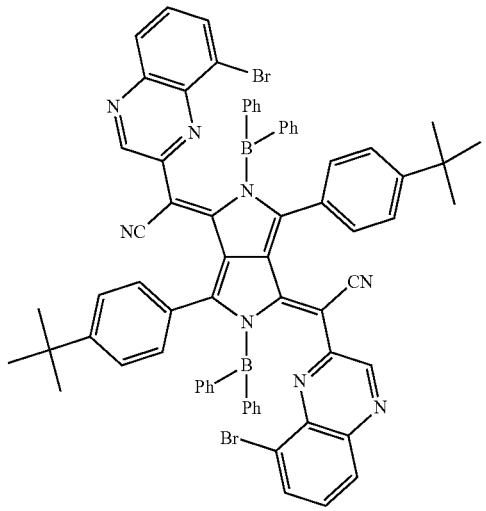
4
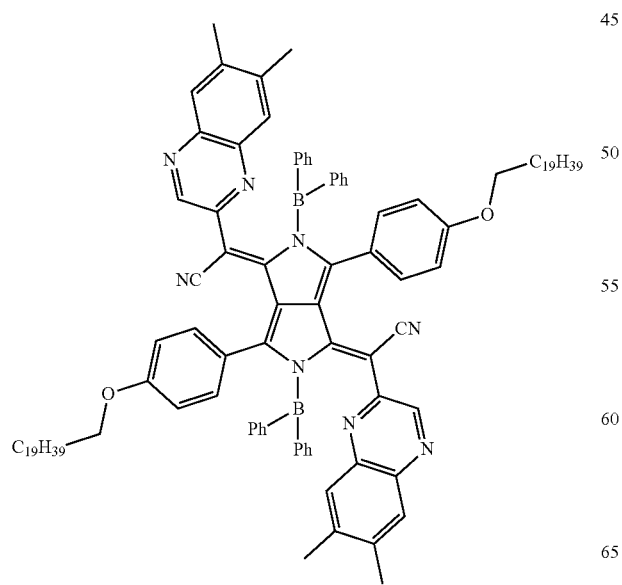
12
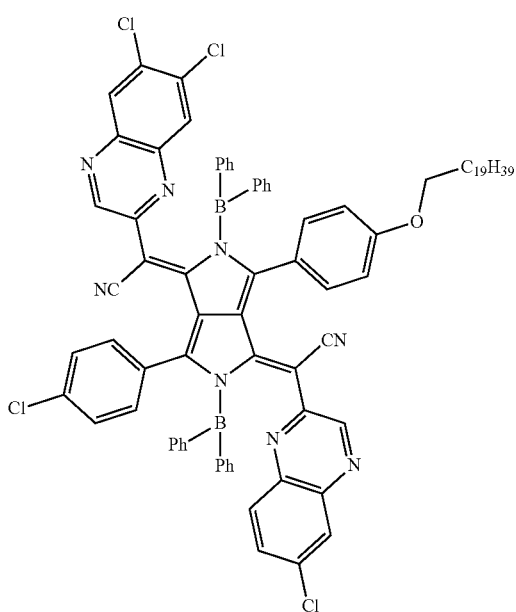

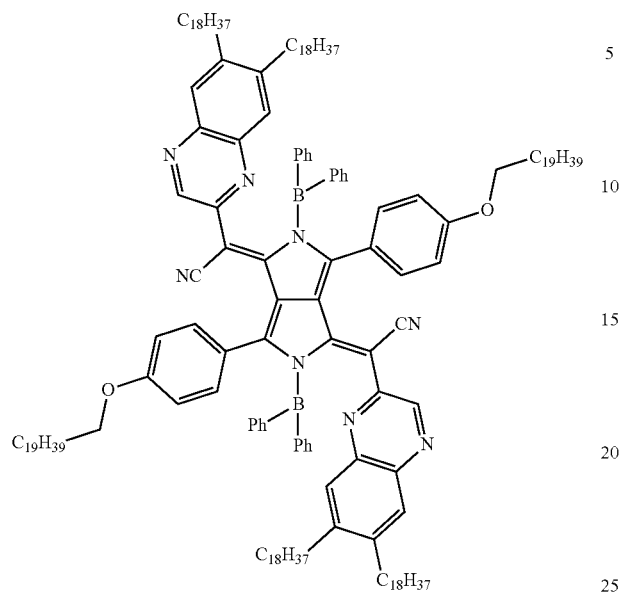
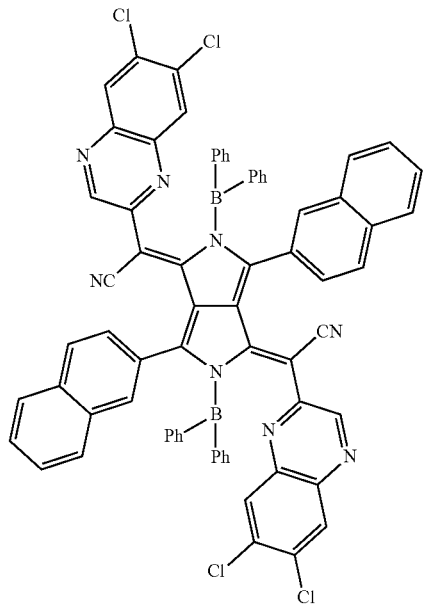

19
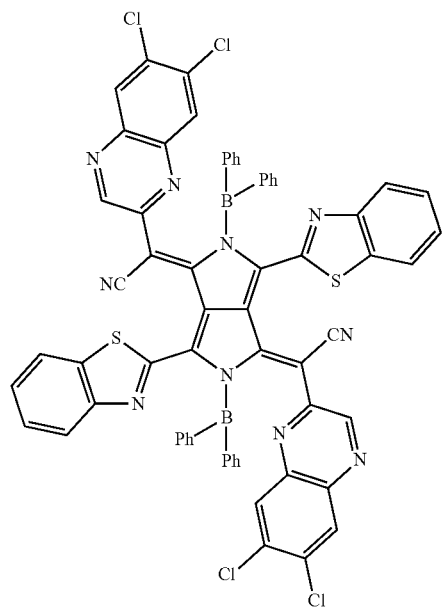
24
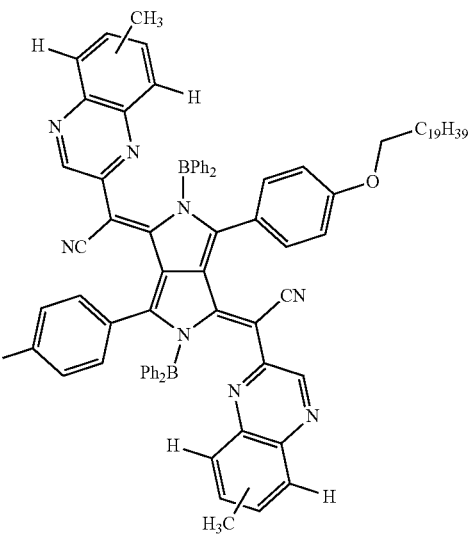
20
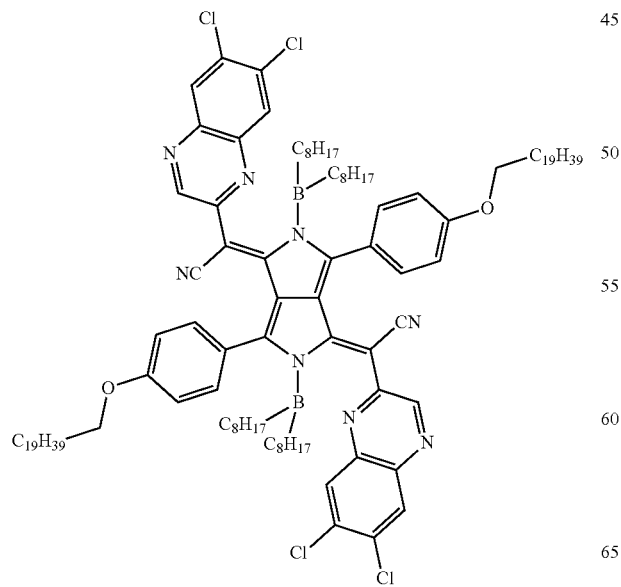
25
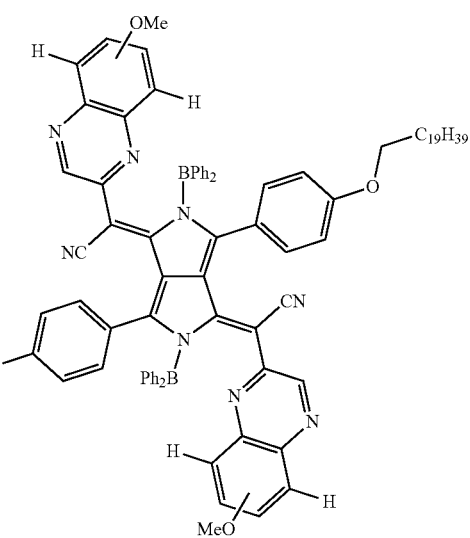

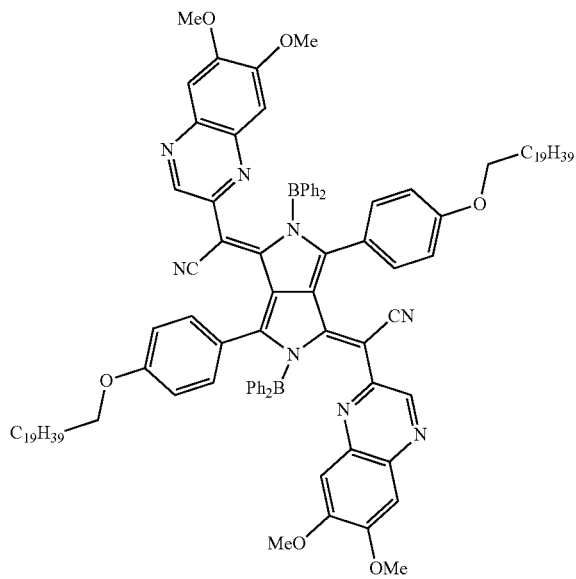
26
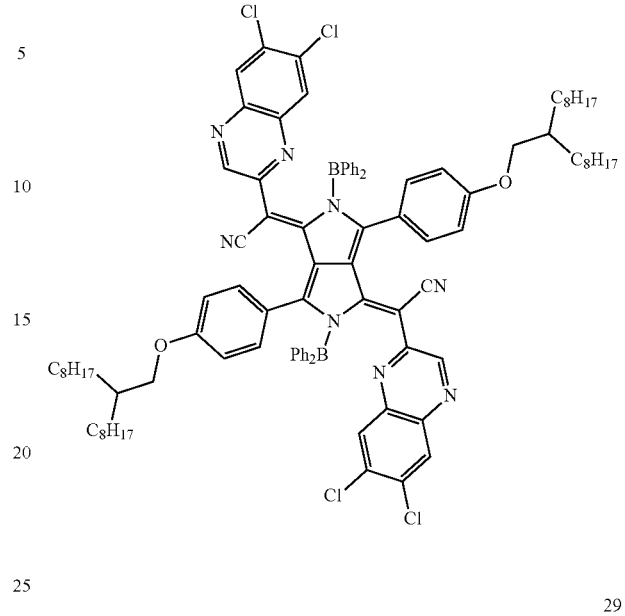
28
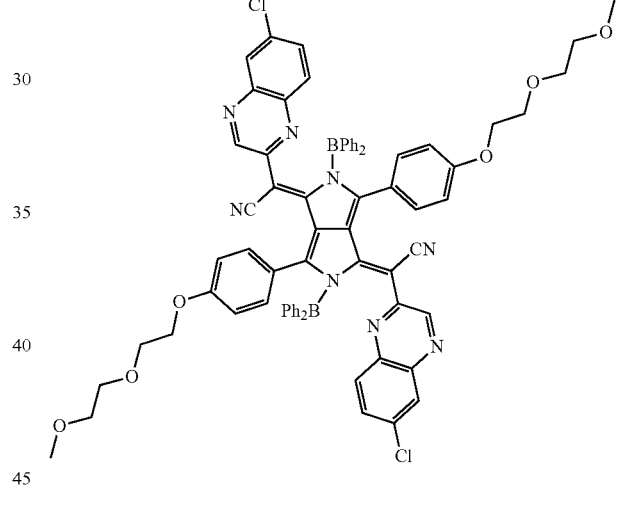
29
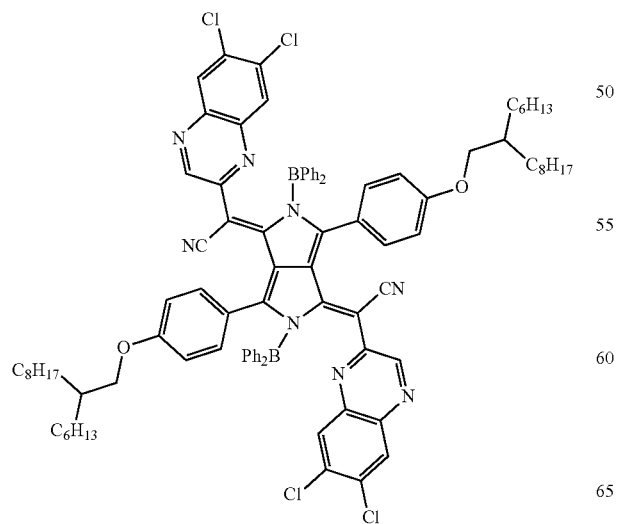
27
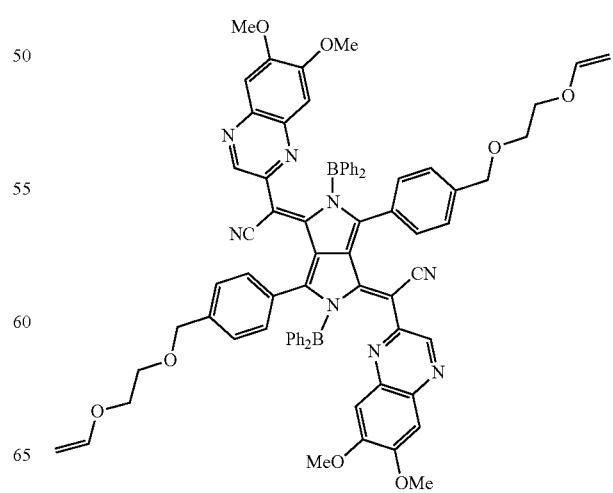
30

31
-continued
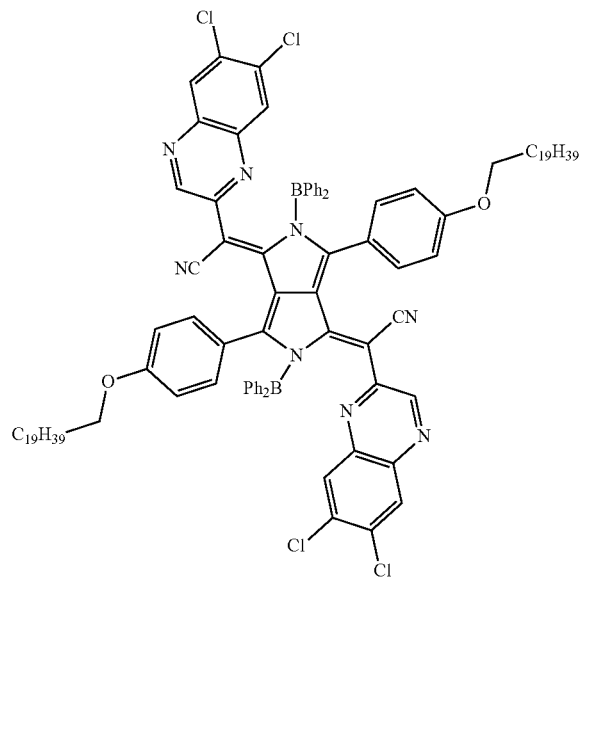
31
32
-continued
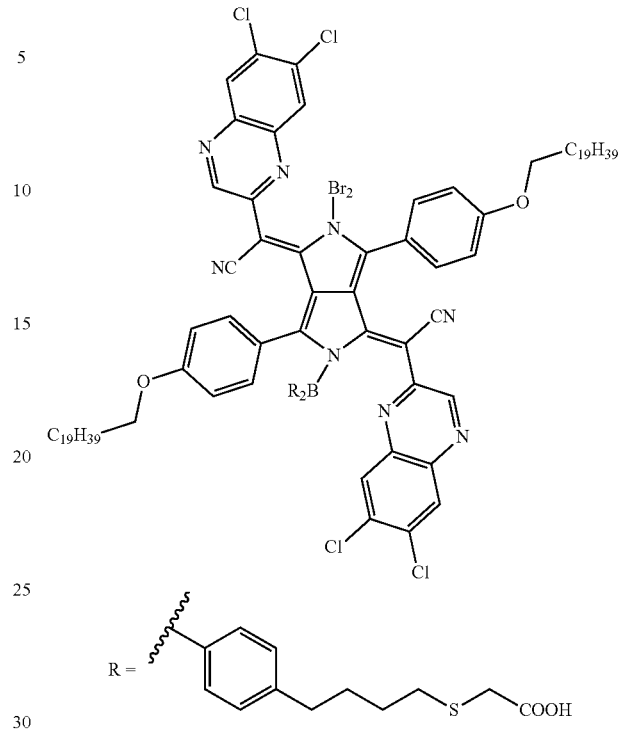
33
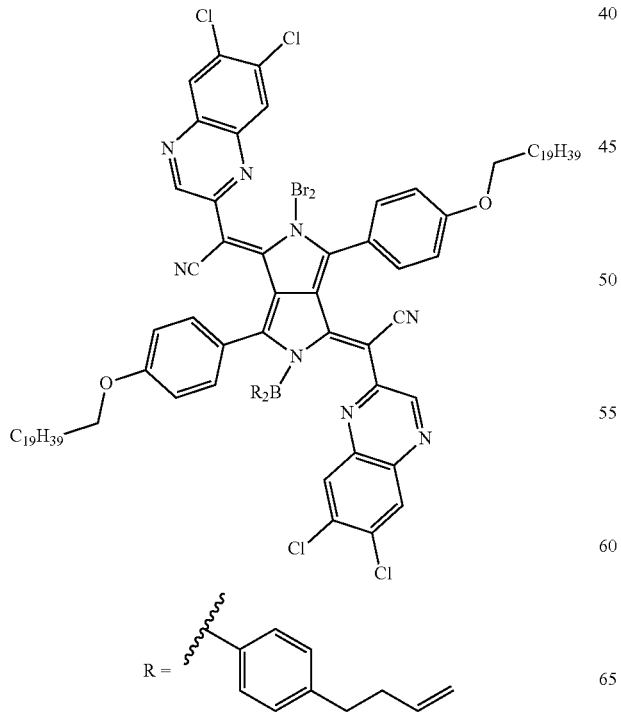
32
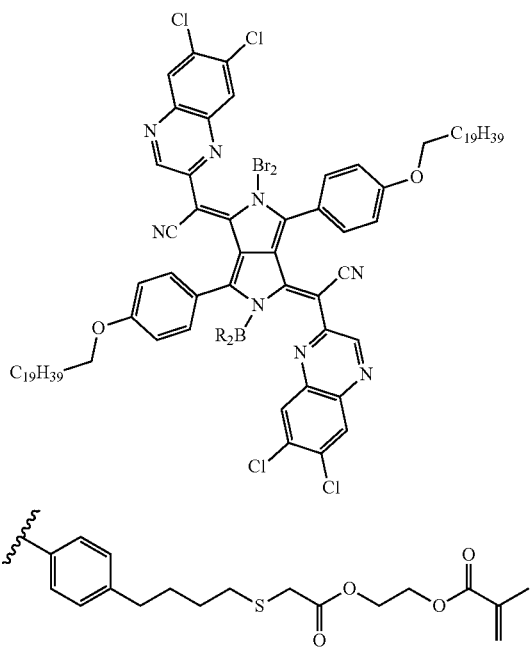
34

33
-continued
35
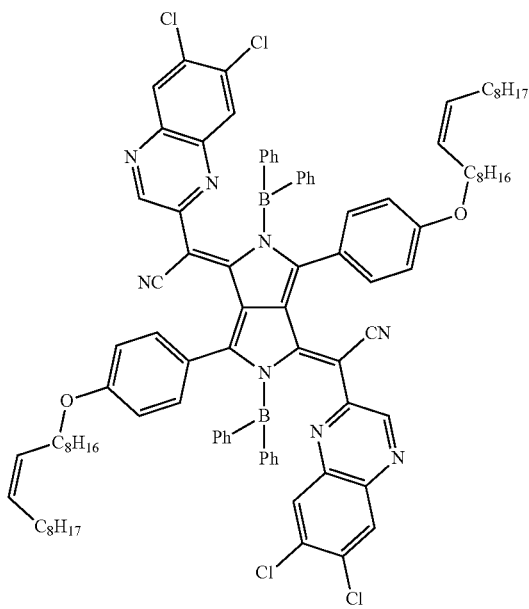
34
-continued
37
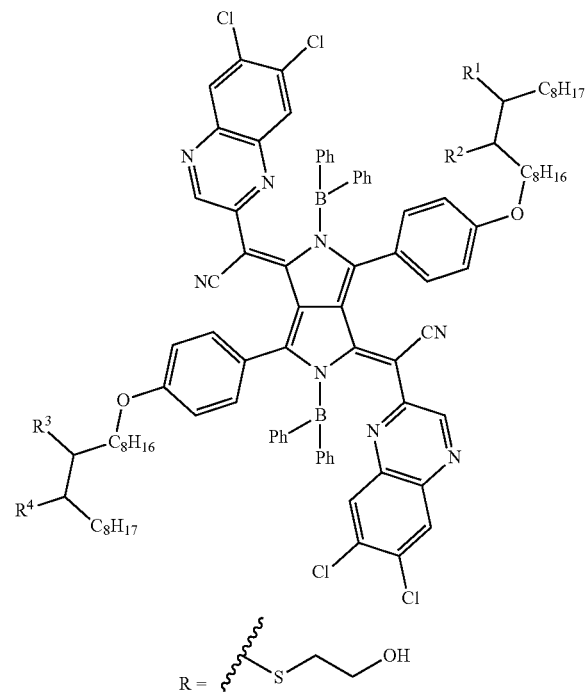
R = —S—CH₂CH₂—OH
36
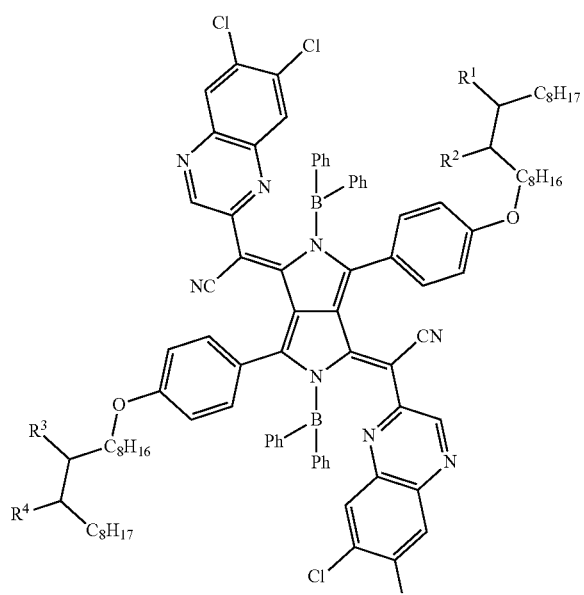
R = —S—CH₂—C(=O)—OH
38
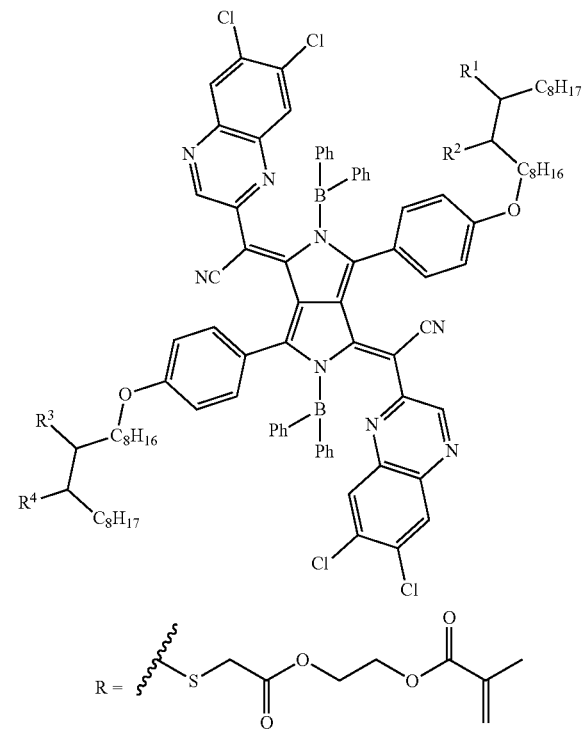
R = —S—CH₂—C(=O)—O—CH₂CH₂—O—C(=O)—C(CH₃)=CH₂

-continued
39
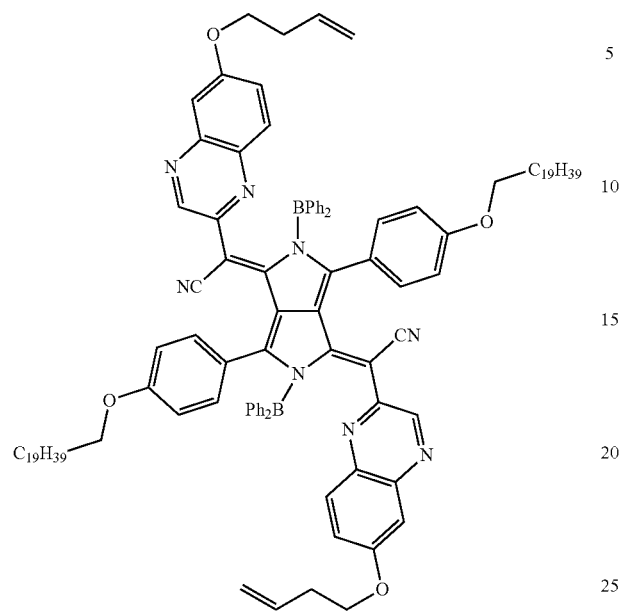
41
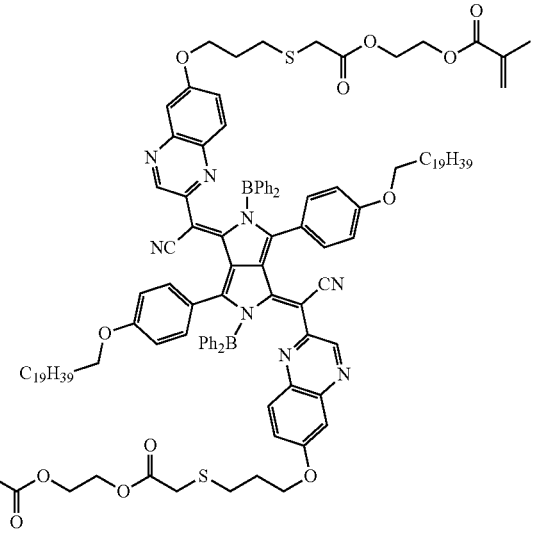
40
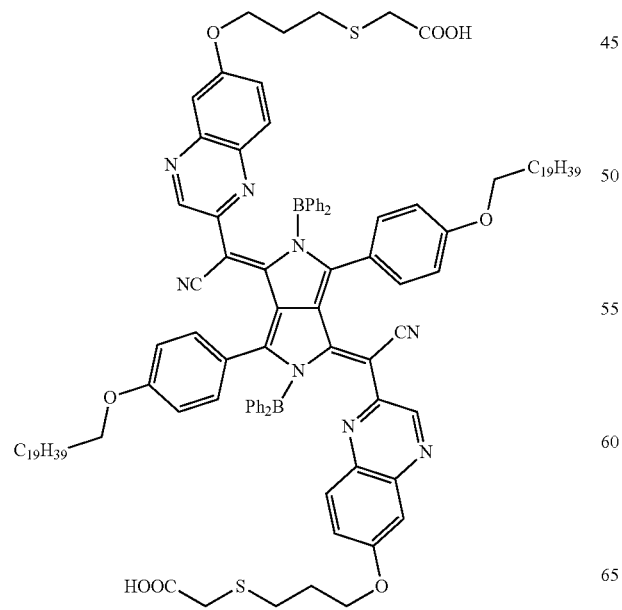
42
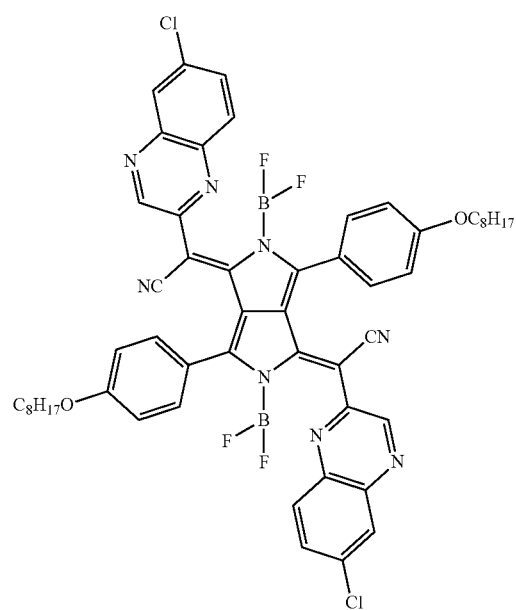

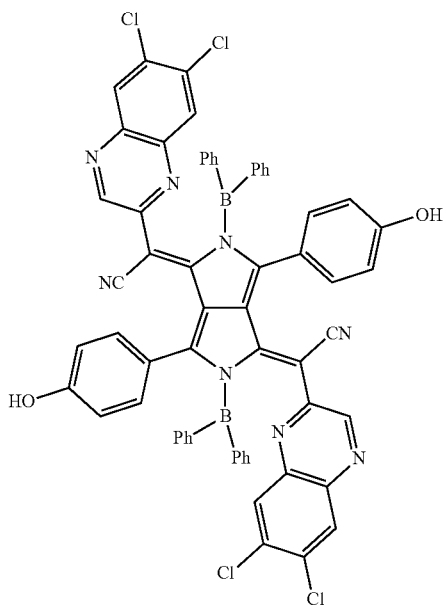

43

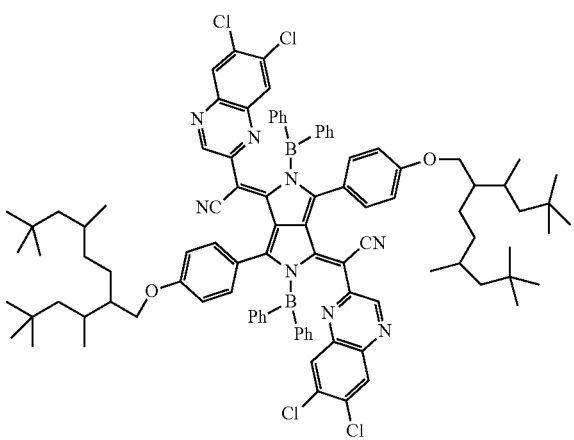

44

In the composition according to the embodiment of the present invention, the content of the compound having a absorption maximum in a wavelength range of longer than 900 nm and 1000 nm or shorter is preferably 1 to 30 mass % with respect to the total solid content of the composition. The upper limit is more preferably 20 mass % or lower, and still more preferably 10 mass % or lower. The lower limit is preferably 3 mass % or higher and more preferably 5 mass % or higher.

The total content of the compound having an absorption maximum in a wavelength range of longer than 900 nm and 1000 nm or shorter and the coloring material that shields visible light is preferably 10 to 60 mass % with respect to the total solid content of the composition. The upper limit is more preferably 55 mass % or lower, and still more preferably 50 mass % or lower. The lower limit is preferably 20 mass % or higher and more preferably 25 mass % or higher.

The content of the compound having an absorption maximum in a wavelength range of longer than 900 nm and 1000 nm or shorter is preferably 5 to 40 mass % with respect to the total content of the infrared absorber and the coloring material that shields visible light. The upper limit is more preferably 30 mass % or lower, and still more preferably 25 mass % or lower. The lower limit is preferably 10 mass % or higher and more preferably 15 mass % or higher.

(Compound Having Absorption Maximum in Wavelength Range of Longer than 700 Nm and 900 nm or Shorter)

It is preferable that the infrared absorber further includes a compound having an absorption maximum in a wavelength range of longer than 700 nm and 900 nm or shorter. According to this aspect, light in a visible range can be more effectively shielded, and a film capable of selectively allowing transmission of infrared light having a wavelength of longer than 1000 nm in a state where noise generated from visible light is small can be easily manufactured. The absorption maximum of the compound is preferably in a wavelength range of 750 to 900 nm and more preferably in a wavelength range of 800 to 880 nm.

Examples of the compound having an absorption maximum in a wavelength range of longer than 700 nm and 900 nm or shorter include a pyrrolopyrrole compound, a cyanine compound, a squarylium compound, a phthalocyanine compound, a naphthalocyanine compound, a merocyanine compound, a croconium compound, an oxonol compound, and an iminium compound. Among these, a pyrrolopyrrole compound, a cyanine compound, or a squarylium compound is preferable. As the phthalocyanine compound, the naphthalocyanine compound, the iminium compound, the cyanine compound, the squarylium compound, or the croconium compound, for example, one of the compounds described in paragraphs "0010" to "0081" of JP2010-111750A may be used, the content of which are incorporated in this specification. The cyanine compound can be found in, for example, "Functional Colorants by Makoto Okawara, Masaru Matsuoka, Teijiro Kitao, and Tsuneoka Hirashima, published by Kodansha Scientific Ltd.", the content of which is incorporated herein by reference. It is preferable that the phthalocyanine compound is oxotitanyl phthalocyanine or vanadium phthalocyanine. It is preferable that the naphthalocyanine compound is oxovanadyl naphthalocyanine. Examples of the squarylium compound include a compound described in paragraphs "0044" to "0049" of JP2011-208101A and a compound described in paragraphs "0072" to "0079" of JP2015-040895A, the contents of which are incorporated herein by reference. In addition, examples of the cyanine compound include a compound described in paragraphs "0044" and "0045" of JP2009-108267A, a compound described in paragraph "0149" of JP2014-214262A, a compound described in paragraphs "0051" to "0068" of JP2015-40895A, and a compound described in paragraphs "0047" to "0052" and "0063" of JP2008-088426A, the contents of which are incorporated herein by reference. In addition, as the cyanine compound, the following compounds can also be used.

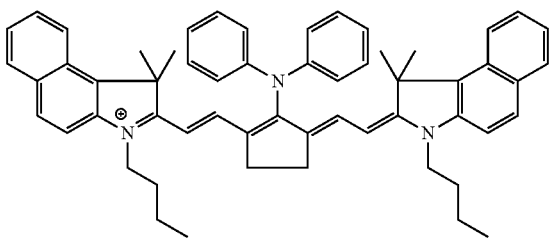

-continued

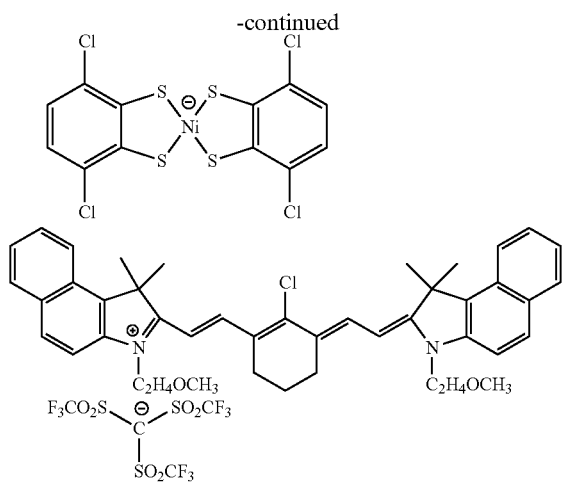

In the present invention, as the compound having an absorption maximum in a wavelength range of longer than 700 nm and 900 nm or shorter, a compound described in paragraphs "0004" to "0016" of JP1995-164729A (JP-H07-164729A), a compound described in paragraphs "0027" to "0062" of JP2002-146254A, or near infrared ray absorbing particles described in paragraphs "0034" to "0067" of JP2011-164583A which are formed of crystallites of an oxide including Cu and/or P and have a number average aggregated particle size of 5 to 200 nm may be used, the content of which is incorporated herein by reference. In addition, for example, FD-25 (manufactured by Yamada Chemical Co., Ltd.) or IRA842 (naphthalocyanine compound, manufactured by Exiton, Inc.) may be used.

As the compound having an absorption maximum in a wavelength range of longer than 700 nm and 900 nm or shorter, a compound represented by the following Formula (10) is preferably used. By using this compound, excellent spectral characteristics can be obtained. Further, a film having excellent heat resistance can be formed.

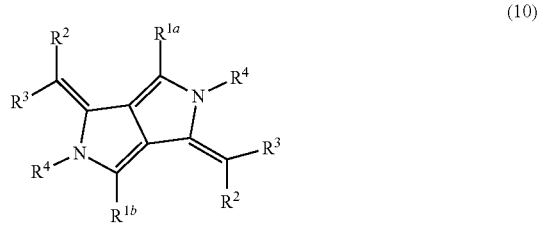

(10)

In Formula (10), $R^{1a}$ and $R^{1b}$ each independently represent an alkyl group, an aryl group, or a heteroaryl group, $R^2$ and $R^3$ each independently represent a hydrogen atom or a substituent, and $R^2$ and $R^3$ may be bonded to each other to form a ring. $R^4$ s each independently represent a hydrogen atom, an alkyl group, an aryl group, a heteroaryl group, —$BR^{4A}R^{4B}$, or a metal atom, $R^4$ may form a covalent bond or a coordinate bond with at least one selected from the group consisting of $R^{1a}$, $R^{1b}$, and $R^3$, and $R^{4A}$ and $R^{4B}$ each independently represent a hydrogen atom or a substituent.

The alkyl group represented by $R^{1a}$ or $R^{1b}$ is an alkyl group having preferably 1 to 30 carbon atoms, more preferably 1 to 20 carbon atoms, and still more preferably 1 to 10 carbon atoms.

The aryl group represented by $R^{1a}$ or $R^{1b}$ is an aryl group having preferably 6 to 30 carbon atoms, more preferably 6 to 20 carbon atoms, and still more preferably 6 to 12 carbon atoms.

It is preferable that the heteroaryl group represented by $R^{1a}$ or $R^{1b}$ is a 5-membered or 6-membered ring. The heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the heteroaryl group is preferably 1 to 3 and more preferably 1 or 2. Examples of the heteroatom include a nitrogen atom, an oxygen atom, and a sulfur atom.

The alkyl group, the aryl group, and the heteroaryl group may have a substituent or may be unsubstituted. Examples of the substituent include the above-described substituent T and a group represented by -$L^{100}$-$X^{100}$.

$R^{1a}$ and $R^{1b}$ each independently represent preferably an aryl group or a heteroaryl group, and more preferably an aryl group. It is preferable that $R^{1a}$ and $R^{1b}$ represent an aryl group which has an alkoxy group having a branched alkyl group. The number of carbon atoms in the branched alkyl group is preferably 3 to 30 and more preferably 3 to 20.

In Formula (10), $R^{1a}$ and $R^{1b}$ may be the same as or different from each other.

$R^2$ and $R^3$ each independently represent a hydrogen atom or a substituent. Examples of the substituent include the above-described substituent T. In a case where the above-described groups can be further substituted, the groups may further have a substituent. Examples of the substituent include groups described above as the examples of the above-described substituent T and a group represented by -$L^{100}$-$X^{100}$.

It is preferable that at least one of $R^2$ or $R^3$ represents an electron-withdrawing group. As the electron-withdrawing group, for example, a substituent having a positive Hammett substituent constant sigma para value (σp value) is preferable. The σp value is preferably 0.20 or higher, more preferably 0.25 or higher, still more preferably 0.3 or higher, and even still more preferably 0.35 or higher. The upper limit is not particularly limited and is preferably 0.80 or lower. Specific examples include a cyano group, a carboxy group, an acyl group, an alkoxycarbonyl group, an aryloxycarbonyl group, a carbamoyl group, an alkylcarbonyl group, an arylcarbonyl group, an alkylsulfonyl group, and an arylsulfonyl group. Among these, a cyano group is more preferable.

$R^2$ and $R^3$ may be bonded to each other to form a ring. In a case where $R^2$ and $R^3$ are bonded to each other to form a ring, it is preferable that the formed ring is a 5- to 7-membered (preferably 5-membered or 6-membered ring) ring which is typically used as an acid nucleus in a merocyanine colorant. Specific examples include a structure described in paragraph "0026" of JP2009-263614A, and the content of which is incorporated herein by reference.

The σp values of $R^2$ and $R^3$ which form the ring cannot be defined. However, in this specification, assuming that each of $R^2$ and $R^3$ is substituted with a partial ring structure, the σp values of $R^2$ and $R^3$ which form the ring are defined. For example, in a case where $R^2$ and $R^3$ form a 1,3-indanedione ring, each of $R^2$ and $R^3$ is substituted with a benzoyl group.

It is preferable that one of $R^2$ and $R^3$ represents a cyano group and the other one of $R^2$ and $R^3$ represents a heteroaryl group. It is preferable that the heteroaryl group is a 5-membered or 6-membered ring. In addition, the heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the heteroaryl group is preferably 1 to 3 and more preferably 1 or 2. Examples of the heteroatom include a nitrogen atom, an oxygen atom, and a sulfur atom. The heteroaryl group is preferably a quinoline group, a benzothiazole group, or a naphthothiazol group, and is more preferably a benzothiazole group. The heteroaryl group may have a substituent or may be unsubstituted. Examples of the substituent include the above-described substituent T and a group represented by -$L^{100}$-$X^{100}$.

In Formula (10), two $R^{2'}$s may be the same as or different from each other, and two $R^{3'}$s may be the same as or different from each other.

In a case where $R^4$ represents an alkyl group, an aryl group, or a heteroaryl group, the alkyl group, the aryl group, and the heteroaryl group represented by $R^4$ have the same definitions and the same preferable ranges as those described regarding $R^{1a}$ and $R^{1b}$.

In a case where $R^4$ represents —$BR^{4A}R^{4B}$, $R^{4A}$ and $R^{4B}$ each independently represent a hydrogen atom or a substituent and may be bonded to each other to form a ring. Examples of the substituent represented by $R^{4A}$ and $R^{4B}$ include the above-described substituent T. In particular, a halogen atom, an alkyl group, an alkoxy group, an aryl group, or a heteroaryl group is preferable, an alkyl group, an aryl group, or a heteroaryl group is more preferable, and an aryl group is still more preferable. Specific examples of the group represented by —$BR^{4A}R^{4B}$ include a difluoroboron group, a diphenylboron group, a dibutylboron group, a dinaphthylboron group, and a catecholboron group. Among these, a diphenylboron group is preferable.

In a case where $R^4$ represents a metal atom, examples of the metal atom include magnesium, aluminum, calcium, barium, zinc, tin, vanadium, iron, cobalt, nickel, copper, palladium, iridium, platinum. In particular, aluminum, zinc, vanadium, iron, copper, palladium, iridium, or platinum is preferable.

$R^4$ may form a covalent bond or a coordinate bond with at least one selected from the group consisting of $R^{1a}$, $R^{1b}$, and $R^3$. In particular, it is preferable that $R^4$ and $R^3$ form a coordinate bond.

$R^4$ represents preferably a hydrogen atom or a group represented by —$BR^{4A}R^{4B}$ (in particular, a diphenylboron group) and more preferably a group represented by —$BR^{4A}R^{4B}$.

In Formula (10), two $R^{4'}$s may be the same as or different from each other.

It is preferable that the compound represented by Formula (10) is a compound represented by the following Formula (11).

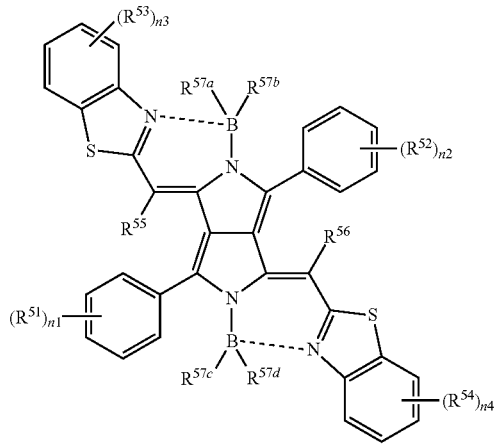

(11)

In Formula (11), $R^{51}$ to $R^{54}$ each independently represent a substituent.

$R^{55}$ and $R^{56}$ each independently represent a cyano group, an acyl group having 2 to 6 carbon atoms, an alkoxycarbonyl group having 2 to 6 carbon atoms, an alkylsulfonyl group having 1 to 10 carbon atoms, an arylsulfonyl group having 6 to 10 carbon atoms, or a nitrogen-containing heteroaryl group having 3 to 10 carbon atoms.

$R^{57a}$ to $R^{57d}$ each independently represent an alkyl group having 1 to 10 carbon atoms, an alkoxy group having 1 to 10 carbon atoms, an aryl group having 6 to 20 carbon atoms, or a heteroaryl group having 3 to 10 carbon atoms.

n1 and n2 each independently represent an integer of 0 to 5.

n3 and n4 each independently represent an integer of 0 to 4.

Examples of the substituent represented by $R^{51}$ and $R^{52}$ include the substituents described above regarding the substituent T.

$R^{51}$ and $R^{52}$ each independently represent preferably an alkyl group, an aryl group, an alkoxy group, an aryloxy group, a heteroaryloxy group, a halogen atom, or a cyano group, more preferably an alkoxy group or an aryloxy group, and still more preferably an alkoxy group.

The number of carbon atoms in the alkyl group is preferably 1 to 30 and more preferably 1 to 20. The alkyl group may be linear, branched, or cyclic and is preferably linear or branched.

The number of carbon atoms in the aryl group or the aryloxy group is preferably 6 to 30 and more preferably 6 to 20.

The number of carbon atoms in the alkoxy group is preferably 1 to 30 and more preferably 1 to 20. The alkoxy group is preferably linear or branched and more preferably branched.

A heteroaryl ring included in the heteroaryloxy group is preferably a 5-membered or 6-membered ring. The heteroaryl ring is preferably a monocycle or a fused ring, more preferably a monocycle or a fused ring composed of 2 to 8 rings, and still more preferably a monocycle or a fused ring composed of 2 to 4 rings. The number of heteroatoms constituting the heteroaryl ring is preferably 1 to 3 and more preferably 1 or 2. Examples of the heteroatom include a nitrogen atom, an oxygen atom, and a sulfur atom.

Examples of the substituent represented by $R^{53}$ and $R^{54}$ include the substituents described above regarding the substituent T.

$R^{53}$ and $R^{54}$ each independently represent preferably an alkyl group, an aryl group, an alkoxy group, an aryloxy group, a heteroaryloxy group, a halogen atom, or a cyano group.

$R^{55}$ and $R^{56}$ each independently represent a cyano group, an acyl group having 2 to 6 carbon atoms, an alkoxycarbonyl group having 2 to 6 carbon atoms, an alkylsulfonyl group having 1 to 10 carbon atoms, an arylsulfonyl group having 6 to 10 carbon atoms, or a nitrogen-containing heteroaryl group having 3 to 10 carbon atoms. Among these, a cyano group is preferable.

$R^{57a}$ to $R^{57d}$ each independently represent an alkyl group having 1 to 10 carbon atoms, an alkoxy group having 1 to 10 carbon atoms, an aryl group having 6 to 20 carbon atoms, or a heteroaryl group having 3 to 10 carbon atoms, preferably an alkyl group having 1 to 10 carbon atoms or an aryl group having 6 to 20 carbon atoms, more preferably an aryl group having 6 to 20 carbon atoms, and still more preferably a phenyl group.

n1 and n2 each independently represent an integer of 0 to 5, preferably 0 to 3, more preferably 0 to 2, and still more preferably 1. In a more preferable combination, n1 and n2 represent 1, and $R^{51}$ and $R^{52}$ represent an alkoxy group.

n3 and n4 each independently represent an integer of 0 to 4 and preferably 0 to 2.

Specific examples of the compound represented by Formula (11) include the following compounds. In addition, other specific examples of the pyrrolopyrrole compound include compounds described in paragraphs "0049" to "0058" of JP2009-263614A.

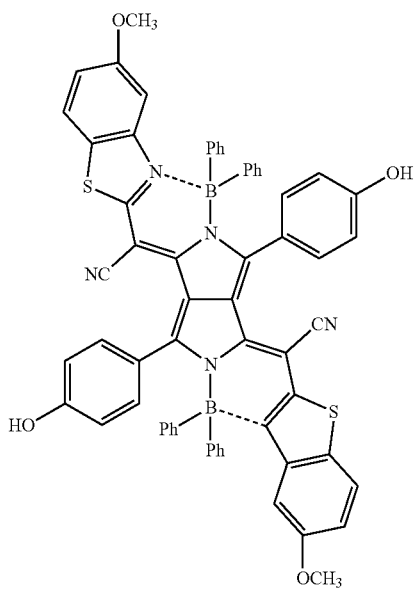

-continued

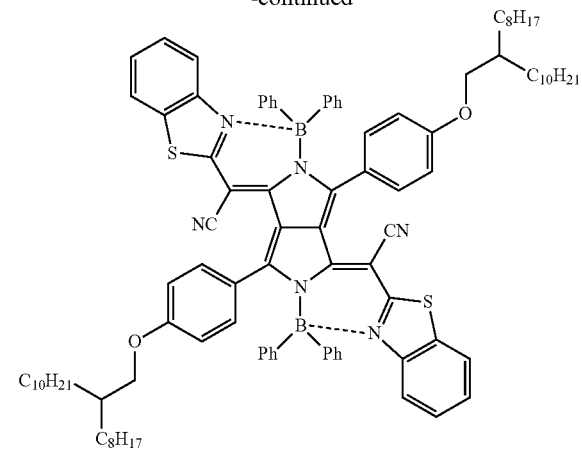

In the composition according to the embodiment of the present invention, the content of the compound having an absorption maximum in a wavelength range of longer than 700 nm and 900 nm or shorter is preferably 1 to 30 mass % with respect to the total solid content of the composition. The upper limit is more preferably 20 mass % or lower, and still more preferably 15 mass % or lower. The lower limit is preferably 2 mass % or higher and more preferably 3 mass % or higher.

The total content of the compound having an absorption maximum in a wavelength range of longer than 700 nm and 900 nm or shorter and the compound having an absorption maximum in a wavelength range of longer than 900 nm and 1000 nm or shorter is preferably 1 to 30 mass % with respect to the total solid content of the composition. The upper limit is more preferably 25 mass % or lower, and still more preferably 20 mass % or lower. The lower limit is preferably 3 mass % or higher and more preferably 5 mass % or higher.

The total content of the compound having an absorption maximum in a wavelength range of longer than 700 nm and 900 nm or shorter or shorter and the coloring material that shields visible light is preferably 15 to 45 mass % with respect to the total solid content of the composition. The upper limit is more preferably 40 mass % or lower, and still more preferably 35 mass % or lower. The lower limit is preferably 18 mass % or higher and more preferably 20 mass % or higher.

The content of the compound having an absorption maximum in a wavelength range of longer than 700 nm and 900 nm or shorter is preferably 1 to 40 mass % with respect to the total content of the infrared absorber and the coloring material that shields visible light. The upper limit is more preferably 38 mass % or lower, and still more preferably 35 mass % or lower. The lower limit is preferably 3 mass % or higher and more preferably 5 mass % or higher.

<<Resin>>

In addition, the composition according to the embodiment of the present invention includes a resin. The resin is mixed, for example, in order to disperse particles of the pigments and the like in the composition or to be added as a binder. The resin which is mainly used to disperse the pigments and the like will also be called a dispersant. However, the above-described uses of the resin are merely exemplary, and the resin can be used for purposes other than the uses.

The weight-average molecular weight (Mw) of the resin is preferably 2000 to 2000000. The upper limit is more preferably 1000000 or lower and still more preferably 500000 or lower. The lower limit is more preferably 3000 or higher and still more preferably 5000 or higher.

The content of the resin is preferably 10 to 80 mass % and more preferably 20 to 60 mass % with respect to the total solid content of the composition. The composition may include one resin or two or more resins. In a case where the composition includes two or more resins, it is preferable that the total content of the two or more resins is in the above-described range.

(Dispersant)

The composition according to the embodiment of the present invention may include a dispersant as a resin.

Examples of the dispersant include: a polymer dispersant such as a resin having an amine group (polyamideamine or a salt thereof), an oligo imine resin, a polycarboxylic acid or a salt thereof, a high-molecular-weight unsaturated acid ester, a modified polyurethane, a modified polyester, a modified poly(meth)acrylate, a (meth)acrylic copolymer, or a naphthalene sulfonic acid formalin condensate.

In terms of a structure, the polymer dispersant can be further classified into a linear polymer, a terminal-modified polymer, a graft polymer, and a block polymer.

As the polymer dispersant, a resin having an acid value of 60 mgKOH/g or higher (more preferably 60 mgKOH/g or higher and 300 mgKOH/g or lower) can be preferably used.

Examples of the terminal-modified polymer include a polymer having a phosphate group at a terminal thereof described in JP1991-112992A (JP-H3-112992A) or JP2003-533455A, a polymer having a sulfo group at a terminal thereof described in JP2002-273191A, and a polymer having a partial skeleton or a heterocycle of an organic colorant described in JP1997-077994A (JP-H9-077994A). In addition, polymers described in JP2007-277514A in which two or more anchor sites (for example, an acid group, a basic group, a partial skeleton or a heterocycle of an organic colorant) to a pigment surface are introduced into a terminal thereof are also preferable due to its dispersion stability.

Examples of the block polymer include a block polymer described in JP2003-049110A or JP2009-052010A.

Examples of the graft polymer include a reaction product of poly(low-alkylene imine) and polyester described in JP1979-037082A (JP-S54-037082A), JP1996-507960A (JP-H8-507960A), or JP2009-258668A, a reaction product of polyallylamine and polyester described in JP1997-169821A (JP-H9-169821A), a copolymer of a macromonomer and a monomer having a nitrogen-containing group described in JP1998-339949A (JP-H10-339949A) or JP2004-037986A, a graft polymer having a partial skeleton or a heterocycle of an organic colorant described in JP2003-238837A, JP2008-009426A, or JP2008-081732A, and a copolymer of a macromonomer and an acid group-containing monomer described in JP2010-106268A.

As the resin (dispersant), a graft copolymer including a repeating unit represented by any one of the following Formulae (111) to (114) can also be used.

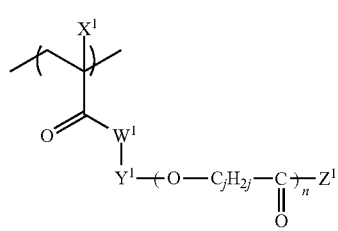

(111)

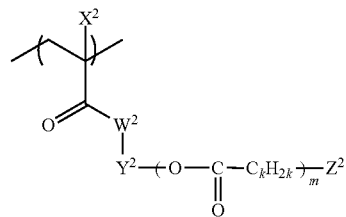

(112)

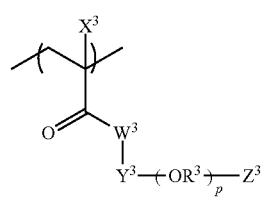

(113)

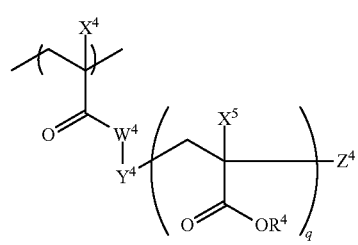

(114)

In Formulae (111) to (114), $W^1$, $W^2$, $W^3$, and $W^4$ each independently represent an oxygen atom or NH, $X^1$, $X^2$, $X^3$, $X^4$, and $X^5$ each independently represent a hydrogen atom or a monovalent group, $Y^1$, $Y^2$, $Y^3$, and $Y^4$ each independently represent a divalent linking group, $Z^1$, $Z^2$, $Z^3$, and $Z^4$ each independently represent a monovalent group, $R^3$ represents an alkylene group, $R^4$ represents a hydrogen atom or a monovalent group, n, m, p, and q each independently represent an integer of 1 to 500, and j and k each independently represent an integer of 2 to 8. In Formula (113), in a case where p represents 2 to 500, a plurality of $R^{3'}$ s may be the same as or different from each other. In Formula (114), in a case where q represents 2 to 500, a plurality of $X^{5'}$ s and a plurality of $R^{4'}$ s may be the same as or different from each other.

The details of the graft copolymer can be found in the description of paragraphs "0025" to "0094" of JP2012-255128A, the content of which is incorporated herein by reference. Specific examples of the graft copolymer include the following resins. In the following resins, a numerical value added to a main chain represents a molar ratio, and a numerical value added to a side chain represents the number of repeating units. Other examples of the resin include a resin described in paragraphs "0072" to "0094" of JP2012-255128A, the content of which is incorporated herein by reference.

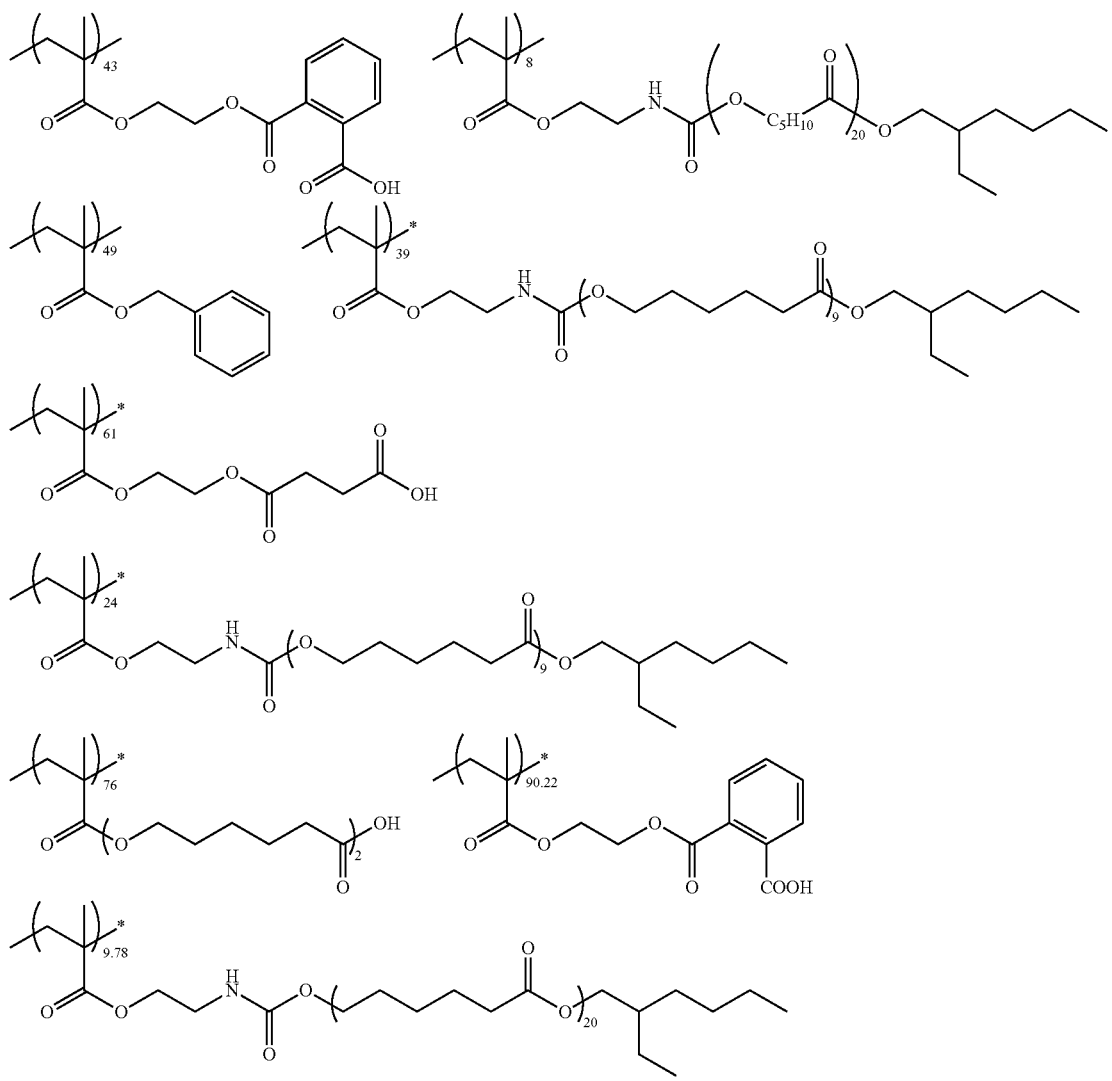

As the resin, an oligoimine dispersant having a nitrogen atom at at least either a main chain or a side chain can be used. As the oligoimine dispersant, a resin, which includes a structural unit having a partial structure X with a functional group (pKa: 14 or lower) and a side chain Y having 40 to 10000 atoms and has a basic nitrogen atom at at least either a main chain or a side chain, is preferable. The basic nitrogen atom is not particularly limited as long as it is a nitrogen atom exhibiting basicity.

Examples of the oligoimine dispersant include a dispersant including a structural unit represented by the following Formula (I-1), a structural unit represented by the following Formula (I-2), and/or a structural unit represented by the following Formula (I-2a).

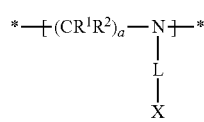
(I-1)

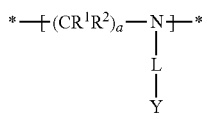
(I-2)

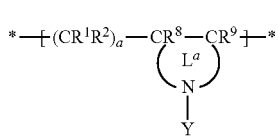
(I-2a)

$R^1$ and $R^2$ each independently represent a hydrogen atom, a halogen atom, or an alkyl group (having preferably 1 to 6 carbon atoms). a's each independently represent an integer of 1 to 5. * represents a linking portion between structural units.

$R^8$ and $R^9$ represent the same group as that of $R^1$.

L represents a single bond, an alkylene group (having preferably 1 to 6 carbon atoms), an alkenylene group (having preferably 2 to 6 carbon atoms), an arylene group (having preferably 6 to 24 carbon atoms), an heteroarylene group (having preferably 1 to 6 carbon atoms), an imino group (having preferably 0 to 6 carbon atoms), an ether group, a thioether group, a carbonyl group, or a linking group of a combination of the above-described groups. Among these, a single bond or —$CR^5R^6NR^7$— (an imino group is present at the X or Y site) is preferable. Here, $R^5$ and $R^6$ each independently represent a hydrogen atom, a halogen atom, or an alkyl group (having preferably 1 to 6 carbon atoms). $R^7$ represents a hydrogen atom or an alkyl group having 1 to 6 carbon atoms.

$L^a$ is a structural unit which forms a ring structure with $CR^8CR^9$ and N and preferably a structural unit which forms a nonaromatic heterocycle having 3 to 7 carbon atoms with a carbon atom of $CR^8CR^9$, more preferably a structural unit which forms a nonaromatic 5- to 7-membered heterocycle with a carbon atom of $CR^8CR^9$ and N (nitrogen atom), still more preferably a structural unit which forms a nonaromatic 5-membered heterocycle with $CR^8CR^9$ and N, and even still more preferably a structural unit which forms pyrrolidine with $CR^8CR^9$ and N. This structural unit may have a substituent such as an alkyl group.

X represents a group having a functional group (pKa: 14 or lower).

Y represents a side chain having 40 to 10000 atoms.

The dispersant (oligoimine dispersant) may further include one or more copolymerization components selected from the group consisting of the structural units represented by Formulae (I-3), (I-4), and (I-5). By the dispersant including the above-described structural units, the dispersion performance can be further improved.

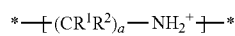

(I-3)

(I-4)

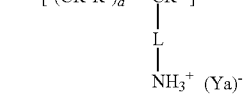

(I-5)

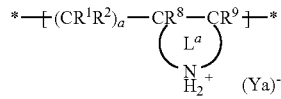

$R^1$, $R^2$, $R^8$, $R^9$, L, $L^a$, a, and * have the same definitions as those in Formulae (I-1), (I-2), and (I-2a).

Ya represents a side chain having 40 to 10000 atoms which has an anionic group. The structural unit represented by Formula (I-3) can be formed by adding an oligomer or a polymer having a group, which reacts with amine to form a salt, to a resin having a primary or secondary amino group at a main chain such that they react with each other.

The oligoimine dispersant can be found in the description of paragraphs "0102" to "0166" of JP2012-255128A, the content of which is incorporated herein by reference.

Specific examples of the oligoimine dispersant are as follows. In the following resins, a numerical value added to a main chain represents a molar ratio, and a numerical value added to a side chain represents the number of repeating units. In addition, a resin described in paragraphs "0168" to "0174" of JP2012-255128A can be used.

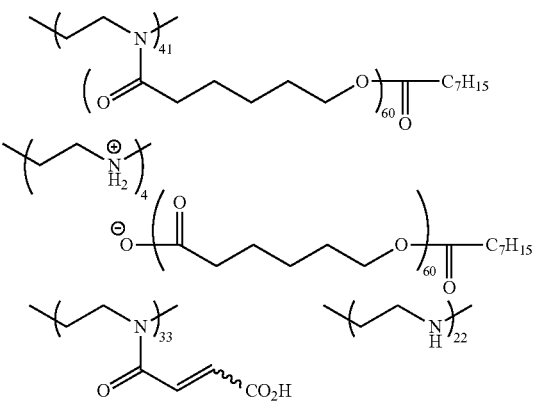

As the resin, a resin including a structural unit represented by the following Formula (P1) can be used. By using the following resin, the dispersibility of the infrared absorber (in particular, a pyrrolopyrrole colorant compound) can be further improved.

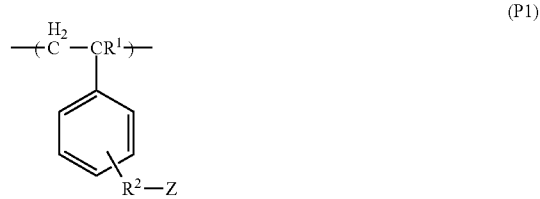

(P1)

In Formula (P1), $R^1$ represents a hydrogen atom or a methyl group, $R^2$ represents an alkylene group, and Z represents a nitrogen-containing heterocyclic structure.

The alkylene group represented by $R^2$ is not particularly limited, and examples thereof include a methylene group, an ethylene group, a trimethylene group, a tetramethylene group, a hexamethylene group, a 2-hydroxypropylene group, a methyleneoxy group, an ethyleneoxy group, a methyleneoxycarbonyl group, and a methylenethio group. Among these, a methylene group, a methyleneoxy group, a methyleneoxycarbonyl group, or a methylenethio group is more preferable.

Examples of the nitrogen-containing heterocyclic structure represented by Z include a pyridine structure, a pyrazine structure, a pyrimidine structure, a pyrrole structure, an imidazole structure, a triazole structure, a tetrazole structure, an indole structure, a quinoline structure, an acridine structure, a phenothiazine structure, a phenoxazine structure, an acridone structure, a benzimidazole structure, a benzotriazole structure, a benzothiazole structure, a cyclic amide structure, a cyclic urea structure, or a cyclic imide structure.

The resin including the structural unit represented by Formula (P1) may further include the structural unit represented by any one of Formulae (111) to (114) of the resin. The resin including the structural unit represented by Formula (P1) may further the structural unit represented by any one of Formulae (I-1), (I-2), (I-2a), (I-3), (I-4), and (I-5) of the resin.

The resin is available as a commercially available product, and specific example thereof include Disperbyk-111 (manufactured by BYK Chemie). A pigment dispersant described in paragraphs "0041" to "0130" of JP2014-130338A can also be used, the content of which is incorporated herein by reference.

The content of the dispersant is preferably 0.1 to 40 mass % with respect to the total solid content of the composition. The upper limit is more preferably 20 mass % or lower and still more preferably 10 mass % or lower. The lower limit is more preferably 0.5 mass % or higher and still more preferably 1 mass % or higher.

The content of the dispersant is preferably 1 to 100 parts by mass with respect to 100 parts by mass of the pigment. The upper limit is more preferably 80 parts by mass or less and still more preferably 60 parts by mass or less. The lower limit is more preferably 2.5 parts by mass or more and still more preferably 5 parts by mass or more.

(Alkali-Soluble Resin)

It is preferable that the composition according to the embodiment of the present invention includes an alkali-soluble resin as a resin. By the composition including the alkali-soluble resin, developability and pattern formability is improved. The alkali-soluble resin can also be used as the dispersant or the binder.

The molecular weight of the alkali-soluble resin is not particularly limited, and the weight-average molecular weight (Mw) thereof is preferably 5000 to 100000. The number-average molecular weight (Mn) of the alkali-soluble resin is preferably 1000 to 20000.

The alkali-soluble resin can be appropriately selected among resins having a group for accelerating alkali dissolution. Examples of the group for promoting alkali dissolution (hereinafter, also referred to as the acid group) include a carboxy group, a phosphate group, a sulfo group, and a phenolic hydroxy group. Among these, a carboxy group is preferable. Among these acid groups, one kind may be used alone, or two or more kinds may be used in combination.

From the viewpoint of heat resistance, as the alkali-soluble resin, a polyhydroxystyrene resin, a polysiloxane resin, an acrylic resin, an acrylamide resin, or an acryl/acrylamide copolymer resin is preferable. From the viewpoint of controlling developability, an acrylic resin, an acrylamide resin, or an acryl/acrylamide copolymer resin is preferable.

As the alkali-soluble resin, a polymer having a carboxy group at a side chain is preferable. Specific examples of the alkali-soluble resin include an alkali-soluble phenol resin such as a methacrylic acid copolymer, an acrylic acid copolymer, an itaconic acid copolymer, a crotonic acid copolymer, a maleic acid copolymer, a partially esterified maleic acid copolymer, or a novolac resin, an acidic cellulose derivative having a carboxy group at a side chain thereof, and a resin obtained by adding an acid anhydride to a polymer having a hydroxy group. In particular, a copolymer of (meth)acrylic acid and another monomer which is copolymerizable with the (meth)acrylic acid is preferable as the alkali-soluble resin. Examples of the monomer which is copolymerizable with the (meth)acrylic acid include an alkyl (meth)acrylate, an aryl (meth)acrylate, and a vinyl compound. Examples of the alkyl (meth)acrylate and the aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, and cyclohexyl (meth)acrylate. Examples of the vinyl compound include styrene, ε-methylstyrene, vinyl toluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. Examples of other monomers include a N-position-substituted maleimide monomer copolymer described in JP1998-300922A (JP-H10-300922A) such as N-phenylmaleimide or N-cyclohexylmaleimide. Among these monomers which are copolymerizable with the (meth)acrylic acid, one kind may be used alone, or two or more kinds may be used in combination.

In order to improve a crosslinking effect of the film, an alkali-soluble resin having a polymerizable group may be used. Examples of the polymerizable group include a (meth)allyl group and a (meth)acryloyl group. As the alkali-soluble resin having a polymerizable group, an alkali-soluble resin having a polymerizable group at a side chain thereof is preferable.

Examples of the alkali-soluble resin having a polymerizable group include DIANAL NR series (manufactured by Mitsubishi Rayon Co., Ltd.), PHOTOMER 6173 (a COOH-containing polyurethane acrylic oligomer; manufactured by Diamond Shamrock Co., Ltd.), VISCOAT R-264 and KS Resist 106 (both of which are manufactured by Osaka Organic Chemical Industry Ltd.), CYCLOMER-P series (for example, ACA230AA) and PLAKCEL CF200 series (both of which manufactured by Daicel Corporation), EBECRYL 3800 (manufactured by Daicel-UCB Co., Ltd.), and ACRYCURE RD-F8 (manufactured by Nippon Shokubai Co., Ltd.).

As the alkali-soluble resin, a copolymer including benzyl (meth)acrylate and (meth)acrylic acid; a copolymer including benzyl (meth)acrylate, (meth)acrylic acid, and 2-hydroxyethyl (meth)acrylate; or a multi-component copolymer including benzyl (meth)acrylate, (meth)acrylic acid, and another monomer can be preferably used. Copolymers described in JP1995-140654A (JP-H7-140654A) obtained by copolymerization of 2-hydroxyethyl (meth)acrylate can be preferably used, and examples thereof include: a copolymer including 2-hydroxypropyl (meth)acrylate, a polystyrene macromonomer, benzyl methacrylate, and methacrylic acid; a copolymer including 2-hydroxy-3-phenoxypropyl acrylate, a polymethyl methacrylate macromonomer, benzyl methacrylate, and methacrylic acid; a copolymer including 2-hydroxyethyl methacrylate, a polystyrene macromonomer, methyl methacrylate, and methacrylic acid; or a copolymer including 2-hydroxyethyl methacrylate, a polystyrene macromonomer, benzyl methacrylate, and methacrylic acid.

As the alkali-soluble resin, a polymer obtained by copolymerization of monomer components including a compound represented by the following Formula (ED1) and/or a compound represented by the following Formula (ED2) (hereinafter, these compounds will also be referred to as "ether dimer") is also preferable.

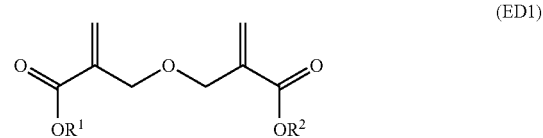

(ED1)

In Formula (ED1), $R^1$ and $R^2$ each independently represent a hydrogen atom or a hydrocarbon group having 1 to 25 carbon atoms which may have a substituent.

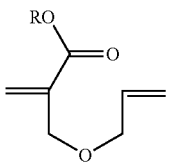

(ED2)

In Formula (ED2), R represents a hydrogen atom or an organic group having 1 to 30 carbon atoms. Specific examples of Formula (ED2) can be found in the description of JP2010-168539A.

The hydrocarbon group having 1 to 25 carbon atoms represented by $R^1$ and $R^2$ in Formula (ED1) which may have a substituent is not particularly limited, and examples thereof include a linear or branched alkyl group such as methyl, ethyl, n-propyl, isopropyl, n-butyl, isobutyl, tert-butyl, tert-amyl, stearyl, lauryl, or 2-ethylhexyl; an aryl group such as phenyl; an alicyclic group such as cyclohexyl, tert-butylcyclohexyl, dicyclopentadienyl, tricyclodecanyl, isobornyl, adamantyl, or 2-methyl-2-adamantyl; an alkyl group substituted with an alkoxy group such as 1-methoxyethyl or 1-ethoxyethyl; and an alkyl group substituted with an aryl group such as benzyl. Among these, a primary or secondary carbon substituent which is not likely to leave due to an acid or heat, for example, methyl, ethyl, cyclohexyl, or benzyl is preferable from the viewpoint of heat resistance.

Specific examples of the ether dimer can be found in paragraph "0317" of JP2013-029760A, the content of which is incorporated herein by reference. Among these ether dimers, one kind may be used alone, or two or more kinds may be used in combination.

The alkali-soluble resin may include a structural unit which is derived from a compound represented by the following Formula (X).

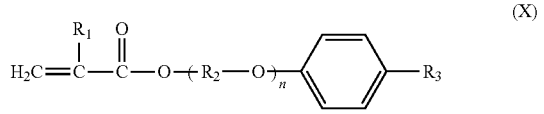

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms which may have a benzene ring. n represents an integer of 1 to 15.

In Formula (X), the number of carbon atoms in the alkylene group of $R_2$ is preferably 2 to 3. The number of carbon atoms in the alkyl group of $R_3$ is preferably 1 to 20 and more preferably 1 to 10, and the alkyl group of $R_3$ may have a benzene ring. Examples of the alkyl group having a benzene ring represented by $R_3$ include a benzyl group and a 2-phenyl(iso)propyl group.

Specific examples of the alkali-soluble resin are as follows. In the following resins, a numerical value added to a main chain represents a molar ratio.

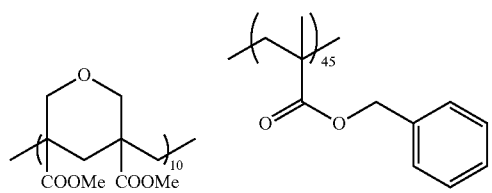

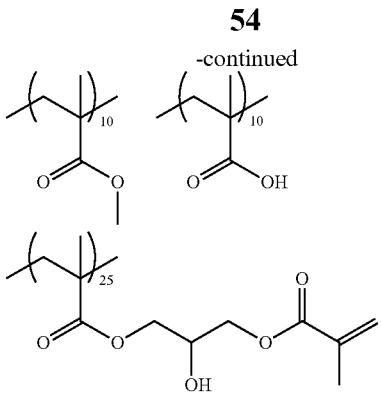

The details of the alkali-soluble resin can be found in paragraphs "0558" to "0571" of JP2012-208494A (corresponding to paragraphs "0685" to "0700" of US2012/0235099A), the content of which is incorporated herein by reference. Further, a copolymer (B) described in paragraphs "0029" to "0063" and an alkali-soluble resin used in Examples of JP2012-032767A, a binder resin described in paragraphs "0088" to "0098" and a binder resin used in Examples of JP2012-208474A, a binder resin described in paragraphs "0022" to "0032" and a binder resin used in Examples of JP2012-137531A, a binder resin described in paragraphs "0132" to "0143" and a binder resin used in Examples of JP2013-024934A, a binder resin described in paragraphs "0092" to "0098" and a binder resin described in Examples of JP2011-242752A, or a binder resin described in paragraphs "0030" to "0072" of JP2012-032770A can also be used. The content of which is incorporated herein by reference.

The acid value of the alkali-soluble resin is preferably 30 to 500 mgKOH/g. The lower limit is more preferably 50 mgKOH/g or higher and still more preferably 70 mgKOH/g or higher. The upper limit is more preferably 400 mgKOH/g or lower, still more preferably 200 mgKOH/g or lower, even still more preferably 150 mgKOH/g or lower, and even yet still more preferably 120 mgKOH/g or lower.

The content of the alkali-soluble resin is preferably 0.1 to 20 mass % with respect to the total solid content of the composition. The lower limit is more preferably 0.5 mass % or higher, still more preferably 1 mass % or higher, even still more preferably 2 mass % or higher, and even yet still more preferably 3 mass % or higher. The upper limit is more preferably 12 mass % or lower, and still more preferably 10 mass % or lower. The composition according to the embodiment of the present invention may include one alkali-soluble resin or two or more alkali-soluble resins. In a case where the composition includes two or more alkali-soluble resins, it is preferable that the total content of the two or more alkali-soluble resins is in the above-described range.

(Other Resins)

As the resin, the composition according to the embodiment of the present invention may include resins (also referred to as "other resins") other than the dispersant or the alkali-soluble resin. Examples of the other resins include a (meth)acrylic resin, a (meth)acrylamide resin, an enethiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamide imide resin, a polyolefin resin, a cyclic olefin resin, a polyester resin, a styrene resin, a siloxane resin, and an epoxy resin.

Examples of the epoxy resin include an epoxy resin which is a glycidyl-etherified product of a phenol compound, an epoxy resin which is a glycidyl-etherified product of various novolac resins, an alicyclic epoxy resin, an aliphatic epoxy resin, a heterocyclic epoxy resin, a glycidyl ester epoxy resin, a glycidyl amine epoxy resin, an epoxy resin which is a glycidylated product of a halogenated phenol, a condensate of a silicon compound having an epoxy group and another silicon compound, and a copolymer of a polymerizable unsaturated compound having an epoxy group and another polymerizable unsaturated compound.

Examples of the epoxy resin which is a glycidyl-etherified product of a phenol compound include: 2-[4-(2,3-epoxypropoxy)phenyl]-2-[4-[1,1-bis[4-(2,3-hydroxy)phenyl]ethyl]phenyl]propane, bisphenol A, bisphenol F, bisphenol S, 4,4'-biphenol, tetramethyl bisphenol A, dimethyl bisphenol A, tetramethyl bisphenol F, dimethyl bisphenol F, tetramethyl bisphenol S, dimethyl bisphenol S, tetramethyl-4,4'-biphenol, dimethyl-4,4'-biphenol, 1-(4-hydroxyphenyl)-2-[4-(1,1-bis-(4-hydroxyphenyl)ethyl)phenyl]propane, 2,2'-methylene-bis(4-methyl-6-t-butylphenol), 4,4'-butylidene-bis(3-methyl-6-t-butylphenol), trishydroxyphenylmethane, resorcinol, hydroquinone, pyrogallol, phloroglucinol, a phenol having a diisopropylidene skeleton; a phenol having a fluorene skeleton such as 1,1-di-4-hydroxyphenyl fluorene; and an epoxy resin which is a glycidyl-etherified product of a polyphenol compound, such as phenolic polybutadiene.

Examples of the epoxy resin which is a glycidyl-etherified product of a novolac resin include glycidyl-etherified products of various novolac resins including: novolac resins which contain various phenols, for example, phenol, cresols, ethyl phenols, butyl phenols, octyl phenols, bisphenols such as bisphenol A, bisphenol F, or bisphenol S, or naphthols; phenol novolac resins having a xylylene skeleton; phenol novolac resins having a xylylene skeleton; phenol novolac resins having a biphenyl skeleton; or phenol novolac resins having a fluorene skeleton.

Examples of the alicyclic epoxy resin include an alicyclic epoxy resin having an aliphatic ring skeleton such as 3,4-epoxycyclohexylmethyl-(3,4-epoxy)cyclohexylcarboxylate or bis(3,4-epoxycyclohexylmethyl)adipate.

Examples of the aliphatic epoxy resin include glycidyl ethers of polyhydric alcohols such as 1,4-butanediol, 1,6-hexanediol, polyethylene glycol, or pentaerythritol.

Examples of the heterocyclic epoxy resin include an heterocyclic epoxy resin having a heterocycle such as an isocyanuric ring or a hydantoin ring.

Examples of the glycidyl ester epoxy resin include an epoxy resin including a carboxylic acid ester such as hexahydrophthalic acid diglycidyl ester.

Examples of the glycidyl amine epoxy resin include an epoxy resin which is a glycidylated product of an amine such as aniline or toluidine.

Examples of the epoxy resin which is a glycidylated product of a halogenated phenol include an epoxy resin which is a glycidylated product of a halogenated phenol such as brominated bisphenol A, brominated bisphenol F, brominated bisphenol S, brominated phenol novolac, brominated cresol novolac, chlorinated bisphenol S, or chlorinated bisphenol A.

Examples of a commercially available product of the copolymer of a polymerizable unsaturated compound having an epoxy group and another polymerizable unsaturated compound include MARPROOF G-0150M, G-0105SA, G-0130SP, G-0250SP, G-1005S, G-1005SA, G-1010S, G-2050M, G-01100, and G-01758 (all of which are manufactured by NOF Corporation). Examples of the polymerizable unsaturated compound having an epoxy group include glycidyl acrylate, glycidyl methacrylate, and 4-vinyl-1-cyclohexene-1,2-epoxide. In addition, examples of a copolymer of the other polymerizable unsaturated compound include methyl (meth)acrylate, benzyl (meth)acrylate, cyclohexyl (meth)acrylate, styrene, and vinyl cyclohexane. Among these, methyl (meth)acrylate, benzyl (meth)acrylate, or styrene is preferable.

The epoxy equivalent of the epoxy resin is preferably 310 to 3300 g/eq, more preferably 310 to 1700 g/eq, and still more preferably 310 to 1000 g/eq. As the epoxy resin, one kind may be used alone, or a mixture of two or more kinds may be used.

As the epoxy resin, a commercially available product can also be used. Examples of the commercially available product include the following epoxy resins. Examples of the bisphenol A epoxy resin include jER827, jER828, jER834, jER1001, jER1002, jER1003, jER1055, jER1007, jER1009, and jER1010 (all of which are manufactured by Mitsubishi Chemical Corporation) and EPICLON860, EPICLON1050, EPICLON1051, and EPICLON1055 (all of which are manufactured by DIC Corporation). Examples of the bisphenol F epoxy resin include jER806, jER807, jER4004, jER4005, jER4007, and jER4010 (all of which are manufactured by Mitsubishi Chemical Corporation), EPICLON830 and EPICLON835 (all of which are manufactured by DIC Corporation), and LCE-21 and RE-602S (all of which are manufactured by Nippon Kayaku Co., Ltd.). Examples of the phenol novolac epoxy resin include jER152, jER154, jER157S70, and jER157S65 (all of which are manufactured by Mitsubishi Chemical Corporation) and EPICLON N-740, EPICLON N-770, and EPICLON N-775 (all of which are manufactured by DIC Corporation). Examples of the cresol novolac epoxy resin include EPICLON N-660, EPICLON N-665, EPICLON N-670, EPICLON N-673, EPICLON N-680, EPICLON N-690, and EPICLON N-695 (all of which are manufactured by DIC Corporation) and EOCN-1020 (manufactured by Nippon Kayaku Co., Ltd.). Examples of the aliphatic epoxy resin include ADEKA RESIN EP-4080S, ADEKA RESIN EP-4085S, and ADEKA RESIN EP-4088S (all of which are manufactured by Adeka Corporation), CELLOXIDE 2021P, CELLOXIDE 2081, CELLOXIDE 2083, CELLOXIDE 2085, EHPE3150, EPO-LEAD PB 3600, and EPOLEAD PB 4700 (all of which are manufactured by Daicel Corporation), and DENACOL EX-212L, DENACOL EX-214L, DENACOL EX-216L, DENACOL EX-321L, and DENACOL EX-850L (all of which are manufactured by Nagase ChemteX Corporation). Other examples of the commercially available product include ADEKA RESIN EP-4000S, ADEKA RESIN EP-4003S, ADEKA RESIN EP-4010S, and ADEKA RESIN EP-4011S (all of which are manufactured by Adeka Corporation), NC-2000, NC-3000, NC-7300, XD-1000, EPPN-501, and EPPN-502 (all of which are manufactured by Adeka Corporation), and jER1031S (manufactured by Mitsubishi Chemical Corporation).

The content of the epoxy resin is preferably 1 to 30 mass % with respect to the total solid content of the composition. The lower limit is preferably 2 mass % or higher and more preferably 3 mass % or higher. The upper limit is more preferably 25 mass % or lower, and still more preferably 20 mass % or lower. The composition according to the embodiment of the present invention may include one epoxy resin or two or more epoxy resins. In a case where the composition includes two or more epoxy resins, it is preferable that the total content of the two or more epoxy resins is in the above-described range.

<<Pigment Derivative>>

The composition according to the embodiment of the present invention may include a pigment derivative. Examples of the pigment derivative include a compound having a structure in which a portion of a pigment is substituted with an acidic group, a basic group, or a phthalimidomethyl group. It is preferable that the pigment derivative has an acidic group or a basic group from the viewpoints of dispersibility and dispersion stability.

Examples of an organic pigment for forming the pigment derivative include a pyrrolopyrrole pigment, a diketo pyrrolo pyrrole pigment, an azo pigment, a phthalocyanine pigment, an anthraquinone pigment, a quinacridone pigment, a dioxazine pigment, a perinone pigment, a perylene pigment, a thioindigo pigment, an isoindoline pigment, an isoindolinone pigment, a quinophthalone pigment, a threne pigment, and a metal complex pigment.

As the acidic group included in the pigment derivative, a sulfonic acid, a carboxylic acid, or a quaternary ammonium salt thereof is preferable, a carboxy group or a sulfo group is more preferable, and a sulfo group is still more preferable. As the basic group included in the pigment derivative, an amino group is preferable, and a tertiary amino group is more preferable.

As the pigment derivative, a pyrrolopyrrole pigment derivative, a quinoline pigment derivative, a benzimidazolone pigment derivative, or an isoindoline pigment derivative, is preferable, and a pyrrolopyrrole pigment derivative is more preferable.

The content of the pigment derivative is preferably 1 to 50 mass % and more preferably 3 to 30 mass % with respect to the total mass of the pigments. Among these pigment derivatives, one kind may be used alone, or two or more kinds may be used in combination. In a case where the composition includes two or more pigment derivatives, it is preferable that the total content of the two or more pigment derivatives is in the above-described range.

<<Polymerizable Compounds>>

It is preferable that the composition according to the embodiment of the present invention includes a polymerizable compound. As the polymerizable compound, a compound that is polymerizable by the action of a radical is preferable. That is, it is preferable that the polymerizable compound is a radically polymerizable compound. As the polymerizable compound, a compound having one or more groups having an ethylenically unsaturated bond is preferable, a compound having two or more groups having an ethylenically unsaturated bond is more preferable, and a compound having three or more groups having an ethylenically unsaturated bond is still more preferable. The upper limit of the number of the groups having an ethylenically unsaturated bond is, for example, preferably 15 or less and more preferably 6 or less. Examples of the group having an ethylenically unsaturated bond include a vinyl group, a styryl group, a (meth)allyl group, and a (meth)acryloyl group. Among these, a (meth)acryloyl group is preferable. The polymerizable compound is preferably a (meth)acrylate compound having 3 to 15 functional groups and more preferably a (meth)acrylate compound having 3 to 6 functional groups.

Examples of the polymerizable compound can be found in paragraphs "0033" and "0034" of JP2013-253224A, the content of which is incorporated herein by reference. As the compound, ethyleneoxy-modified pentaerythritol tetraacrylate (as a commercially available product, NK ESTER ATM-35E manufactured by Shin-Nakamura Chemical Co., Ltd.), dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta (meth)acrylate (as a commercially available product, KAYARAD D-310 manufactured by Nippon Kayaku Co., Ltd.), dipentaerythritol hexa(meth)acrylate (as a commercially available product, KAYARAD DPHA manufactured by Nippon Kayaku Co., Ltd., A-DPH-12E, manufactured by Shin-Nakamura Chemical Co., Ltd.), or a structure in which the (meth)acryloyl group is bonded through an ethylene glycol or a propylene glycol residue is preferable. Oligomers of the above-described examples can be used. The compound having an ethylenically unsaturated bond can be found in the description of a polymerizable compound in paragraphs "0034" to "0038" of JP2013-253224A, the content of which is incorporated herein by reference. Examples of the compound having an ethylenically unsaturated bond include a polymerizable monomer in paragraph "0477" of JP2012-208494A (corresponding to paragraph "0585" of US2012/0235099A), the content of which is incorporated herein by reference.

Diglycerin ethylene oxide (EO)-modified (meth)acrylate (as a commercially available product, M-460 manufactured by Toagosei Co., Ltd.) is preferable. Pentaerythritol tetraacrylate (A-TMMT manufactured by Shin-Nakamura Chemical Co., Ltd.) or 1,6-hexanediol diacrylate (KAYARAD HDDA manufactured by Nippon Kayaku Co., Ltd.) is also preferable. Oligomers of the above-described examples can be used. For examples, RP-1040 (manufactured by Nippon Kayaku Co., Ltd.) is used.

The polymerizable compound may have an acid group such as a carboxy group, a sulfo group, or a phosphate group. As the polymerizable compound having an acid group, an ester of an aliphatic polyhydroxy compound and an unsaturated carboxylic acid is preferable, a polymerizable compound to which an acid group is added by causing a nonaromatic carboxylic anhydride to react with an unreacted hydroxy group of an aliphatic polyhydroxy compound is more preferable, and a compound in which the aliphatic polyhydroxy compound in the above-described ester is at least one of pentaerythritol or dipentaerythritol is still more preferable. Examples of a commercially available product of the polymerizable compound having an acid group include: ARONIX M-510 and M-520 (manufactured by Toagosei Co., Ltd.); and CBX-0 and CBX-1 (manufactured by Shin-Nakamura Chemical Co., Ltd.). The acid value of the polymerizable compound having an acid group is preferably 0.1 to 40 mgKOH/g. The lower limit is more preferably 5 mgKOH/g or higher. The upper limit is more preferably 30 mgKOH/g or lower. In a case where the acid value of the polymerizable compound is 0.1 mgKOH/g or higher, development solubility is excellent. In a case where the acid value of the polymerizable compound is 40 mgKOH/g or lower, there are advantageous effects in manufacturing and handleability. Further, curing properties are excellent.

In addition, a compound having a caprolactone structure is also preferable as the polymerizable compound.

The compound having a caprolactone structure is not particularly limited as long as it has a caprolactone structure in the molecule thereof, and examples thereof include ε-caprolactone-modified polyfunctional (meth)acrylate obtained by esterification of a polyhydric alcohol, (meth) acrylic acid, and ε-caprolactone, the polyhydric alcohol being, for example, trimethylolethane, ditrimethylolethane, trimethylolpropane, ditrimethylolpropane, pentaerythritol, dipentaerythritol, tripentaerythritol, glycerin, diglycerol, or trimethylolmelamine. Examples of the compound having a caprolactone structure can be found in paragraphs "0153" to "0170" of WO2015/166779A, the content of which is incorporated herein by reference. Examples of a commercially available product of the compound having a caprolactone structure include SR-494 (manufactured Sartomer) which is a tetrafunctional acrylate having four ethyleneoxy chains, DPCA-60 (manufactured by Nippon Kayaku Co., Ltd.) which is a hexafunctional acrylate having six pentyleneoxy chains, and TPA-330 (manufactured by Nippon Kayaku Co., Ltd.) which is a trifunctional acrylate having three isobutyleneoxy chains.

As the polymerizable compound, an isocyanuric acid ethylene oxide-modified (meth)acrylate is also preferable. Examples of a commercially available product of the isocyanuric acid ethylene oxide-modified (meth)acrylate include ARONIX M-315 and M-313 (manufactured by Toagosei Co., Ltd.), NK ESTER A-9300 (manufactured by Shin-Nakamura Chemical Co., Ltd.), and SR368 (manufactured by Sartomer). As a polymerizable compound which is used in combination with a titanyl phthalocyanine pigment, a polymerizable compound having a high solubility parameter (SP) value is preferable from the viewpoint of heat resistance. Examples of the polymerizable compound having a high SP value include ARONIX M-315 and M-313 (manufactured by Toagosei Co., Ltd.).

As the polymerizable compound, a urethane acrylate described in JP1973-041708B (JP-S48-041708B), JP1976-037193A (JP-S51-037193A), JP1990-032293B (JP-H2-032293B), or JP1990-016765B (JP-H2-016765B), or a urethane compound having a ethylene oxide skeleton described in JP1983-049860B (JP-S58-049860B), JP1981-017654B (JP-S56-017654B), JP1987-039417B (JP-S62-039417B), or JP1987-039418B (JP-S62-039418B) is also preferable. A composition having an excellent film speed can be obtained by using an addition-polymerizable compound having an amino structure or a sulfide structure in the molecules described in JP1988-277653A (JP-S63-277653A), JP1988-260909A (JP-S63-260909A), or JP1989-105238A (JP-H1-105238A).

Examples of a commercially available product of the polymerizable compound include URETHANE OLIGOMER UAS-10 and UAB-140 (manufactured by Sanyo-Kokusaku Pulp Co., Ltd.), UA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600 and AI-600 (manufactured by Kyoeisha Chemical Co., Ltd.).

The content of the polymerizable compound in the composition is preferably 0.1 to 50 mass % with respect to the total solid content of the composition. For example, the lower limit is preferably 0.5 mass % or higher and more preferably 1 mass % or higher. For example, the upper limit is more preferably 45 mass % or lower and still more preferably 40 mass % or lower. As the polymerizable compound, one kind may be used alone, or two or more kinds may be used in combination. In a case where two or more polymerizable compounds are used in combination, it is preferable that the total content of the two or more polymerizable compounds is in the above-described range.

In a case where the composition includes an epoxy resin and a polymerizable compound, a mass ratio of the polymerizable compound to the epoxy resin is preferably 100:1 to 100:400 and more preferably 100:1 to 100:100.

<<Polyfunctional Thiol Compound>>

In order to promote a reaction of the polymerizable compound, the composition according to the embodiment of the present invention may include a polyfunctional thiol compound having two or more mercapto groups in a molecule. The polyfunctional thiol compound is preferably a secondary alkanethiol and more preferably a compound having a structure represented by the following Formula (T1).

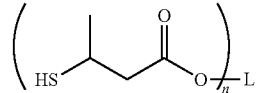

Formula (T1)

(In Formula (T1), n represents an integer of 2 to 4, and L represents a divalent to tetravalent linking group.)

Examples of the polyfunctional thiol compound can be found in paragraphs "0173" to "0176" of WO2015/166779A, the content of which is incorporated herein by reference. The content of the polyfunctional thiol compound is preferably 0.3 to 8.9 mass % and more preferably 0.8 to 6.4 mass % with respect to the total solid content of the composition. The polyfunctional thiol compound may be added in order to improve stability, odor, resolution, developability, adhesiveness, and the like.

<<Epoxy Resin Curing Agent>>

In a case where the composition according to the embodiment of the present invention includes an epoxy resin, it is preferable that the composition further includes an epoxy resin curing agent. Examples of the epoxy resin curing agent include an amine compound, an acid anhydride compound, an amide compound, a phenol compound, and a polycarboxylic acid. From the viewpoints of heat resistance and transparency of a cured product, as the epoxy resin curing agent, a polycarboxylic acid is preferable, and a compound having two or more carboxylic anhydride groups in a molecule is most preferable. Specific examples of the epoxy resin curing agent include butanedioic acid. The details of the epoxy resin curing agent can be found in paragraphs "0072" to "0078" of JP2016-075720A, the content of which is incorporated herein by reference.

The content of the epoxy resin curing agent is preferably 0.01 to 20 parts by mass, more preferably 0.01 to 10 parts by mass, and still more preferably 0.1 to 6.0 parts by mass with respect to 100 parts by mass of the epoxy resin.

<<Photopolymerization Initiator>>

It is preferable that the composition according to the embodiment of the present invention includes a photopolymerization initiator. The photopolymerization initiator is not particularly limited as long as it has an ability to initiate the polymerization of the polymerizable compound, and can be selected from well-known photopolymerization initiators. For example, a compound having photosensitivity to light in a range from an ultraviolet range to a visible range is preferable.

Examples of the photopolymerization initiator include: a halogenated hydrocarbon derivative (For example, a compound having a triazine skeleton or a compound having an oxadiazole skeleton); an acylphosphine compound such as acylphosphine oxide; an oxime compound such as hexaarylbiimidazole or an oxime derivative; an organic peroxide, a thio compound, a ketone compound, an aromatic onium salt, keto oxime ether, an aminoacetophenone compound, and hydroxyacetophenone. Examples of the halogenated hydrocarbon compound having a triazine skeleton include a compound described in Bull. Chem. Soc. Japan, 42, 2924 (1969) by Wakabayshi et al., a compound described in Great Britain Patent No. 1388492, a compound described in JP1978-133428A (JP-S53-133428A), a compound described in German Patent No. 3337024, a compound described in J. Org. Chem.; 29, 1527 (1964) by F. C. Schaefer et al., a compound described in JP1987-058241A (JP-S62-058241A), a compound described in JP1993-281728A (JP-H5-281728A), a compound described in JP1993-034920A (JP-S5-034920A), and a compound described in U.S. Pat. No. 4,212,976A (for example, a compound having an oxadiazole skeleton).

In addition, from the viewpoint of exposure sensitivity, as the photopolymerization initiator, a compound selected from the group consisting of a trihalomethyltriazine compound, a benzyldimethylketanol compound, an α-hydroxy ketone compound, an α-amino ketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, or a 3-aryl-substituted coumarin compound is preferable. In particular, in a case where the composition according to the embodiment of the present invention is used for a solid image pickup element, it is necessary to form a fine pattern in a sharp shape, and thus it is important to obtain excellent curing properties and perform development without a residue remaining in a non-exposed portion. From these viewpoints, it is more preferable that an oxime compound is used as the photopolymerization initiator. In particular, in a case where a fine pattern is formed in a solid image pickup element, a stepper is used for exposure for curing, and this exposure device may be damaged by halogen, and it is also necessary to reduce the addition amount of the photopolymerization initiator to be small. Therefore, in consideration of this point, it is more preferable that an oxime compound is used as the photopolymerization initiator. Specific examples of the photopolymerization initiator can be found in paragraphs "0265" to "0268" of JP2013-029760A, the content of which is incorporated herein by reference.

As the photopolymerization initiator, an α-hydroxyketone compound, an α-aminoketone compound, or an acylphosphine compound can also be preferably used. For example, an α-aminoketone compound described in JP1998-291969A (JP-H10-291969A) or an acylphosphine compound described in JP4225898B can also be used. As the α-hydroxyketone compound, for example, IRGACURE-184, DAROCUR-1173, IRGACURE-500, IRGACURE-2959, or IRGACURE-127 (all of which are manufactured by BASF SE) can be used. As the α-aminoketone compound, IRGACURE-907, IRGACURE-369, IRGACURE-379, or IRGACURE-379EG (all of which are manufactured by BASF SE) which is a commercially available product can be used. As the α-aminoketone compound, a compound described in JP2009-191179A can be used. As the acylphosphine compound, IRGACURE-819, or DAROCUR-TPO (all of which are manufactured by BASF SE) which is a commercially available product can be used.

As the photopolymerization initiator, an oxime compound can be preferably used. Specific examples of the oxime compound include compounds described in JP2001-233842A, JP2000-080068A, JP2006-342166A, and JP2016-021012A. Examples of the oxime compound which can be preferably used in the present invention include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy)iminobutane-2-one, and 2-ethoxycarbonyloxyimino-1-phenylpropane-1-one. In addition, examples of the oxime compound include a compound described in J.C.S. Perkin II (1979), pp. 1653-1660, J.C.S. Perkin II (1979), pp. 156-162 and Journal of Photopolymer Science and Technology (1995), pp. 202-232, JP2000-066385A, JP2000-080068A, JP2004-534797A, or JP2006-342166A.

As a commercially available product of the oxime compound, IRGACURE-OXE01, IRGACURE-OXE02, IRGACURE-OXE03, or IRGACURE-OXE04 (all of which are manufactured by BASF SE) can also be preferably used. TR-PBG-304 (manufactured by Changzhou Tronly New Electronic Materials Co., Ltd.), ADEKA ARKLS NCI-831 (manufactured by Adeka Corporation), ADEKA ARKLS NCI-930 (manufactured by Adeka Corporation), ADEKA OPTOMER N-1919 (manufactured by Adeka Corporation, a photopolymerization initiator 2 described in JP2012-014052A) can also be used.

In addition, in addition to the above-described oxime compounds, for example, a compound described in JP2009-519904A in which oxime is linked to a N-position of a carbazole ring, a compound described in U.S. Pat. No. 7,626,957B in which a hetero substituent is introduced into the benzophenone site, a compound described in JP2010-015025A or US2009/0292039A in which a nitro group is introduced into a colorant site, a ketoxime compound described in WO2009/131189A, a compound described in U.S. Pat. No. 7,556,910B having a triazine skeleton and an oxime skeleton in the same molecule, a compound described in JP2009-221114A having an absorption maximum at 405 nm and having excellent sensitivity to a light source of g-rays may be used.

As the oxime compound, a compound represented by the following Formula (OX-1) is preferable. In the oxime compound, an N—O bond of oxime may form an (E) isomer, a (Z) isomer, or a mixture of an (E) isomer and a (Z) isomer.

(OX-1)

In Formula (OX-1), R and B each independently represent a monovalent substituent, A represents a divalent organic group, and Ar represents an aryl group. The details of Formula (OX-1) can be found in paragraphs "0276" to "0304" of JP2013-029760A, the content of which is incorporated herein by reference.

As the photopolymerization initiator, an oxime compound containing a fluorine atom (fluorine-containing oxime ester photopolymerization initiator) can also be used. Specific examples of the oxime compound having a fluorine atom include a compound described in JP2010-262028A, Compound 24 and 36 to 40 described in JP2014-500852A, and Compound (C-3) described in JP2013-164471A. The content is incorporated herein by reference.

As the photopolymerization initiator, an oxime initiator having a nitro group can also be used. It is preferable that the oxime compound having a nitro group is a dimer. Specific examples of the oxime compound having a nitro group include compounds described in paragraphs "0031" to "0047" of JP2013-114249A and paragraphs "0008" to "0012" and "0070" to "0079" of JP2014-137466A, compounds described in paragraphs "0007" to "0025" of JP4223071B, and ADEKA ARKLS NCI-831 (manufactured by Adeka Corporation).

An oxime compound having a fluorene ring can also be used as the photopolymerization initiator. Specific examples of the oxime compound having a fluorene ring include a compound described in JP2014-137466A. The content is incorporated herein by reference.

As the photopolymerization initiator, an oxime compound having a benzofuran skeleton can also be used. Specific examples include compounds OE-01 to OE-75 described in WO2015/036910A.

Hereinafter, specific preferable examples of the oxime compound which are preferably used will be shown below, but the present invention is not limited thereto.

-continued

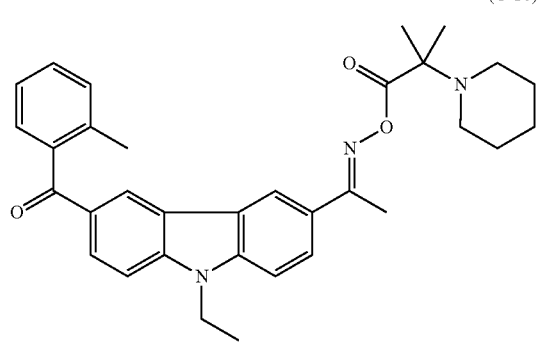
(C-10)

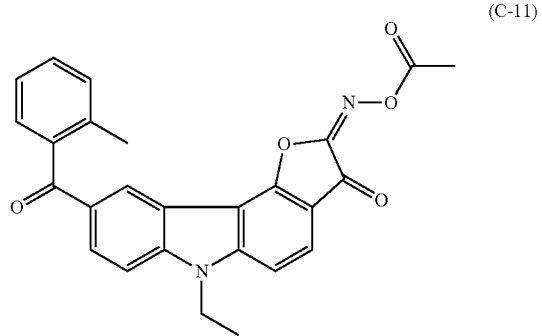
(C-11)

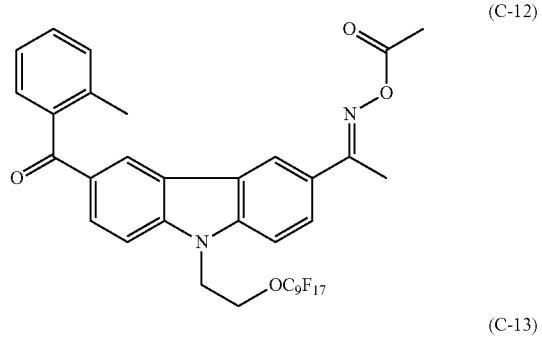
(C-12)

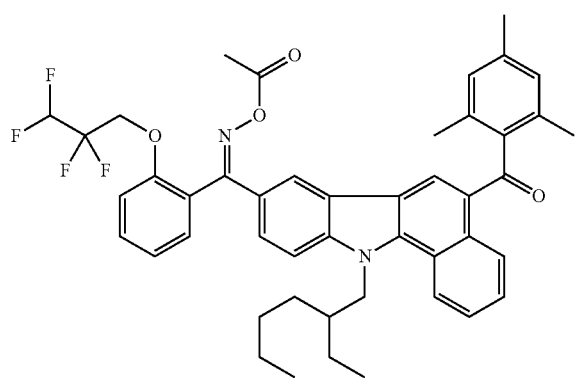
(C-13)

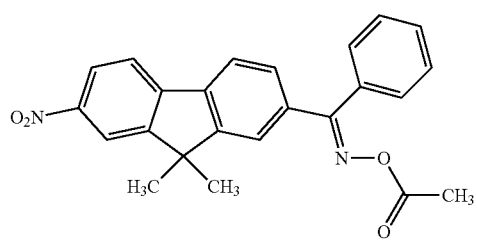
(C-14)

The oxime compound is preferably a compound having an absorption maximum in a wavelength range of 350 nm to 500 nm and more preferably a compound having an absorption maximum in a wavelength range of 360 nm to 480 nm. The oxime compound is preferably a compound having a high absorbance at 365 nm and 405 nm.

The molar absorption coefficient of the oxime compound at 365 nm or 405 nm is preferably 1000 to 300000, more preferably 2000 to 300000, and still more preferably 5000 to 200000 from the viewpoint of sensitivity.

The molar absorption coefficient of the compound can be measured using a well-known method. For example, it is preferable that the absorption coefficient can be measured using an ultraviolet-visible spectrophotometer (Cary-5 spectrophotometer, manufactured by Varian Medical Systems, Inc.) and ethyl acetate as a solvent at a concentration of 0.01 g/L.

It is preferable that the photopolymerization initiator includes an oxime compound and an α-aminoketone compound. By using the oxime compound and the α-aminoketone compound in combination, the developability is improved, and a pattern having excellent rectangularity is likely to be formed. In a case where the oxime compound and the α-aminoketone compound are used in combination, the content of the α-aminoketone compound is preferably 50 to 600 parts by mass and more preferably 150 to 400 parts by mass with respect to 100 parts by mass of the oxime compound.

The content of the photopolymerization initiator is preferably 0.1 to 50 mass %, more preferably 0.5 to 30 mass %, and still more preferably 1 to 20 mass % with respect to the total solid content of the composition. In a case where the content of the photopolymerization initiator is in the above-described range, higher sensitivity and pattern formability can be obtained. The composition according to the embodiment of the present invention may include one photopolymerization initiator or two or more photopolymerization initiators. In a case where the composition includes two or more photopolymerization initiators, it is preferable that the total content of the photopolymerization initiators is in the above-described range.

<<Solvent>>

The composition according to the embodiment of the present invention may include a solvent. Examples of the solvent include an organic solvent. Basically, the solvent is not particularly limited as long as it satisfies the solubility of each component and the coating properties of the composition. However, it is preferable that the organic solvent is selected in consideration of the coating properties and safety of the composition.

Examples of the organic solvent include esters, ethers, ketones, and aromatic hydrocarbons. The details of the organic solvent can be found in paragraph "0223" of WO2015/166779A, the content of which is incorporated herein by reference. Specific examples of the organic solvent include methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate. Among these organic solvents, one kind may be used alone, or two or more kinds may be used in combination. In this case, the content of the aromatic hydrocarbon (for example, benzene, toluene, xylene, or ethylbenzene) as the solvent may be preferably low and is, for example, preferably 50 mass parts per million (ppm) or lower, more preferably 10 mass ppm or lower, and still more preferably 1 mass ppm or lower with respect to the total mass of the organic solvent in consideration of environmental aspects and the like.

A solvent having a low metal content is preferably used. For example, the metal content in the solvent is preferably 10 mass parts per billion (ppb) or lower. Optionally, a solvent having a metal content at a mass parts per trillion (ppt) level may be used. For example, such a high-purity solvent is available from Toyo Gosei Co., Ltd. (The Chemical Daily, Nov. 13, 2015).

Examples of a method of removing impurities such as metal from the solvent include distillation (for example, molecular distillation or thin-film distillation) and filtering using a filter. The pore size of a filter used for the filtering is preferably 10 nm or less, more preferably 5 nm or less, and still more preferably 3 nm or less. As a material of the filter, polytetrafluoroethylene, polyethylene, or nylon is preferable.

The solvent may include an isomer (a compound having the same number of atoms and a different structure). The solvent may include only one isomer or a plurality of isomers.

As the organic solvent, an organic solvent containing 0.8 mmol/L or lower of a peroxide is preferable, and an organic solvent containing no peroxide is more preferable.

The content of the solvent is preferably 10 to 90 mass %, more preferably 20 to 80 mass %, and still more preferably 25 to 75 mass % with respect to the total mass of the composition.

<<Polymerization Inhibitor>>

The composition according to the embodiment of the present invention may include a polymerization inhibitor. Examples of the polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitrosophenylhydroxyamine cerium (III) salt. Among these, p-methoxyphenol is preferable.

The content of the polymerization inhibitor is preferably 0.01 to 5 mass % with respect to the total solid content of the composition.

<<Silane Coupling Agent>>

The composition according to the embodiment of the present invention may further include a silane coupling agent. In this specification, the silane coupling agent refers to a silane compound having a functional group other than a hydrolyzable group. The hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group. Among these, an alkoxy group is preferable. That is, it is preferable that the silane coupling agent is a compound having an alkoxysilyl group. It is preferable that the functional group other than a hydrolyzable group is a group which interacts with the resin or forms a bond with the resin to exhibit affinity. Examples of the functional group other than a hydrolyzable group include a vinyl group, a styryl group, a (meth)acryloyl group, a mercapto group, an epoxy group, an oxetanyl group, an amino group, an ureido group, a sulfide group, and an isocyanate group. Among these, a (meth)acryloyl group or an epoxy group is preferable.

Specific examples of the silane coupling agent include vinyl trimethoxysilane, vinyltriethoxysilane, 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, N-(vinylbenzyl)-2-aminoethyl-3-aminopropyltrimethoxysilane hydrochloride, tris-(trimethoxysilylpropyl)isocyanurate, 3-ureidopropyltriethoxysilane, 3-mercaptopropylmethyldimethoxysilane, 3-mercaptopropyltrimethoxysilane, and bis(triethoxysilylpropyl)tetrasulfide, and 3-isocyanatepropyltriethoxysilane. In addition to the above-described examples, an alkoxy oligomer can be used. The following compounds can also be used.

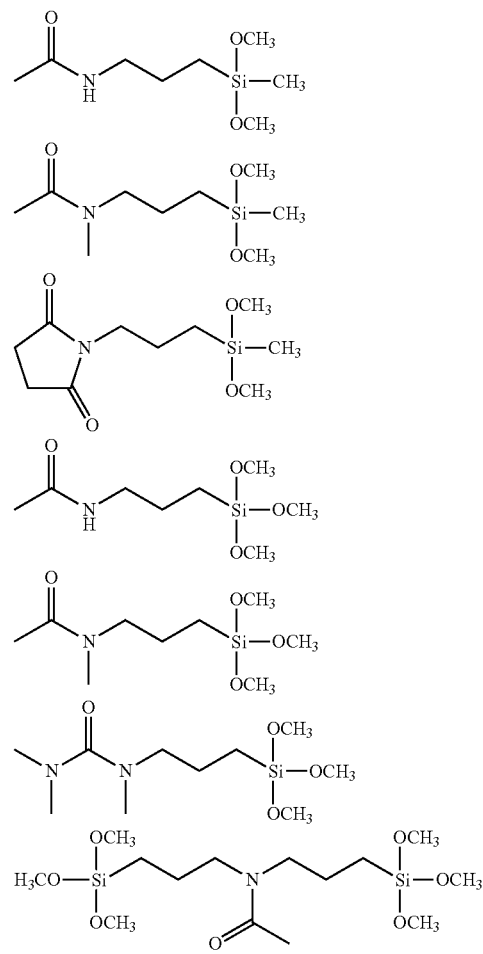

Examples of a commercially available product of the silane coupling agent include KBM-13, KBM-22, KBM-103, KBE-13, KBE-22, KBE-103, KBM-3033, KBE-3033, KBM-3063, KBM-3066, KBM-3086, KBE-3063, KBE-3083, KBM-3103, KBM-3066, KBM-7103, SZ-31, KPN-3504, KBM-1003, KBE-1003, KBM-303, KBM-402, KBM-403, KBE-402, KBE-403, KBM-1403, KBM-502, KBM-503, KBE-502, KBE-503, KBM-5103, KBM-602, KBM-603, KBM-903, KBE-903, KBE-9103, KBM-573, KBM-575, KBM-9659, KBE-585, KBM-802, KBM-803, KBE-846, KBE-9007, X-40-1053, X-41-1059A, X-41-1056, X-41-1805, X-41-1818, X-41-1810, X-40-2651, X-40-2655A, KR-513, KC-89S, KR-500, X-40-9225, X-40-9246, X-40-9250, KR-401N, X-40-9227, X-40-9247, KR-510, KR-9218, KR-213, X-40-2308, and X-40-9238 (all of which are manufactured by Shin-Etsu Chemical Co., Ltd.). In addition, examples of the silane coupling agent include a compound described in paragraphs "0018" to "0036" of JP2009-288703A, a compound described in paragraphs "0056" to "0066" of JP2009-242604A, and a compound described in paragraphs "0229" to "0236" of WO2015/166779A, the contents of which are incorporated herein by reference. As the silane coupling agent, the following compounds can also be used.

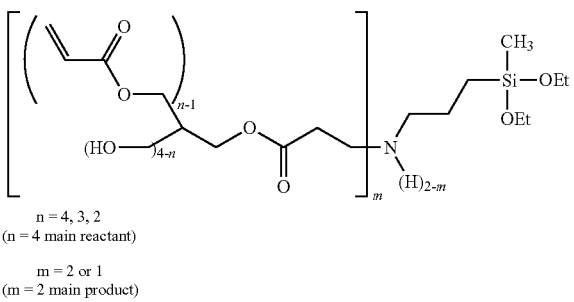

n = 4, 3, 2
(n = 4 main reactant)

m = 2 or 1
(m = 2 main product)

The content of the silane coupling agent is preferably 0.1 to 30 mass %, more preferably 0.5 to 20 mass %, and still more preferably 1 to 10 mass % with respect to the total solid content of the composition.

<<<Surfactant>>>

The composition according to the embodiment of the present invention may include various surfactants from the viewpoint of further improving application properties. As the surfactants, various surfactants such as a fluorine surfactant, a nonionic surfactant, a cationic surfactant, an anionic surfactant, or a silicone surfactant can be used. The details of the surfactant can be found in paragraphs "0238" to "0245" of WO2015/166779A, the content of which is incorporated herein by reference.

By the composition according to the embodiment of the present invention containing a fluorine surfactant, liquid characteristics (for example, fluidity) of a coating solution prepared from the coloring composition are further improved, and the uniformity in coating thickness and liquid saving properties can be further improved. In a case where a film is formed using a coating solution prepared using the composition including a fluorine surfactant, the interfacial tension between a coated surface and the coating solution decreases, the wettability on the coated surface is improved, and the coating properties on the coated surface are improved. Therefore, a film having a uniform thickness with reduced unevenness in thickness can be formed more suitably.

The fluorine content in the fluorine surfactant is preferably 3 to 40 mass %, more preferably 5 to 30 mass %, and still more preferably 7 to 25 mass %. The fluorine surfactant in which the fluorine content is in the above-described range is effective from the viewpoints of the uniformity in the thickness of the coating film and liquid saving properties, and the solubility thereof in the composition is also excellent.

Specific examples of the fluorine surfactant include a surfactant described in paragraphs "0060" to "0064" of JP2014-041318A (paragraphs "0060" to "0064" of corresponding WO2014/017669A) and a surfactant described in paragraphs "0117" to "0132" of JP2011-132503A, the content of which is incorporated herein by reference. Examples of a commercially available product of the fluorine surfactant include: MEGAFACE F171, F172, F173, F176, F177, F141, F142, F143, F144, R30, F437, F475, F479, F482, F554, and F780 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and PolyFox, PF636, PF656, PF6320, PF6520, and PF7002 (all of which are manufactured by OMNOVA Solutions Inc.).

In addition, as the fluorine surfactant, an acrylic compound in which, in a case where heat is applied to a molecular structure which has a functional group having a fluorine atom, the functional group having a fluorine atom is cut and a fluorine atom is volatilized can also be preferably used. Examples of the fluorine surfactant include MEGAFACE DS series (manufactured by DIC Corporation, The Chemical Daily, Feb. 22, 2016, Nikkei Business Daily, Feb. 23, 2016), for example, MEGAFACE DS-21.

As the fluorine surfactant, a block polymer can also be used. Examples of the block polymer include a compound described in JP2011-089090A. As the fluorine surfactant, a fluorine-containing polymer compound can be preferably used, the fluorine-containing polymer compound including: a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group). For example, the following compound can also be used as the fluorine surfactant used in the present invention.

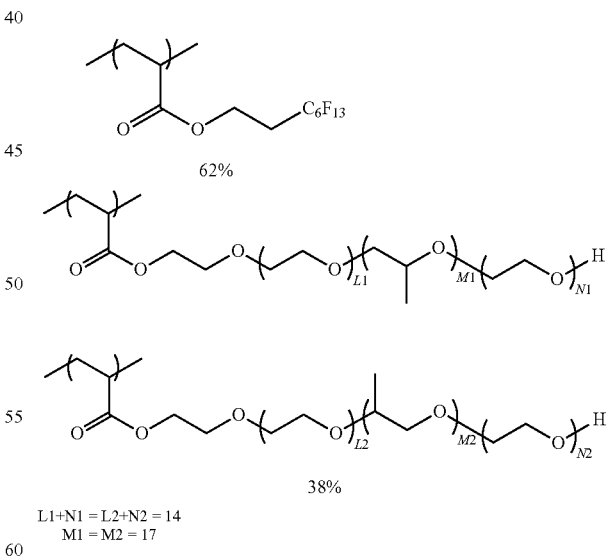

L1+N1 = L2+N2 = 14
M1 = M2 = 17

The weight-average molecular weight of the compound is preferably 3000 to 50000 and, for example, 14000. In the compound, "%" representing the proportion of a repeating unit is mol %.

As the fluorine surfactant, a fluorine-containing polymer having an ethylenically unsaturated group at a side chain can also be used. Specific examples include compounds described in paragraphs "0050" to "0090" and paragraphs "0289" to "0295" of JP2010-164965A, for example, MEGAFACE RS-101, RS-102, RS-718K, and RS-72-K manufactured by DIC Corporation. As the fluorine surfactant, a compound described in paragraphs "0015" to "0158" of JP2015-117327A can also be used.

Examples of the nonionic surfactant include glycerol, trimethylolpropane, trimethylolethane, an ethoxylate and a propoxylate thereof (for example, glycerol propoxylate or glycerin ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid esters (PLURONIC L10, L31, L61, L62, 10R5, 17R2, and 25R2 (manufactured by BASF SE) and TETRONIC 304, 701, 704, 901, 904, and 150R1 (manufactured by BASF SE)); SOLSPERSE 20000 (manufactured by Lubrication Technology Inc.); NCW-101, NCW-1001, and NCW-1002 (all of which are manufactured by Wako Pure Chemical Industries, Ltd.); PIONIN D-6112, D-6112-W, and D-6315 (all of which are manufactured by Takemoto Oil&Fat Co., Ltd.); and OLFINE E1010, SURFYNOL 104, 400, and 440 (all of which are manufactured by Nissin Chemical Co., Ltd.).

The content of the surfactant is preferably 0.001 to 2.0 mass % and more preferably 0.005 to 1.0 mass % with respect to the total solid content of the composition. Among these surfactants, one kind may be used alone, or two or more kinds may be used in combination. In a case where two or more surfactants are used, it is preferable that the total content of the surfactants is in the above-described range.

<<Other Components>>

The composition according to the embodiment of the present invention may include various additives, for example, a thermal polymerization initiator, a thermal polymerization component, a ultraviolet absorber, an antioxidant, a plasticizer, a developability improving agent such as a low molecular weight organic carboxylic acid, other fillers, an antioxidant, or an aggregation inhibitor. As the ultraviolet absorber, an ultraviolet absorber such as an amino diene compound, a salicylate compound, a benzophenone compound, a benzotriazole compound, an acrylonitrile compound, or a triazine compound can be preferably used. Specifically, a compound described in JP2013-068814A can be used. As the benzotriazole compound, MYUA series (manufactured by Miyoshi Oil&Fat Co., Ltd.; The Chemical Daily, Feb. 1, 2016) may be used. As the antioxidant, for example, a phenol compound, a phosphorus compound, (for example, a compound described in paragraph "0042" of JP2011-090147A), or a thioether compound can be used. Examples of a commercially available product of the antioxidant include ADEKA STAB series (AO-20, AO-30, AO-40, AO-50, AO-50F, AO-60, AO-60G, AO-80, and AO-330, manufactured by Adeka Corporation).

Depending on materials used and the like, the composition may include a metal element. From the viewpoint of, for example, suppressing the generation of defects, the content of a Group 2 element (for example, calcium or magnesium) in the composition is controlled to be preferably 50 mass ppm or lower and more preferably 0.01 to 10 mass ppm. The total amount of inorganic metal salts in the composition is preferably 100 mass ppm or lower and more preferably 0.5 to 50 ppm.

<Method of Preparing Composition>

The composition according to the embodiment of the present invention can be prepared by mixing the above-described components with each other.

During the preparation of the composition, the respective components may be mixed with each other collectively, or may be mixed with each other sequentially after dissolved and dispersed in a solvent. During mixing, the order of addition or working conditions are not particularly limited. For example, all the components may be dissolved or dispersed in a solvent at the same time to prepare the composition. Optionally, two or more solutions or dispersions to which the respective components are appropriately added may be prepared, and the solutions or dispersions may be mixed with each other during use (during application) to prepare the composition.

In a case where a pigment is used as the coloring material that shields visible light and the infrared absorber, it is preferable that the composition is prepared using a method including: preparing a pigment dispersion by dispersing the pigment and optionally other components such as a resin or an organic solvent; and mixing the obtained pigment dispersion with other components of the composition.

The pigment dispersion may also be prepared by dispersing the coloring material that shields visible light and the infrared absorber separately or by dispersing (co-dispersing) the coloring material that shields visible light and the infrared absorber together. In particular, in a case where a pyrrolopyrrole compound is used as the infrared absorber, it is preferable that the pyrrolopyrrole compound and a chromatic colorant are co-dispersed. According to this aspect, the dispersion stability of the pyrrolopyrrole compound can be improved.

In a case where the composition according to the embodiment of the present invention includes particles of a pigment or the like, it is preferable that a process of dispersing the particles is provided. Examples of a mechanical force used for dispersing the particles in the process of dispersing the particles include compression, squeezing, impact, shearing, and cavitation. Specific examples of the process include a beads mill, a sand mill, a roll mill, a ball mill, a paint shaker, a Microfluidizer, a high-speed impeller, a sand grinder, a project mixer, high-pressure wet atomization, and ultrasonic dispersion. During the pulverization of the particles using a sand mill (beads mill), it is preferable that the process is performed under conditions for increasing the pulverization efficiency, for example, by using beads having a small size and increasing the filling rate of the beads. It is preferable that rough particles are removed by filtering, centrifugal separation, and the like. As the process and the disperser for dispersing the particles, a process and a disperser described in "Complete Works of Dispersion Technology, Johokiko Co., Ltd., Jul. 15, 2005", "Dispersion Technique focusing on Suspension (Solid/Liquid Dispersion) and Practical Industrial Application, Comprehensive Reference List, Publishing Department of Management Development Center, Oct. 10, 1978", and paragraph "0022" JP2015-157893A can be suitably used. In the process of dispersing the particles, particles may be refined in a salt milling step. A material, a device, process conditions, and the like used in the salt milling step can be found in, for example, JP2015-194521A and JP2012-046629A.

During the preparation of the composition, it is preferable that the composition is filtered through a filter, for example, in order to remove foreign matter or to reduce defects. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (including a polyolefin resin having a high density and an ultrahigh molecular weight) such as polyethylene or polypropylene (PP). Among these materials, polypropylene (including high-density polypropylene) or nylon is preferable.

The pore size of the filter is suitably about 0.01 to 7.0 µm and is preferably about 0.01 to 3.0 µm and more preferably about 0.05 to 0.5 µm. In a case where the pore size of the filter is in the above-described range, fine foreign matter can be reliably removed. It is preferable that a fibrous filter material is used. Examples of the fibrous filter material include polypropylene fiber, nylon fiber, and glass fiber. Specific examples include a filter cartridge of SBP type series (for example, SBP008), TPR type series (for example, TPR002 or TPR005), and SHPX type series (for example, SHPX003) all of which are manufactured by Roki Techno Co., Ltd.

In a case where a filter is used, a combination of different filters (for example, a first filter and a second filter) may be used. At this time, the filtering using each of the filters may be performed once, or twice or more.

A combination of filters having different pore sizes in the above-described range may be used. Here, the pore size of the filter can refer to a nominal value of a manufacturer of the filter. A commercially available filter can be selected from various filters manufactured by Pall Corporation (for example, DFA4201NIEY), Toyo Roshi Kaisha, Ltd., Entegris Japan Co., Ltd. (former Mykrolis Corporation), or Kits Microfilter Corporation.

The second filter may be formed of the same material as that of the first filter.

The filtering using the first filter may be performed only on the dispersion, and the filtering using the second filter may be performed on a mixture of the dispersion and other components.

The total solid content (solid content concentration) of the composition changes depending on a coating method and, for example, is preferably 1 to 50 mass %. The lower limit is more preferably 10 mass % or higher. The upper limit is more preferably 30 mass % or lower.

It is preferable that the composition according to the embodiment of the present invention satisfies at least one of the following spectral characteristics (1) to (5).

(1) In a case where a film having a thickness of 1 µm after drying is formed, a maximum value of a light transmittance of the film in a thickness direction in a wavelength range of 400 to 950 nm is 20% or lower, and a minimum value of a light transmittance of the film in the thickness direction in a wavelength range of 1100 to 1300 nm is 70% or higher. The maximum value in a wavelength range of 400 to 950 nm is more preferably 15% or lower and still more preferably 10% or lower. The minimum value in a wavelength range of 1100 to 1300 nm is more preferably 75% or higher and still more preferably 80% or higher.

(2) In a case where a film having a thickness of 2 µm after drying is formed, a maximum value of a light transmittance of the film in a thickness direction in a wavelength range of 400 to 950 nm is 20% or lower, and a minimum value of a light transmittance of the film in the thickness direction in a wavelength range of 1100 to 1300 nm is 70% or higher. The maximum value in a wavelength range of 400 to 950 nm is more preferably 15% or lower and still more preferably 10% or lower. The minimum value in a wavelength range of 1100 to 1300 nm is more preferably 75% or higher and still more preferably 80% or higher.

(3) In a case where a film having a thickness of 3 µm after drying is formed, a maximum value of a light transmittance of the film in a thickness direction in a wavelength range of 400 to 950 nm is 20% or lower, and a minimum value of a light transmittance of the film in the thickness direction in a wavelength range of 1100 to 1300 nm is 70% or higher. The maximum value in a wavelength range of 400 to 950 nm is more preferably 15% or lower and still more preferably 10% or lower. The minimum value in a wavelength range of 1100 to 1300 nm is more preferably 75% or higher and still more preferably 80% or higher.

(4) In a case where a film having a thickness of 5 µm after drying is formed, a maximum value of a light transmittance of the film in a thickness direction in a wavelength range of 400 to 950 nm is 20% or lower, and a minimum value of a light transmittance of the film in the thickness direction in a wavelength range of 1100 to 1300 nm is 70% or higher. The maximum value in a wavelength range of 400 to 950 nm is more preferably 15% or lower and still more preferably 10% or lower. The minimum value in a wavelength range of 1100 to 1300 nm is more preferably 75% or higher and still more preferably 80% or higher.

(5) In a case where a film having a thickness of 2.4 µm after drying is formed, a maximum value of a light transmittance of the film in a thickness direction in a wavelength range of 400 to 950 nm is 20% or lower, and a minimum value of a light transmittance of the film in the thickness direction in a wavelength range of 1100 to 1300 nm is 70% or higher. The maximum value in a wavelength range of 400 to 950 nm is more preferably 15% or lower and still more preferably 10% or lower. The minimum value in a wavelength range of 1100 to 1300 nm is more preferably 75% or higher and still more preferably 80% or higher.

At at least one value of the film thicknesses, the minimum value A of the absorbance in a wavelength range of 400 to 950 nm is, for example, preferably 0.1 to 5 and more preferably 0.3 to 3. The maximum value B of the absorbance in a wavelength range of 1100 to 1300 nm is, for example, preferably 0.01 to 0.5 and more preferably 0.02 to 0.3.

<Pattern Forming Method>

Next, a pattern forming method using the composition according to the embodiment of the present invention will be described. It is preferable that a pattern forming method includes: a step of forming a composition layer on a support using the composition according to the embodiment of the present invention; and a step of forming a pattern on the composition layer using a photolithography method or a dry etching method.

It is preferable that the pattern formation using the photolithography method includes: a step of forming a composition layer on a support using the composition according to the embodiment of the present invention; a step of exposing the composition layer in a pattern shape; and a step of forming a pattern by removing a non-exposed portion by development.

It is preferable that the pattern formation using the dry etching method includes: a step of forming a composition layer on a support using the composition according to the embodiment of the present invention and curing the composition layer to form a cured composition layer; a step of forming a photoresist layer on the cured composition layer; a step of obtaining a resist pattern by patterning the photoresist layer by exposure and development; and a step of forming a pattern by dry-etching the cured composition layer by using the resist pattern as an etching mask. Hereinafter, the respective steps will be described.

<<Step of Forming Composition Layer>>

In the step of forming a composition layer, a composition layer is formed on a support using the composition according to the embodiment of the present invention.

As a method of applying the composition to the support, a well-known method can be used. Examples of the well-known method include: a drop casting method; a slit coating method; a spray coating method; a roll coating method; a spin coating method; a cast coating method; a slit and spin method; a pre-wetting method (for example, a method described in JP2009-145395A); various printing methods including jet printing such as an ink jet method (for example, an on-demand method, a piezoelectric method, or a thermal method) or a nozzle jet method, flexographic printing, screen printing, gravure printing, reverse offset printing, and metal mask printing; a transfer method using metal or the like; and a nanoimprint lithography method. The application method using an ink jet method is not particularly limited, and examples thereof include a method (in particular, pp. 115 to 133) described in "Extension of Use of Ink Jet—Infinite Possibilities in Patent-" (February, 2005, S.B. Research Co., Ltd.) and methods described in JP2003-262716A, JP2003-185831A, JP2003-261827A, JP2012-126830A, and JP2006-169325A.

The composition layer formed on the support may be dried (pre-baked). In a case where a pattern is formed through a low-temperature process, pre-baking is not necessarily performed. In a case where pre-baking is performed, the pre-baking temperature is preferably 150° C. or lower, more preferably 120° C. or lower, and still more preferably 110° C. or lower. The lower limit is, for example, 50° C. or higher or 80° C. or higher. The pre-baking time is preferably 10 to 3000 seconds, more preferably 40 to 2500 seconds, and still more preferably 80 to 2200 seconds. Drying can be performed using a hot plate, an oven, or the like.

(Case where Pattern is Formed Using Photolithography Method)

<<Exposure Step>>

Next, the composition layer is exposed in a pattern shape (exposure step). For example, the composition layer is exposed in a pattern shape using an exposure device such as a stepper through a mask having a predetermined mask pattern, thereby exposing a pattern. As a result, an exposed portion can be cured.

As radiation (light ray) used during the exposure, ultraviolet rays such as g-rays or i-rays are preferably used (i-rays are more preferably used). The irradiation dose (exposure dose) is preferably 0.03 to 2.5 J/cm$^2$, more preferably 0.05 to 1.0 J/cm$^2$, and still more preferably 0.08 to 0.5 J/cm$^2$.

The oxygen concentration during exposure can be appropriately selected. For example, instead of being performed in the atmosphere, exposure may be performed in a low oxygen atmosphere having an oxygen concentration of 19 vol % or lower (preferably 15 vol % or lower, more preferably 5 vol % or lower, and still more preferably 0 vol %), or exposure may be performed in a high oxygen atmosphere having an oxygen concentration of higher than 21 vol % (preferably 22 vol % or higher, more preferably 30 vol % or higher, and still more preferably 50 vol % or higher). Typically, the exposure illuminance can be appropriately set, and typically can be selected in a range of 1000 W/m$^2$ to 100000 W/m$^2$ (preferably 5000 W/m$^2$ or higher, more preferably 15000 W/m$^2$ or higher, and still more preferably 35000 W/m$^2$ or higher). Conditions of the oxygen concentration and conditions of the exposure illuminance may be appropriately combined. For example, conditions are oxygen concentration: 10 vol % and illuminance: 10000 W/m$^2$, or oxygen concentration: 35 vol % and illuminance: 20000 W/m$^2$.

<<Development Step>>

Next, a pattern is formed by removing a non-exposed portion by development. The non-exposed portion can be removed by development using a developer. As a result, a non-exposed portion of the composition layer in the exposure step is eluted into the developer, and only the photocured portion remains.

As the developer, an alkali developer which does not cause damages to a solid image pickup element as a substrate, a circuit or the like is desired.

For example, the temperature of the developer is preferably 20° C. to 30° C. The development time is preferably 20 to 180 seconds. In addition, in order to further improve residue removing properties, a step of shaking the developer off per 60 seconds and supplying a new developer may be repeated multiple times.

Examples of the alkaline agent used as the developer include: an organic alkaline agent such as ammonia water, ethylamine, diethylamine, dimethylethanolamine, diglycolamine, diethanolamine, hydroxyamine, ethylenediamine, tetramethylammonium hydroxide, tetraethylammonium hydroxide, tetrapropylammonium hydroxide, tetrabutylammonium hydroxide, benzyltrimethylammonium hydroxide, dimethyl bis(2-hydroxyethyl)ammonium hydroxide, choline, pyrrole, piperidine, or 1,8-diazabicyclo[5.4.0]-7-undecene; and an inorganic alkaline compound such as sodium hydroxide, potassium hydroxide, sodium carbonate, sodium bicarbonate, sodium silicate, or sodium metasilicate. As the developer, an alkaline aqueous solution in which the above alkaline agent is diluted with pure water is preferably used. A concentration of the alkaline agent in the alkaline aqueous solution is preferably 0.001 to 10 mass % and more preferably 0.01 to 1 mass %. A surfactant may be used as the developer. Examples of the surfactant include the surfactants described above regarding the composition. Among these, a nonionic surfactant is preferable. In a case where a developer including the alkaline aqueous solution is used, it is preferable that the layer is rinsed with pure water after development.

After the development step and the drying, a heat treatment (post-baking) or a curing step of curing the film by post-exposure may be performed.

Post-baking is a heat treatment which is performed after development to complete curing. For example, the heating temperature during post-baking is preferably 100° C. to 240° C. and more preferably 200° C. to 240° C. In a case where an organic electroluminescence (organic EL) element is used as a light-emitting light source, or in a case where a photoelectric conversion film of an image sensor is formed of an organic material, the heating temperature is preferably 150° C. or lower, more preferably 120° C. or lower, still more preferably 100° C. or lower, and even still more preferably 90° C. or lower. The lower limit is, for example, 50° C. or higher. The film after the development is post-baked continuously or batchwise using heating means such as a hot plate, a convection oven (hot air circulation dryer), or a high-frequency heater under the above-described conditions.

For post-exposure, for example, g-rays, h-rays, i-rays, excimer laser such as KrF or ArF, electron beams, or X-rays can be used. It is preferable that post-baking is performed using an existing high-pressure mercury lamp at a low temperature of about 20° C. to 50° C. The irradiation time is preferably 10 to 180 seconds and more preferably 30 to 60 seconds. In a case where post-exposure and post-heating are performed in combination, it is preferable that post-exposure is performed before post-heating.

(Case where Pattern is Formed Using Dry Etching Method)

The pattern formation using the dry etching method can be performed by curing the composition layer formed on the support to form a cured composition layer, and then etching the cured composition layer with etching gas by using a patterned photoresist layer as a mask. It is preferable that pre-baking is further performed in order to form the photoresist layer. In particular, in a preferable aspect, as a process of forming the photoresist layer, baking after exposure or baking after development (post-baking) is performed. The details of the pattern formation using the dry etching method can be found in paragraphs "0010" to "0067" of JP2013-064993A, the content of which is incorporated herein by reference.

By performing the respective steps as described above, a pattern of pixels having the specific spectral characteristics according to the embodiment of the present invention can be formed. An infrared transmitting filter may consist of only the pixels having the specific spectral characteristics according to the embodiment of the present invention, or may include not only the pixels having the above-described spectral characteristics according to the embodiment of the present invention but also other pixels of red, green, blue, magenta, yellow, cyan, black, or transparent color. In a case where an infrared transmitting filter includes not only the pixels having the spectral characteristics according to the embodiment of the present invention but also other color pixels, a pattern of the pixels having the specific spectral characteristics according to the embodiment of the present invention may be formed first, or a pattern of the pixels having the specific spectral characteristics according to the embodiment of the present invention may be formed after forming a pattern of the other pixels.

<Film>

Next, a film according to the embodiment of the present invention will be described. The film according to the embodiment of the present invention is formed using the above-described composition according to the embodiment of the present invention. The film according to the embodiment of the present invention can be preferably used as an infrared transmitting filter.

It is preferable that the film according to the embodiment of the present invention has the following spectral characteristics (1). According to this aspect, a film capable of shielding light in a wavelength range of 400 to 950 nm and allowing transmission of infrared light (preferably infrared light in a wavelength range of longer than 1100 nm and more preferably infrared light in a wavelength range of 1000 to 1300 nm) in a state where noise generated from visible light is small can be formed.

(1) It is preferable that a maximum value of a light transmittance of the film in a thickness direction in a wavelength range of 400 to 950 nm is 20% or lower and that a minimum value of a light transmittance of the film in the thickness direction in a wavelength range of 1100 to 1300 nm is 70% or higher. The maximum value of the light transmittance in the thickness direction of the film in a wavelength range of 400 to 950 nm is preferably 15% or lower and more preferably 10% or lower. The minimum value of the light transmittance in the thickness direction of the film in a wavelength range of 1100 to 1300 nm is preferably 75% or higher and more preferably 80% or higher.

In this specification, the spectral characteristics of the film refer to values obtained by measuring the transmittance in a wavelength range of 300 to 1300 nm using an ultraviolet-visible-near infrared spectrophotometer (U-4100, manufactured by Hitachi High-Technologies Corporation).

The thickness of the film according to the embodiment of the present invention is not particularly limited and is preferably 0.1 to 20 µm and more preferably 0.5 to 10 µm.

<Laminate>

Next, a laminate according to the embodiment of the present invention will be described. The laminate according to the embodiment of the present invention includes: a layer (hereinafter, also referred to as "first layer") including a coloring material that shields visible light; and a layer (hereinafter, also referred to as "second layer") including a compound having an absorption maximum in a wavelength range of longer than 900 nm and 1000 nm or shorter, in which a ratio A/B of a minimum value A of an absorbance of the laminate in a wavelength range of 400 to 950 nm to a maximum value B of an absorbance of the laminate in a wavelength range of 1100 to 1300 nm is 4.5 or higher. The value of the above-described ratio A/B is preferably 10 or higher, more preferably 20 or higher, and still more preferably 30 or higher. The upper limit is, for example, 90 or lower. The laminate according to the embodiment of the present invention can be preferably used as an infrared transmitting filter.

As the coloring material that shields visible light and the compound having an absorption maximum in a wavelength range of longer than 900 nm and 1000 nm or shorter, the materials described above regarding the composition can be used.

In the laminate according to the embodiment of the present invention, the maximum value of the light transmittance of the laminate in the thickness direction in a wavelength range of 400 to 950 nm is preferably 20% or lower, more preferably 15% or lower, and still more preferably 10% or lower, and the minimum value of the light transmittance of the laminate in the thickness direction in a wavelength range of 1100 to 1300 nm is preferably 70% or higher, more preferably 75% or higher, and still more preferably 80% or higher.

It is preferable that the laminate according to the embodiment of the present invention has any one of the following spectral characteristics (1) or (2). As the compound having an absorption maximum in a wavelength range of longer than 700 nm and 900 nm or shorter, the materials described above regarding the composition can be used.

(1) At least one of the first layer or the second layer further includes the compound having an absorption maximum in a wavelength range of longer than 700 nm and 900 nm or shorter.

(2) The laminate further includes a layer (hereinafter, also referred to as "third layer") including a compound having an absorption maximum in a wavelength range of longer than 700 nm and 900 nm or shorter.

The thickness of the laminate is preferably 1 to 5 µm and more preferably 1.5 to 3.5 m.

The laminating order of the respective layers in the laminate is not particularly limited. The first layer and the second layer may be laminated disposed in this order from the support side, or the second layer and the first layer may be disposed in this order from the support side. In a case where the laminate further includes the third layer, the first layer, the second layer, and the third layer may be disposed in this order from the support side, the first layer, the third layer, and the second layer may be disposed in this order from the support side, the second layer, the third layer, and the first layer may be disposed in this order from the support side, the third layer, the first layer, and the second layer may be disposed in this order from the support side, and the third layer, the second layer, and the first layer may be disposed in this order from the support side.

In the laminate according to the embodiment of the present invention, a maximum value of a light transmittance of the first layer in the thickness direction in a wavelength range of 400 to 700 nm is preferably 20% or lower, more preferably 15% or lower, and still more preferably 10% or lower.

The thickness of the first layer in the laminate is preferably 0.5 to 4 µm and more preferably 1 to 3 µm.

In the laminate according to the embodiment of the present invention, a maximum value of a light transmittance of the second layer in the thickness direction in a wavelength range of 900 to 950 nm is preferably 20% or lower, more preferably 15% or lower, and still more preferably 10% or lower. Further, a minimum value of a light transmittance of the second layer in the thickness direction in a wavelength range of 1100 to 1300 nm is preferably 70% or higher, more preferably 75% or higher, and still more preferably 80% or higher.

In a case where the second layer includes a compound having an absorption maximum in a wavelength range of longer than 700 nm and 900 nm or shorter, the maximum value of the light transmittance of the second layer in the thickness direction in a wavelength range of 800 to 950 nm is preferably 20% or lower, more preferably 15% or lower, and still more preferably 10% or lower. Further, the minimum value of the light transmittance of the second layer in the thickness direction in a wavelength range of 1100 to 1300 nm is preferably 70% or higher, more preferably 75% or higher, and still more preferably 80% or higher.

In a case where the second layer does not include a compound having an absorption maximum in a wavelength range of longer than 700 nm and 900 nm or shorter, the maximum value of the light transmittance of the second layer in the thickness direction in a wavelength range of 900 to 950 nm is preferably 20% or lower, more preferably 15% or lower, and still more preferably 10% or lower. Further, the minimum value of the light transmittance of the second layer in the thickness direction in a wavelength range of 1100 to 1300 nm is preferably 70% or higher, more preferably 75% or higher, and still more preferably 80% or higher.

The thickness of the second layer in the laminate is preferably 0.4 to 4 µm and more preferably 0.6 to 3 µm.

In a case where the laminate according to the embodiment of the present invention includes the third layer, the thickness of the third layer is preferably 0.5 to 2 µm and more preferably 0.6 to 1.5 µm. A maximum value of a light transmittance of the third layer in the thickness direction in a wavelength range of 800 to 900 nm is preferably 20% or lower, more preferably 15% or lower, and still more preferably 10% or lower. Further, a minimum value of a light transmittance of the third layer in the thickness direction in a wavelength range of 1000 to 1300 nm is preferably 70% or higher, more preferably 75% or higher, and still more preferably 80% or higher.

<Infrared Transmitting Filter>

Next, an infrared transmitting filter according to the embodiment of the present invention will be described. The infrared transmitting filter according to the embodiment of the present invention includes the film or the laminate according to the embodiment of the present invention.

It is preferable that the infrared transmitting filter according to the embodiment of the present invention is laminated on a support for use. Examples of the support include a substrate formed of a material such as silicon, non-alkali glass, soda glass, PYREX (registered trade name) glass, or quartz glass. In addition, for example, an InGaAs substrate is preferably used. The InGaAs substrate has excellent sensitivity to light having a wavelength of longer than 1000 nm. Therefore, by laminating the film according to the embodiment of the present invention on the InGaAs substrate, an infrared sensor having excellent sensitivity can be easily obtained.

A charge coupled device (CCD), a complementary metal-oxide semiconductor (CMOS), a transparent conductive film, or the like may be formed on the support. A black matrix that separates pixels from each other may be formed on the support. Optionally, an undercoat layer may be provided on the support to improve adhesion with a layer above the support, to prevent diffusion of materials, or to make a surface of the substrate flat.

The infrared transmitting filter according to the embodiment of the present invention can be used in combination with a color filter that includes a chromatic colorant. The color filter can be manufactured using a coloring composition including a chromatic colorant. Examples of the chromatic colorant include the chromatic colorants described above regarding the composition. The coloring composition may further include, for example, a resin, a polymerizable compound, a photopolymerization initiator, a surfactant, a solvent, a polymerization inhibitor, and an ultraviolet absorber. In more detail, for example, the materials described above regarding the above-described composition can be used.

It is also preferable that the infrared transmitting filter according to the embodiment of the present invention includes: a pixel of the film or the laminate according to the embodiment of the present invention; and a pixel selected from the group consisting of a red pixel, a green pixel, a blue pixel, a magenta pixel, a yellow pixel, a cyan pixel, a black pixel, and an achromatic pixel.

<Solid Image Pickup Element>

A solid image pickup element according to the embodiment of the present invention includes the film or the laminate according to the embodiment of the present invention. The solid image pickup element according to the embodiment of the present invention is configured to include the film or the laminate according to the embodiment of the present invention. The configuration of the solid image pickup element is not particularly limited as long as the solid image pickup element functions. For example, the following configuration can be adopted.

The solid image pickup element includes plural photodiodes and transfer electrodes on the support, the photodiodes constituting a light receiving area of the solid image pickup element (for example, a CCD image sensor or a CMOS image sensor), and the transfer electrode being formed of polysilicon or the like. In the solid image pickup element, a light shielding film formed of tungsten or the like which has openings through only light receiving sections of the photodiodes is provided on the photodiodes and the transfer electrodes, a device protective film formed of silicon nitride or the like is formed on the light shielding film so as to cover the entire surface of the light shielding film and the light receiving sections of the photodiodes, and the film or the laminate according to the embodiment of the present invention is formed on the device protective film. Further, a configuration in which light collecting means (for example, a microlens; hereinafter, the same shall be applied) is provided above the device protective film and below the film or the laminate according to the embodiment of the present invention (on a side thereof close the support), or a configuration in which light collecting means is provided on the film or the laminate according to the embodiment of the present invention may be adopted.

<Infrared Sensor>

The infrared sensor according to the embodiment of the present invention includes the film or the laminate according to the embodiment of the present invention. The configuration of the infrared sensor according to the embodiment of the present invention is not particularly limited as long as it includes the film or the laminate according to the embodiment of the present invention and functions as an infrared sensor.

Hereinafter, an embodiment of the infrared sensor according to the present invention will be described using FIG. 1.

In an infrared sensor 100 shown in FIG. 1, reference numeral 110 represents a solid image pickup element.

In an imaging region provided on the solid image pickup element 110, infrared cut filters 111 and color filters 112 are provided.

The infrared cut filters 111 allow transmission of light in a visible range (for example light having a wavelength of 400 to 700 nm) and shield light in an infrared range (for example, preferably light having a wavelength of 800 to 1300 nm, more preferably light having a wavelength of 900 to 1200 nm, and still more preferably light having a wavelength of 900 to 1000 nm).

In the color filters 112, pixels which allow transmission of light having a specific wavelength in a visible range and absorb the light are formed. For example, pixels of red (R), green (G), and blue (B) are formed in the color filters 112.

Regions 114 where the infrared cut filters 111 are not formed are provided between infrared transmitting filters 113 and the solid image pickup element 110. In the regions 114, resin layers (for example, transparent resin layers) capable of allowing transmission of light having a wavelength which has passed through the infrared transmitting filters 113 are disposed.

The infrared transmitting filters 113 have visible light shielding properties, allow transmission of infrared light having a specific wavelength, and are formed of the film or the laminate according to the embodiment of the present invention having the above-described spectral characteristics. For example, it is preferable that the infrared transmitting filters 113 shield light having a wavelength of 400 to 950 nm and allow transmission of light having a wavelength of 1100 to 1300 nm.

Microlenses 115 are disposed on an incidence ray hv side of the color filters 112 and the infrared transmitting filters 113. A planarizing layer 116 is formed so as to cover the microlenses 115.

In the embodiment shown in FIG. 1, the resin layers are disposed in the regions 114. However, the infrared transmitting filters 113 may be formed in the regions 114. That is, the infrared transmitting filters 113 may be formed on the solid image pickup element 110.

In the embodiment shown in FIG. 1, the thickness of the color filters 112 is the same as the thickness of the infrared transmitting filters 113. However, the thickness of the color filters 112 may be different from the thickness of the infrared transmitting filters 113.

In the embodiment shown in FIG. 1, the color filters 112 are provided on the incidence ray hv side compared to the infrared cut filter 111. The lamination order of the infrared cut filter 111 and the color filters 112 may be reversed, and the infrared cut filter 111 may be provided on the incidence ray hv side compared to the color filters 112.

In the embodiment shown in FIG. 1, the infrared cut filters 111 and the color filters 112 are laminated adjacent to each other. However, the infrared cut filters 111 and the color filters 112 are not necessarily provided adjacent to each other, and another layer may be provided therebetween.

According to this infrared sensor, image information can be acquired in real time. Therefore, the infrared sensor can be used for motion sensing in a case where a motion detecting target is recognized. Further, since distance information can be acquired, for example, an image including 3D information can be obtained.

Next, an imaging device will be described as an example to which the infrared sensor according to the embodiment of the present invention is applied. Examples of the imaging device include a camera module.

Figure 2:
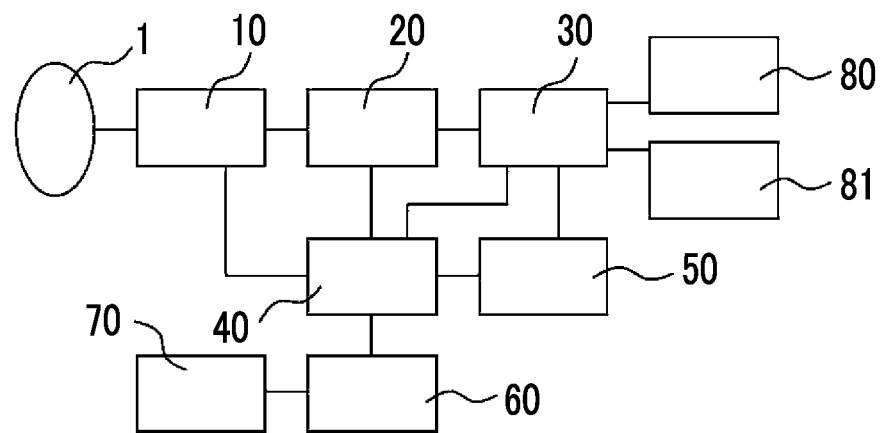
FIG. 2 is a functional block diagram showing an imaging device to which the infrared sensor according to the embodiment of the present invention is applied.

FIG. 2 is a functional block diagram showing the imaging device. The imaging device includes a lens optical system 1, a solid image pickup element 10, a signal processing unit 20, a signal switching unit 30, a control unit 40, a signal storage unit 50, a light emission control unit 60, an infrared light emitting diode (LED) 70 of a light emitting element which emits infrared light, and image output units 80 and 81. As the solid image pickup element 10, the above-described infrared sensor 100 can be used. In addition, a part or all of other components of the imaging device excluding the solid image pickup element 10 and the lens optical system 1 may be formed on the same semiconductor substrate. The respective configurations of the imaging device can be found in paragraphs "0032" to "0036" of JP2011-233983A, the content of which is incorporated herein by reference.

<Image Display Device>

The film or the laminate according to the embodiment of the present invention can also be used in an image display device such as a liquid crystal display device or an organic electroluminescence (organic EL) display device. The definition of a display device and the details of each display device can be found in, for example, "Electronic Display Device (by Akiya Sasaki, Kogyo Chosakai Publishing Co., Ltd., 1990)" or "Display Device (Sumiaki Ibuki, Sangyo Tosho Co., Ltd.). The details of a liquid crystal display device can be found in, for example, "Next-Generation Liquid Crystal Display Techniques (Edited by Tatsuo Uchida, Kogyo Chosakai Publishing Co., Ltd., 1994)". The type of the liquid crystal display device to which the embodiment of the present invention is applicable is not particularly limited. For example, the present invention is applicable to various liquid crystal display devices described in "Next-Generation Liquid Crystal Display Techniques".

The image display device may include a white organic EL element as a display element. It is preferable that the white organic EL element has a tandem structure. The tandem structure of the organic EL element is described in, for example, JP2003-045676A, or pp. 326-328 of "Forefront of Organic EL Technology Development-Know-How Collection of High Brightness, High Accuracy, and Long Life" (Technical Information Institute, 2008). It is preferable that a spectrum of white light emitted from the organic EL element has high maximum emission peaks in a blue range (430 nm to 485 nm), a green range (530 nm to 580 nm), and a yellow range (580 nm to 620 nm). It is more preferable that the spectrum has a maximum emission peak in a red range (650 nm to 700 nm) in addition to the above-described emission peaks.

EXAMPLES

Hereinafter, the present invention will be described in more detail using examples. However, the present invention is not limited to the following examples as long as it does not depart from the scope of the present invention. Unless specified otherwise, "part(s)" and "%" represent "part(s) by mass" and "mass %".

Test Example 1

[Preparation of Coloring Material Solutions 1-1 to 1-10 and 2-1 to 2-6]

A mixed solution including raw materials shown in the following table was mixed and dispersed for 3 hours using a beads mill (a high-pressure dispersing machine with a pressure reducing mechanism, NANO-3000-10 (manufactured by Nippon BEE Chemical Co., Ltd.)) in which zirconia beads having a diameter of 0.3 mm were used. This way, coloring material solutions 1-1 to 1-10 and 2-1 to 2-6 were prepared. The table below shows the amounts (unit: part(s) by mass) of the respective components.

(Compound Having Absorption Maximum in Wavelength Range of Longer than 700 nm and 900 nm or Shorter)

Pyrrolopyrrole compound 1-1: a compound having the following structure (absorption maximum=850 nm)

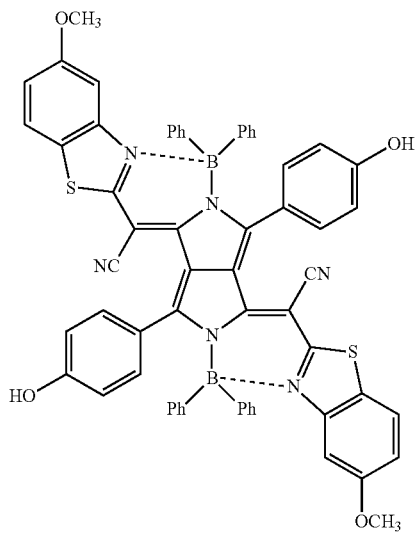

TABLE 2

|  | Chromatic Colorant or Organic Black Colorant | Compound having Absorption Maximum in Wavelength Range of Longer than 700 nm and 900 nm or Shorter | Compound having Absorption Maximum in Wavelength Range of Longer than 900 nm and 1000 nm or Shorter | Other Coloring Material | Resin | Solvent |
|---|---|---|---|---|---|---|
| Coloring Material Solution 1-1 | PR254 (13.3) | — | — | — | Resin 1(6.7) | PGMEA(80) |
| Coloring Material Solution 1-2 | PB15:6 (13.3) | — | — | — | Resin 2(6.7) | PGMEA(80) |
| Coloring Material Solution 1-3 | PY139 (13.3) | — | — | — | Resin 3(6.7) | PGMEA(80) |
| Coloring Material Solution 1-4 | PV23 (13.3) | — | — | — | Resin 4(6.7) | PGMEA(80) |
| Coloring Material Solution 1-5 | — | — | Pyrrolopyrrole Compound 2-1 (13.3) | — | Resin 5(6.7) | PGMEA(80) |
| Coloring Material Solution 1-6 | PB15:6 (7.4) | — | Pyrrolopyrrole Compound 2-1 (5.9) | — | Resin 3(6.7) | PGMEA(80) |
| Coloring Material Solution 1-7 | — | Pyrrolopyrrole Compound 1-1 (13.3) | — | — | Resin 1(6.7) | PGMEA(80) |
| Coloring Material Solution 1-8 | — | TiOPc (13.3) | — | — | Resin 4(6.7) | PGMEA(80) |
| Coloring Material Solution 1-9 | Black Material 1 (13.3) | — | — | — | Resin 2(6.7) | PGMEA(80) |
| Coloring Material Solution 1-10 | — | — | — | Carbon Black(13.3) | Resin 2(6.7) | PGMEA(80) |
| Coloring Material Solution 2-1 | — | — | Pyrrolopyrrole Compound 2-2 (10) | — | — | Cyclohexanone (90) |
| Coloring Material Solution 2-2 | — | Pyrrolopyrrole Compound 1-2 (10) | — | — | — | Cyclohexanone (90) |
| Coloring Material Solution 2-3 | — | — | Cyanine compound 2-1 (10) | — | — | Cyclohexanone (90) |
| Coloring Material Solution 2-4 | — | — | Infrared Absorber 1(10) | — | — | Cyclohexanone (90) |
| Coloring Material Solution 2-5 | — | Cyanine Compound 1-1 (10) | — | — | — | Cyclohexanone (90) |
| Coloring Material Solution 2-6 | — | Cyanine Compound 1-2 (10) | — | — | — | Cyclohexanone (90) |

In the table, an abbreviation of each component is as follows. (Chromatic Colorant or Organic Black Colorant)
PR254: Pigment Red 254
PB15:6: Pigment Blue 15:6
PY139: Pigment Yellow 139
PV23: Pigment Violet 23
Black Material 1: IRGAPHOR BLACK (manufactured by BASF SE)

Pyrrolopyrrole compound 1-2: a compound having the following structure (absorption maximum=850 nm)

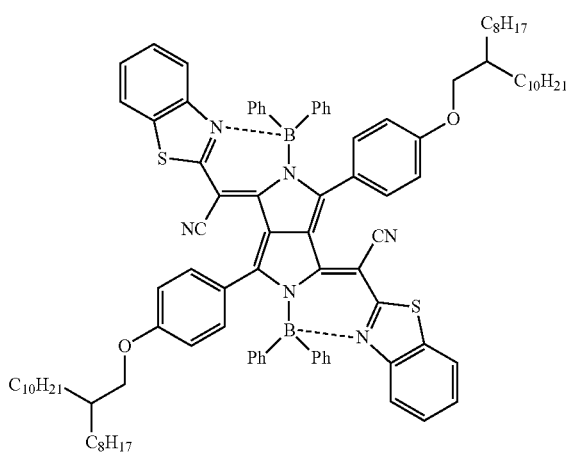

Cyanine compound 1-1: a compound having the following structure (absorption maximum=831 nm)

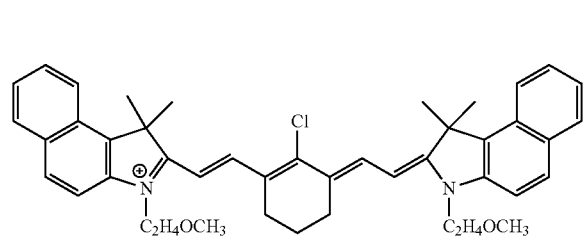

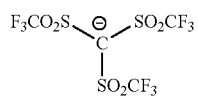

Cyanine compound 1-2: a compound having the following structure (absorption maximum=848 nm)

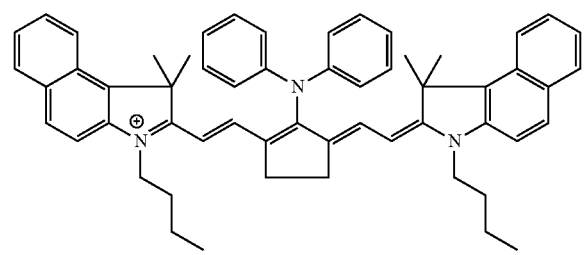

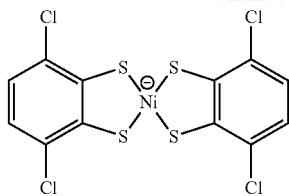

TiOPc: oxotitanyl phthalocyanine (absorption maximum=830 nm)

(Compound Having Absorption Maximum in Wavelength Range of Longer than 900 Nm and 1000 nm or Shorter)

Pyrrolopyrrole compound 2-1: a compound having the following structure (absorption maximum=910 nm; a ratio (absorbance $A_{max}$/absorbance $A_{1020}$) of an absorbance $A_{max}$ at the absorption maximum to an absorbance $A_{1020}$ at a wavelength of 1020 nm was 12.1)

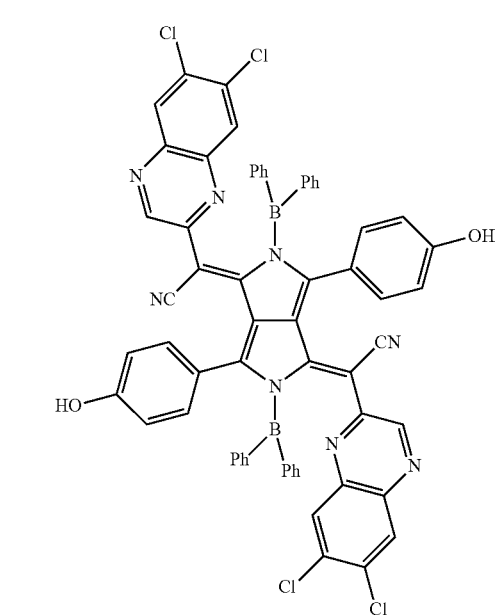 [SMILES: Cc1c(-c2ccc(O)cc2)n(B(c2ccccc2)c2ccccc2)c(=C(/C#N)c2cnc3cc(Cl)c(Cl)cc3n2)/c1=C(\c1ccc(O)cc1)N(/C=C(/C#N)c1cnc2cc(Cl)c(Cl)cc2n1)B(c1ccccc1)c1ccccc1]

Pyrrolopyrrole compound 2-2: a compound having the following structure (absorption maximum=985 nm; a ratio (absorbance $A_{max}$/absorbance $A_{1020}$) of an absorbance $A_{max}$ at the absorption maximum to an absorbance $A_{1020}$ at a wavelength of 1020 nm was 25.6)

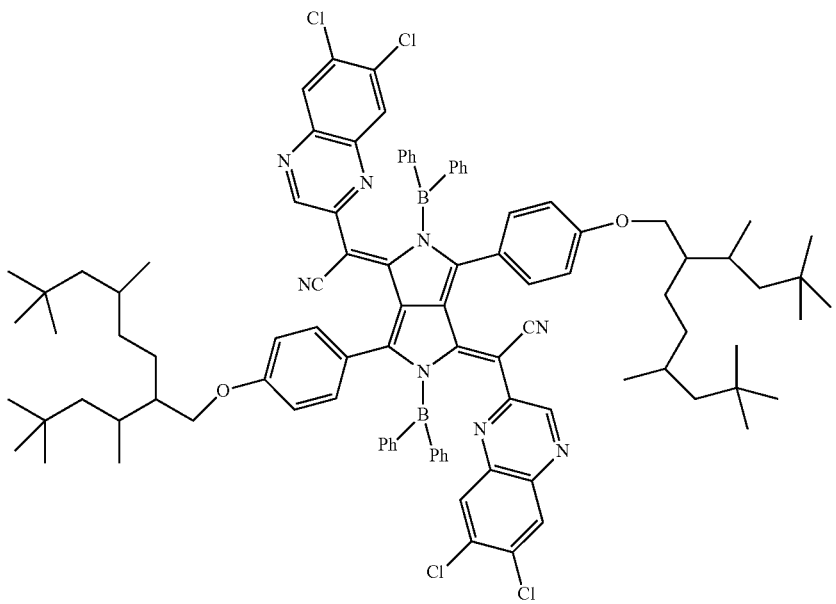 [SMILES: Cc1c(-c2ccc(OCC(CCC(C)CC(C)(C)C)C(C)CC(C)(C)C)cc2)n(B(c2ccccc2)c2ccccc2)c(=C(/C#N)c2cnc3cc(Cl)c(Cl)cc3n2)/c1=C(\c1ccc(OCC(CCC(C)CC(C)(C)C)C(C)CC(C)(C)C)cc1)N(/C=C(/C#N)c1cnc2cc(Cl)c(Cl)cc2n1)B(c1ccccc1)c1ccccc1]

Cyanine compound 2-1: a compound having the following structure (absorption maximum=952 nm; a ratio (absorbance $A_{max}$/absorbance $A_{1020}$) of an absorbance $A_{max}$ at the absorption maximum to an absorbance $A_{1020}$ at a wavelength of 1020 nm was 4.5 or higher)

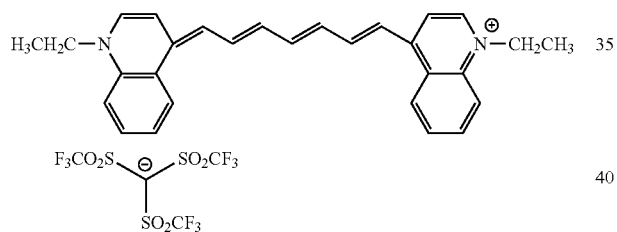

Infrared absorber 1: FDN-006 (manufactured by Yamada Chemical Co., Ltd.; absorption maximum=927 nm; a ratio (absorbance $A_{max}$/absorbance $A_{1020}$) of an absorbance $A_{max}$ at the absorption maximum to an absorbance $A_{1020}$ at a wavelength of 1020 nm was 19.9)

(Resin)

Resin 1: Disperbyk-111 (trade name, manufactured by BYK Chemie)

Resin 2: a resin having the following structure (Mw: 7950, a numerical value added to a main chain represents a molar ratio, a numerical value added to a side chain represents the number of repeating units)

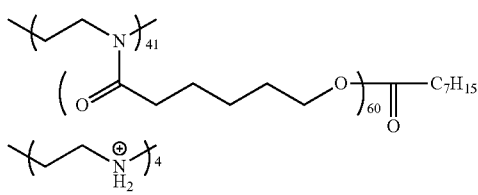

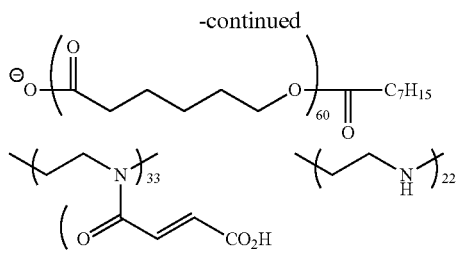

Resin 3: a resin having the following structure (Mw: 30000, a numerical value added to a main chain represents a molar ratio, a numerical value added to a side chain represents the number of repeating units)

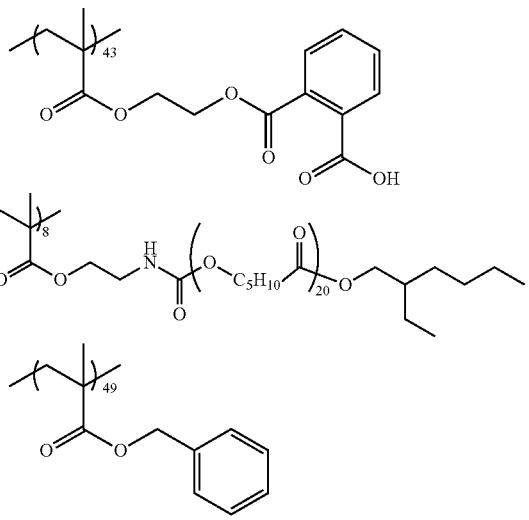

Resin 4: a resin having the following structure (Mw: 24000, a numerical value added to a main chain represents a molar ratio, a numerical value added to a side chain represents the number of repeating units)

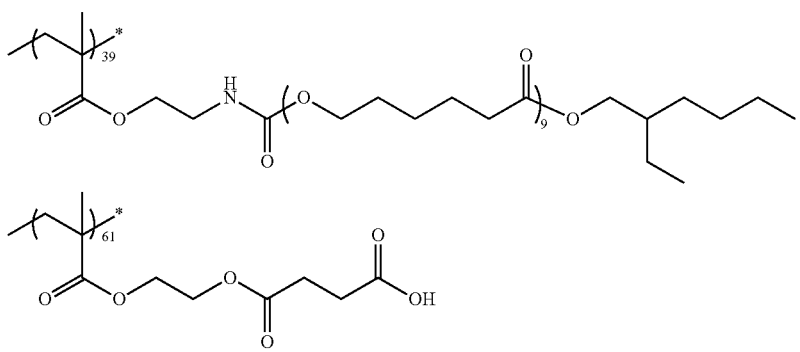

Resin 5: a resin having the following structure (Mw: 38900, a numerical value added to a main chain represents a molar ratio, a numerical value added to a side chain represents the number of repeating units)

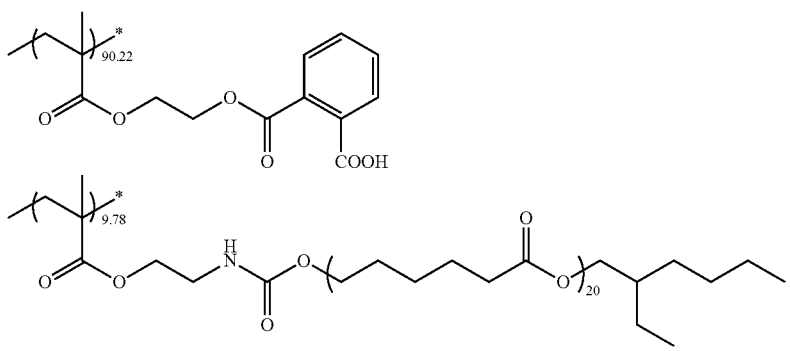

(Solvent)
PGMEA: propylene glycol monomethyl ether acetate
Cyclohexanone: cyclohexanone

[Preparation of Composition]
(Compositions According to Examples 1 to 7 and Comparative Examples 1 to 3)

Components shown in the table below were mixed with each other at a ratio shown in the table below to prepare a composition. The table below shows the amounts (unit: part(s) by mass) of the corresponding components.

TABLE 3

| | Example 1 | Example 2 | Example 3 | Example 4 | Example 5 | Example 6 | Example 7 | Comparative Example 1 | Comparative Example 2 | Comparative Example 3 |
|---|---|---|---|---|---|---|---|---|---|---|
| Coloring Material Solution 1-1 | 18.8 | 18.8 | 7.52 | 8.65 | 15.04 | 14.44 | 16.92 | | 18.8 | |
| Coloring Material Solution 1-2 | 22.56 | | | 13.83 | | 18.05 | | | 24.44 | |
| Coloring Material Solution 1-3 | 11.28 | 11.28 | 11.28 | | 5.64 | 9.02 | | | 13.16 | |
| Coloring Material Solution 1-4 | | | 9.4 | | | | 16.92 | | 5.64 | |
| Coloring Material Solution 1-5 | 13.46 | | | | | | 13.16 | | | 31.95 |
| Coloring Material Solution 1-6 | | 38.46 | | | | | | | | |
| Coloring Material Solution 1-7 | 5.64 | | | | | | | | | |
| Coloring Material Solution 1-8 | | | 18.8 | | 24.44 | | 7.52 | | | |
| Coloring Material Solution 1-9 | | | | 15.56 | | | | | | |

TABLE 3-continued

| | Example 1 | Example 2 | Example 3 | Example 4 | Example 5 | Example 6 | Example 7 | Comparative Example 1 | Comparative Example 2 | Comparative Example 3 |
|---|---|---|---|---|---|---|---|---|---|---|
| Coloring Material Solution 1-10 | | | | | | | | 38.35 | | |
| Coloring Material Solution 2-1 | | 17.5 | | | | | | | | |
| Coloring Material Solution 2-2 | | | 20.7 | | | | | | | |
| Coloring Material Solution 2-3 | | | 18.4 | | 16.8 | | | | | |
| Coloring Material Solution 2-4 | | | | 20 | | | | | | |
| Coloring Material Solution 2-5 | | | | | | 19.2 | | | | |
| Coloring Material Solution 2-6 | | | | | | | 15 | | | |
| Polymerizable Compound 1 | 5.99 | | 3.14 | 5.15 | | 4.81 | 5.38 | 4.87 | 6.47 | 5.24 |
| Polymerizable Compound 2 | | 5.87 | 3.14 | | 6.28 | | | | | |
| Alkali Soluble Resin 1 | 6.6 | 6.73 | 11.75 | 9.73 | 12.07 | 8.09 | 7.44 | 5.76 | 9.84 | 7.74 |
| Photopolymerization Initiator 1 | 2.012 | | | 1.732 | | 1.617 | 1.78 | 1.637 | 2.175 | 1.759 |
| Photopolymerization Initiator 2 | | 1.972 | 2.11 | | 2.11 | | | | | |
| Epoxy Resin | | | | | | 2.4 | 2.5 | | | |
| Epoxy Resin Curing Agent | | | | | | 0.024 | 0.025 | | | |
| Silane Coupling Agent | | 0.75 | 0.75 | 0.75 | 0.75 | | | 0.51 | | 0.51 |
| Surfactant | 4.17 | 4.17 | 4.17 | 4.17 | 4.17 | 4.17 | 4.17 | 4.17 | 4.17 | 4.17 |
| Polymerization Inhibitor | 0.003 | 0.0029 | 0.0031 | 0.0026 | 0.0031 | 0.0024 | 0.0027 | 0.0024 | 0.0032 | 0.0026 |
| Organic Solvent 1 | 9.49 | 11.98 | 10.44 | | 9.51 | | 9.26 | 44.71 | 15.31 | 48.63 |
| Organic Solvent 2 | | | | 1.37 | | 1.38 | | | | |

In the table, each component is as follows.

Alkali-soluble resin 1: a resin having the following structure (Mw=12000; a numerical value added to a main chain represents a molar ratio) (40 mass % propylene glycol monomethyl ether acetate solution)

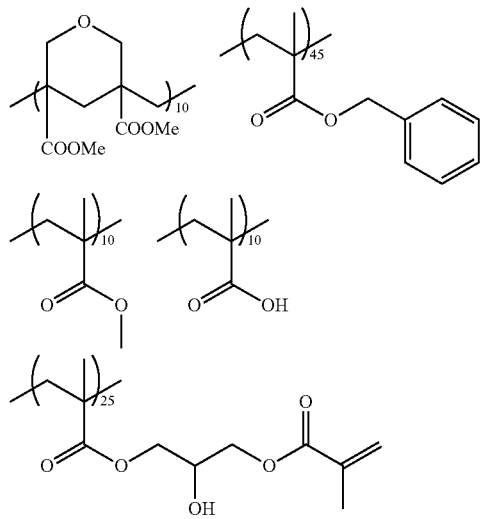

Polymerizable compound 1: KAYARAD DPHA (manufactured by Nippon Kayaku Co., Ltd.)

Polymerizable compound 2: NK ESTER A-TMMT (manufactured by Shin-Nakamura Chemical Co., Ltd.)

Photopolymerization initiator 1: IRGACURE OXE-01 (manufactured by BASF SE)

Photopolymerization Initiator 2: IRGACURE OXE-02 (manufactured by BASF SE)

Epoxy resin: MARPROOF G-0150M (manufactured by NOF Corporation, weight-average molecular weight: 10000; a random polymer having a glycidyl methacrylate skeleton)

Epoxy resin curing agent: a butanedioic acid silane coupling agent (a compound having the following structure)

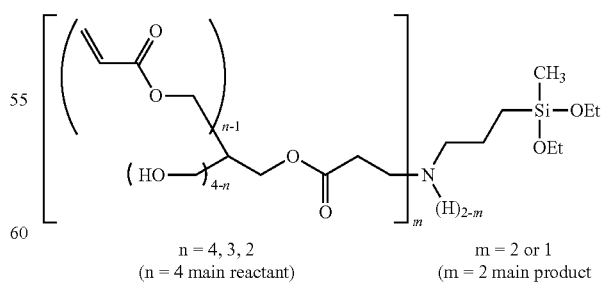

n = 4, 3, 2
(n = 4 main reactant)

m = 2 or 1
(m = 2 main product)

Surfactant: the following mixture (Mw=14000; "%" representing the proportion of a repeating unit is mol %) (1 mass % propylene glycol monomethyl ether acetate solution)

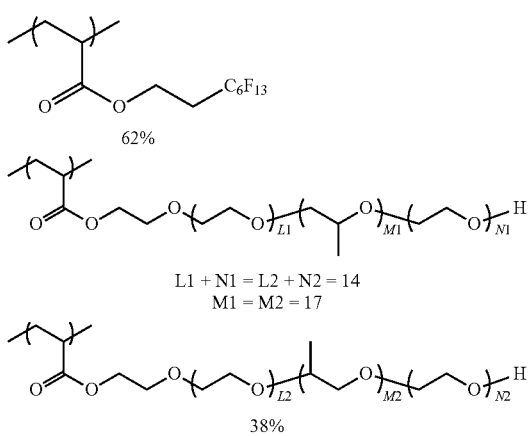

Polymerization Inhibitor: p-Methoxyphenol
Organic Solvent 1: propylene glycol methyl ether acetate
Organic solvent 2: cyclohexanone

[Evaluation of Absorbance and Spectral Characteristics]

In each of Examples 1 to 5 and Comparative Example 2, the composition was applied to a glass substrate using a spin coating method such that the thickness of a post-baked film was 2.0 μm. Next, the glass wafer was heated using a hot plate at 100° C. for 120 seconds. Next, the glass wafer was further heated (post-baked) using a hot plate at 200° C. for 300 seconds to form a film. Regarding the glass substrate including the film, the light transmittance in a wavelength range of 300 to 1300 nm, the minimum value A (minimum absorbance A) of the absorbance in a wavelength range of 400 to 950 nm, and the maximum value B (maximum absorbance B) of the absorbance in a wavelength range of 1100 to 1300 nm were measured using an ultraviolet-visible-near infrared spectrophotometer U-4100 (manufactured by Hitachi High-Technologies Corporation). Likewise, a maximum value a (maximum transmittance a) of a transmittance in a wavelength range of 400 to 950 nm and a minimum value b (minimum transmittance b) of a transmittance in a wavelength range of 1100 to 1300 nm were measured.

In each of Examples 6 and 7, the composition was applied to a glass substrate using a spin coating method such that the thickness of a post-baked film was 2.0 μm. Next, the glass wafer was dried using a hot plate at 80° C. for 10 minutes. Next, the glass wafer was further heated (post-baked) using a hot plate at 150° C. for 3 hours, and then the same evaluation as described above was performed.

In each of Comparative Examples 1 and 3, a film was formed using the same method as in Example 1, except that the composition was applied to a glass substrate using a spin coating method such that the thickness of a post-baked film was 0.8 μm, and then the same evaluation as described above was performed.

[Preparation of Filter]

Each of the compositions was applied to a silicon wafer using a spin coating method such that the thickness of a dried film was as described above regarding the measurement of the absorbance, and was heated (pre-baked) using a hot plate at 100° C. for 120 seconds.

Next, using an i-ray stepper exposure device FPA-3000 i5+(manufactured by Canon Corporation), the curable composition was exposed at an optimum exposure dose through a photomask on which a square pixel pattern having a size of 1.4×1.4 μm was formed. The optimum exposure dose was determined based on an exposure dose at which the square pixel pattern was resolved while increasing the exposure dose from 50 mJ/cm$^2$ to 750 mJ/cm$^2$ at an interval of 50 mJ/cm$^2$.

Next, the silicon wafer on which the exposed coating film was formed was placed on a horizontal rotary table of a spin-shower developing machine (DW-30, manufactured by Chemitronics Co., Ltd.) and underwent puddle development at 23° C. for 60 seconds using CD-2060 (a tetramethylammonium hydroxide aqueous solution, manufactured by Fujifilm Electronic Materials Co., Ltd.) to form a pattern on the silicon wafer.

The silicon wafer on which the pattern was formed was rinsed with pure water and was dried by spinning.

Further, the silicon wafer was heated (post-baked) using a hot plate at 200° C. for 300 seconds. This way, silicon wafers having the pattern were obtained.

[Spectral Identification]

Each of the obtained filters was incorporated into a solid image pickup element using a well-known method. Using the obtained solid image pickup element, an object was irradiated with a near infrared LED light source having an emission wavelength of 1050 nm in a low-illuminance environment (0.001 Lux) to acquire images. Next, the imaging performances of the solid image pickup elements were compared to each other for evaluation. Evaluation standards are as described below.

<Evaluation Standards>
3: Satisfactory (an object was able to be clearly recognized on the image)
2: Less satisfactory (an object was able to be recognized on the image)
1: Unsatisfactory (an object was not able to be recognized on the image)

TABLE 4

| | Spectral Identification | Maximum Transmittance a 400 to 950 nm | Minimum Transmittance b 1100 to 1300 nm | Minimum Absorbance A 400 to 950 nm | Maximum Absorbance B 1100 to 1300 nm | Absorbance Ratio A/B |
|---|---|---|---|---|---|---|
| Example 1 | 3 | 8.01 | 81.61 | 1.10 | 0.09 | 12.42 |
| Example 2 | 3 | 6.07 | 79.49 | 1.22 | 0.10 | 12.21 |
| Example 3 | 3 | 8.09 | 93.17 | 1.09 | 0.03 | 35.53 |
| Example 4 | 3 | 12.09 | 90.41 | 0.92 | 0.04 | 20.96 |
| Example 5 | 3 | 9.80 | 91.85 | 1.01 | 0.04 | 27.34 |
| Example 6 | 3 | 7.47 | 88.26 | 1.13 | 0.05 | 20.78 |
| Example 7 | 3 | 14.06 | 84.01 | 0.85 | 0.08 | 11.26 |
| Comparative Example 1 | 1 | 3.42 | 5.15 | 1.47 | 1.29 | 1.14 |
| Comparative Example 2 | 1 | 95.44 | 96.30 | 0.02 | 0.02 | 1.24 |

TABLE 4-continued

| | Spectral Identification | Maximum Transmittance a 400 to 950 nm | Minimum Transmittance b 1100 to 1300 nm | Minimum Absorbance A 400 to 950 nm | Maximum Absorbance B 1100 to 1300 nm | Absorbance Ratio A/B |
|---|---|---|---|---|---|---|
| Comparative Example 3 | 1 | 84.03 | 84.68 | 0.08 | 0.07 | 1.05 |

In all the Examples in which the composition according to the embodiment of the present invention was used, in a state where noise generated from visible light was small, the transmission of infrared light having an emission wavelength of 1050 nm was allowed, and the spectral identification was satisfactory. On the other hand, in Comparative Examples 1 to 3, noise generated from visible light was large, and the spectral identification was unsatisfactory.

Regarding each of Examples, even in a case where an InGaAs wafer was used instead of the silicon wafer, the same effects as those of each of Examples were obtained.

Test Example 2

Compositions According to Preparation Examples 1 to 5

Components shown in the table below were mixed with each other at a ratio shown in the table below. As a result, compositions according to Preparation Examples 1 to 5 were prepared. The table below shows the amounts (unit: part(s) by mass) of the corresponding components. The components shown in the table below are the same as the materials as described above regarding Test Example 1.

Example 8

The composition according to Preparation Example 1 was applied to a glass substrate or a silicon wafer using a spin coating method such that the thickness of a post-baked film was 1.0 μm. Next, the glass wafer or the silicon wafer was heated using a hot plate at 100° C. for 120 seconds. Next, the glass wafer or the silicon wafer was further heated (post-baked) using a hot plate at 200° C. for 300 seconds to form a film (first layer). The composition according to Preparation Example 4 was applied to the formed film using a spin coating method such that the thickness of a post-baked film was 1.0 μm. Next, the glass wafer or the silicon wafer was heated using a hot plate at 100° C. for 120 seconds. Next, the glass wafer or the silicon wafer was further heated (post-baked) using a hot plate at 200° C. for 300 seconds to form a film (second layer). As a result, a laminate was manufactured.

Example 9

A laminate was prepared under the same conditions as in Example 8, except that the composition according to Preparation Example 2 was used instead of the composition according to Preparation Example 1 and the composition according to Preparation Example 5 was used instead of the composition according to Preparation Example 4.

TABLE 5

| | Preparation Example 1 | Preparation Example 2 | Preparation Example 3 | Preparation Example 4 | Preparation Example 5 |
|---|---|---|---|---|---|
| Coloring Material Solution 1-1 | 21.05 | 22.56 | 22.56 | | |
| Coloring Material Solution 1-2 | | 31.58 | 28.57 | | |
| Coloring Material Solution 1-3 | 12.03 | 13.53 | 13.53 | | |
| Coloring Material Solution 1-4 | 9.02 | | | | |
| Coloring Material Solution 1-7 | | | 12.03 | | |
| Coloring Material Solution 1-8 | 36.09 | | | | |
| Coloring Material Solution 2-1 | | | | 34.00 | 25.20 |
| Coloring Material Solution 2-2 | | | | | 36.00 |
| Polymerizable Compound 1 | 2.50 | | 2.55 | 2.00 | 3.09 |
| Polymerizable Compound 2 | | 2.87 | | 2.32 | |
| Alkali Soluble Resin 1 | 2.53 | 6.57 | 3.11 | 27.03 | 19.34 |
| Photopolymerization Initiator 1 | 0.84 | | 0.86 | 1.45 | 1.04 |
| Photopolymerization Initiator 2 | | 0.96 | | | |
| Surfactant | 4.17 | 4.17 | 4.17 | 4.17 | 4.17 |
| Polymerization Inhibitor | 0.001 | 0.001 | 0.001 | 0.002 | 0.002 |
| Organic Solvent 1 | 11.77 | 17.76 | 12.62 | | |
| Organic Solvent 2 | | | | 29.02 | 11.15 |

Example 10

A laminate was prepared under the same conditions as in Example 8, except that the composition according to Preparation Example 3 was used instead of the composition according to Preparation Example 1.

[Evaluation of Absorbance and Spectral Characteristics]

Regarding the glass substrate including the laminate, the light transmittance in a wavelength range of 300 to 1300 nm, the minimum value A (minimum absorbance A) of the absorbance in a wavelength range of 400 to 950 nm, and the maximum value B (maximum absorbance B) of the absorbance in a wavelength range of 1100 to 1300 nm were measured using an ultraviolet-visible-near infrared spectrophotometer U-4100 (manufactured by Hitachi High-Technologies Corporation). Likewise, a maximum value a (maximum transmittance a) of a transmittance in a wavelength range of 400 to 950 nm and a minimum value b (minimum transmittance b) of a transmittance in a wavelength range of 1100 to 1300 nm were measured.

[Spectral Identification]

Each of the obtained silicon wafers including the laminate was incorporated into a solid image pickup element using a well-known method. Using the obtained solid image pickup element, an object was irradiated with a near infrared LED light source having an emission wavelength of 1050 nm in a low-illuminance environment (0.001 Lux) to acquire images. Next, the imaging performances of the solid image pickup elements were compared to each other for evaluation. Evaluation standards are as described below.

<Evaluation Standards>

3: Satisfactory (an object was able to be clearly recognized on the image)

2: Less satisfactory (an object was able to be recognized on the image)

1: Unsatisfactory (an object was not able to be recognized on the image)

TABLE 6

| | Spectral Identification | Maximum Transmittance a 400 to 950 nm | Minimum Transmittance b 1100 to 1300 nm | Minimum Absorbance A 400 to 950 nm | Maximum Absorbance B 1100 to 1300 nm | Absorbance Ratio A/B |
|---|---|---|---|---|---|---|
| Example 8 | 3 | 6.91 | 92.37 | 1.16 | 0.03 | 33.67 |
| Example 9 | 3 | 10.61 | 90.74 | 0.97 | 0.04 | 23.09 |
| Example 10 | 3 | 12.16 | 90.72 | 0.91 | 0.04 | 21.64 |

In all the laminates according to Examples, in a state where noise generated from visible light was small, the transmission of infrared light having an emission wavelength of 1050 nm was allowed, and the spectral identification was satisfactory.

Regarding each of Examples, even in a case where an InGaAs wafer was used instead of the silicon wafer, the same effects as those of each of Examples were obtained.

EXPLANATION OF REFERENCES

1: lens optical system
10: solid image pickup element
20: signal processing unit
30: signal switching unit
40: control unit
50: signal storage unit
60: light emission control unit
70: infrared LED
80, 81: image output unit
100: infrared sensor
110: solid image pickup element
111: infrared cut filter
112: color filter
113: infrared transmitting filter
114: region
115: microlens
116: planarizing layer
hv: incidence ray

What is claimed is:

1. A composition comprising:
    a coloring material that allows transmission of infrared light and shields visible light;
    an infrared absorber; and
    a resin,
    wherein the infrared absorber includes a compound having an absorption maximum in a wavelength range of longer than 900 nm and 1000 nm or shorter,
    the compound having an absorption maximum in a wavelength range of longer than 900 nm and 1000 nm or shorter is at least one compound selected from the group consisting of a cyanine compound, a squarylium compound, a phthalocyanine compound, and a naphthalocyanine compound, and
    a ratio A/B of a minimum value A of an absorbance of the composition in a wavelength range of 400 to 950 nm to a maximum value B of an absorbance of the composition in a wavelength range of 1100 to 1300 nm is 4.5 or higher.

2. The composition according to claim 1,
    wherein in the compound having an absorption maximum in a wavelength range of longer than 900 nm and 1000 nm or shorter, a ratio absorbance $A_{max}$/absorbance $A_{1020}$ of an absorbance $A_{max}$ at the absorption maximum to an absorbance $A_{1020}$ at a wavelength of 1020 nm is 4.5 or higher.

3. The composition according to claim 1,
    wherein the compound having an absorption maximum in a wavelength range of longer than 900 nm and 1000 nm or shorter is a compound represented by the following Formula (1),

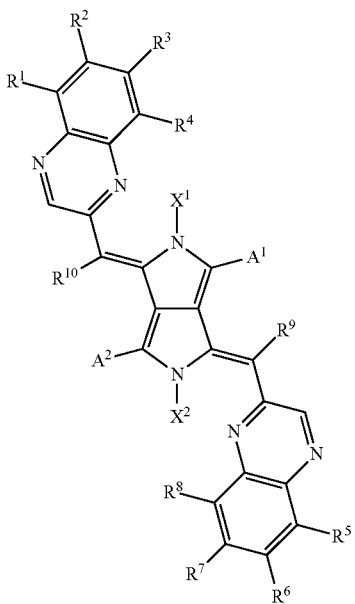

in Formula (1), $X^1$ and $X^2$ each independently represent a hydrogen atom or a substituent, $A^1$ and $A^2$ each independently represent a substituent, $R^1$ to $R^{10}$ each independently represent a hydrogen atom or a substituent, and at least one of $R^1$, . . . , or $R^8$ represents a substituent.

4. The composition according to claim 1, wherein the infrared absorber further includes a compound having an absorption maximum in a wavelength range of longer than 700 nm and 900 nm or shorter.

5. The composition according to claim 4, wherein a content of the coloring material that allows transmission of infrared light and shields visible light is 10 to 60 mass % with respect to a total solid content of the composition, a content of the compound having an absorption maximum in a wavelength range of longer than 900 nm and 1000 nm or shorter is 10 to 40 mass % with respect to a total content of the infrared absorber and the coloring material that allows transmission of infrared light and shields visible light, and a content of the compound having an absorption maximum in a wavelength range of longer than 700 nm and 900 nm or shorter is 1 to 40 mass % with respect to the total content of the infrared absorber and the coloring material that allows transmission of infrared light and shields visible light.

6. The composition according to claim 5, wherein the compound having an absorption maximum in a wavelength range of longer than 900 nm and 1000 nm or shorter is the cyanine compound or the phthalocyanine compound.

7. The composition according to claim 6, wherein the coloring material that allows transmission of infrared light and shields visible light includes an organic black colorant.

8. The composition according to claim 6, wherein the compound having an absorption maximum in a wavelength range of longer than 900 nm and 1000 nm or shorter is the phthalocyanine compound.

9. The composition according to claim 1, wherein the coloring material that allows transmission of infrared light and shields visible light has an absorption maximum in a wavelength range of 400 to 700 nm.

10. The composition according to claim 1, wherein the coloring material that allows transmission of infrared light and shields visible light includes two or more chromatic colorants, and a combination of the two or more chromatic colorants forms black.

11. The composition according to claim 1, further comprising:
a polymerizable compound; and
a photopolymerization initiator.

12. A film which is formed using the composition according to claim 1.

13. The film according to claim 12, wherein a maximum value of a light transmittance of the film in a thickness direction in a wavelength range of 400 to 950 nm is 20% or lower, and a minimum value of a light transmittance of the film in the thickness direction in a wavelength range of 1100 to 1300 nm is 70% or higher.

14. An infrared transmitting filter comprising:
the film according to claim 12.

15. A solid image pickup element comprising:
the film according to claim 12.

16. An infrared sensor comprising:
the film according to claim 12.

17. A laminate comprising:
a layer including a coloring material that allows transmission of infrared light and shields visible light; and
a layer including a compound having an absorption maximum in a wavelength range of longer than 900 nm and 1000 nm or shorter,
wherein the compound having an absorption maximum in a wavelength range of longer than 900 nm and 1000 nm or shorter is at least one compound selected from the group consisting of a cyanine compound, a squarylium compound, a phthalocyanine compound, and a naphthalocyanine compound, and
a ratio A/B of a minimum value A of an absorbance of the laminate in a wavelength range of 400 to 950 nm to a maximum value B of an absorbance of the laminate in a wavelength range of 1100 to 1300 nm is 4.5 or higher.

18. The laminate according to claim 17, wherein a maximum value of a light transmittance of the laminate in a thickness direction in a wavelength range of 400 to 950 nm is 20% or lower, and a minimum value of a light transmittance of the laminate in the thickness direction in a wavelength range of 1100 to 1300 nm is 70% or higher.

19. The laminate according to claim 17, wherein the layer including the coloring material that allows transmission of infrared light and shields visible light includes two or more chromatic colorants, and a combination of the two or more chromatic colorants forms black.

20. An infrared transmitting filter comprising:
the laminate according to claim 17.

21. A solid image pickup element comprising:
the laminate according to claim 17.

22. An infrared sensor comprising:
the laminate according to claim 17.

* * * * *